(12) United States Patent
    Yamazaki

(10) Patent No.: US 9,698,276 B2
(45) Date of Patent: Jul. 4, 2017

(54) SEMICONDUCTOR DEVICE, MODULE, AND ELECTRONIC DEVICE

(71) Applicant: Semiconductor Energy Laboratory Co., Ltd., Kanagawa-ken (JP)

(72) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/950,301

(22) Filed: Nov. 24, 2015

(65) Prior Publication Data

US 2016/0155850 A1    Jun. 2, 2016

(30) Foreign Application Priority Data

Nov. 28, 2014   (JP) .................................. 2014-242064

(51) Int. Cl.
   *H01L 29/786*   (2006.01)
   *H01L 27/12*    (2006.01)

(52) U.S. Cl.
   CPC ...... *H01L 29/7869* (2013.01); *H01L 27/1225* (2013.01); *H01L 27/1248* (2013.01); *H01L 29/78603* (2013.01); *H01L 29/78606* (2013.01); *H01L 29/78648* (2013.01); *H01L 29/78696* (2013.01)

(58) Field of Classification Search
   CPC ............. H01L 29/7869; H01L 27/1225; H01L 29/66969; H01L 29/24; H01L 2924/0002
   See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| CN | 102668096 A | 9/2012 |
| EP | 1 737 044 A1 | 12/2006 |

(Continued)

OTHER PUBLICATIONS

International Search Report re Application No. PCT/IB2015/058947, dated Mar. 15, 2016.

(Continued)

*Primary Examiner* — Tony Tran
(74) *Attorney, Agent, or Firm* — Husch Blackwell LLP

(57) ABSTRACT

Provided is an element with stable electrical characteristics or a device including plural kinds of elements with stable electrical characteristics. The semiconductor device includes a first insulator, a transistor over the first insulator, a second insulator over the transistor, and a third insulator over the second insulator. The second insulator includes an opening reaching the first insulator. The opening is filled with a fourth insulator. The first insulator, the third insulator, and the fourth insulator each have a lower hydrogen-transmitting property than the second insulator.

18 Claims, 49 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,384,080 B2 | 2/2013 | Taniguchi et al. |
| 8,502,216 B2 | 8/2013 | Akimoto et al. |
| 8,541,266 B2 | 9/2013 | Yamazaki |
| 8,692,252 B2 | 4/2014 | Takata et al. |
| 8,766,269 B2 | 7/2014 | Yamazaki et al. |
| 9,240,525 B2 | 1/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0094791 A1 | 5/2004 | Ito et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0151663 A1 | 6/2010 | Ohnuma et al. |
| 2011/0001146 A1 | 1/2011 | Yamazaki et al. |
| 2011/0101335 A1 | 5/2011 | Yamazaki et al. |
| 2011/0101351 A1 | 5/2011 | Yamazaki |
| 2011/0127523 A1 | 6/2011 | Yamazaki |
| 2011/0263084 A1 | 10/2011 | Yamazaki |
| 2011/0309411 A1 | 12/2011 | Takemura |
| 2011/0312127 A1 | 12/2011 | Ishizuka et al. |
| 2012/0256178 A1 | 10/2012 | Yamazaki |
| 2012/0299639 A1 | 11/2012 | Kaneyasu |
| 2013/0009148 A1 | 1/2013 | Yamazaki |
| 2013/0015076 A1* | 1/2013 | Yoshida .............. C25B 1/02 205/340 |
| 2013/0175598 A1 | 7/2013 | Chen et al. |
| 2013/0270563 A1 | 10/2013 | Yamazaki |
| 2014/0326992 A1 | 11/2014 | Hondo et al. |
| 2014/0339538 A1 | 11/2014 | Yamazaki et al. |
| 2014/0339546 A1 | 11/2014 | Yamazaki et al. |
| 2014/0339548 A1 | 11/2014 | Yamazaki et al. |
| 2014/0339549 A1 | 11/2014 | Yamazaki et al. |
| 2014/0339560 A1 | 11/2014 | Yamazaki et al. |
| 2014/0367682 A1 | 12/2014 | Yamazaki et al. |
| 2015/0303217 A1 | 10/2015 | Tanaka et al. |
| 2016/0087107 A1 | 3/2016 | Yamazaki et al. |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 6-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2011-029176 A | 2/2011 |
| JP | 2011-119706 A | 6/2011 |
| JP | 2015-213164 A | 11/2015 |
| KR | 2012-0102653 A | 9/2012 |
| TW | 201133802 | 10/2011 |
| WO | WO 2004/114391 A1 | 12/2004 |

(56) References Cited

FOREIGN PATENT DOCUMENTS

WO   WO 2011/052384 A1   5/2011
WO   WO 2015/159179 A1   10/2015

OTHER PUBLICATIONS

Written Opinion re Application No. PCT/IB2015/058947, dated Mar. 15, 2016.
Coates, D. et al., "Optical Studies of the Amorphous Liquid-Cholesteric Liquid Crystal Transition:The Blue Phase," Physics Letters, Sep. 10, 1973, vol. 45A, No. 2, pp. 115-116.
Meiboom, S. et al., "Theory of the Blue Phase of Cholesteric Liquid Crystals," Physical Review Letters, May 4, 1981, vol. 46, No. 18, pp. 1216-1219.
Costello, M. et al., "Electron Microscopy of a Cholesteric Liquid Crystal and Its Blue Phase," Physical Review. A, May 1, 1984, vol. 29, No. 5, pp. 2957-2959.
Kimizuka, N. et al., "Spinel, YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000°C," Journal of Solid State Chemistry, 1985, vol. 60, pp. 382-384.
Nakamura, M. et al., "The Phase Relations in the In2O3—Ga2ZnO4—ZnO System at 1350°C," Journal of Solid State Chemistry, Aug. 1, 1991, vol. 93, No. 2, pp. 298-315.
Kitzerow, H. et al., "Observation of Blue Phases in Chiral Networks," Liquid Crystals, 1993, vol. 14, No. 3, pp. 911-916.
Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.
Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Prins, M. et al., "A Ferroelectric Transparent Thin-Film Transistor," Applied Physics Letters, Jun. 17, 1996, vol. 68, No. 25, pp. 3650-3652.
Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Kikuchi, H. et al., "Polymer-Stabilized Liquid Crystal Blue Phases," Nature Materials, Sep. 2, 2002, vol. 1, pp. 64-68.
Tsuda, K. et al., "Ultra Low Power Consumption Technologies for Mobile TFT-LCDs," IDW '02: Proceedings of the 9th International Display Workshops, Dec. 4, 2002, pp. 295-298.
Nomura, K. et al., "Thin-Film Transistor Fabricated in Single-Crystalline Transparent Oxide Semiconductor," Science, May 23, 2003, vol. 300, No. 5623, pp. 1269-1272.
Ikeda, T. et al., "Full-Functional System Liquid Crystal Display Using Cg-Silicon Technology," SID Digest '04: SID International Symposium Digest of Technical Papers, 2004, vol. 35, pp. 860-863.
Nomura, K. et al., "Room-Temperature Fabrication of Transparent Flexible Thin-Film Transistors Using Amorphous Oxide Semiconductors," Nature, Nov. 25, 2004, vol. 432, pp. 488-492.
Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.
Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.
Lee, H. et al., "Current Status of, Challenges to, and Perspective View of AM-OLED," IDW '06: Proceedings of the 13th International Display Workshops, Dec. 7, 2006, pp. 663-666.

Hosono, H., "68.3: Invited Paper:Transparent Amorphous Oxide Semiconductors for High Performance TFT," SID Digest '07: SID International Symposium Digest of Technical Papers, 2007, vol. 28, pp. 1830-1833.
Hirao, T. et al., "Novel Top-Gate Zinc Oxide Thin-Film Transistors (ZNO TFTS) for AMLCDS," Journal of the Society for Information Display, 2007, vol. 15, No. 1, pp. 17-22.
Park, S. et al., "Challenge to Future Displays: Transparent AM-OLED Driven by Peald Grown ZNO TFT," IMID '07 Digest, 2007, pp. 1249-1252.
Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Miyasaka, M., "Suftla Flexible Microelectronics on Their Way to Business," SID Digest '07: SID International Symposium Digest of Technical Papers, 2007, vol. 38, pp. 1673-1676.
Kurokawa, Y. et al., "UHF RFCPUS on Flexible and Glass Substrates for Secure RFID Systems," Journal of Solid-State Circuits , 2008, vol. 43, No. 1, pp. 292-299.
Jeong, J. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Lee, J. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.
Park, J. et al., "Amorphous Indium-Gallium-Zinc Oxide TFTS and Their Application for Large Size AMOLED," AM-FPD '08 Digest of Technical Papers, Jul. 2, 2008, pp. 275-278.
Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.
Sakata, J. et al., "Development of 4.0-In. AMOLED Display With Driver Circuit Using Amorphous In—Ga—Zn—Oxide TFTS," IDW '09: Proceedings of the 16th International Display Workshops, 2009, pp. 689-692.
Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.
Nowatari, H. et al., "60.2: Intermediate Connector With Suppressed Voltage Loss for White Tandem OLEDS," SID Digest '09: SID International Symposium Digest of Technical Papers, May 31, 2009, vol. 40, pp. 899-902.
Jin, D. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Lee, M. et al., "15.4: Excellent Performance of Indium-Oxide-Based Thin-Film Transistors by DC Sputtering," SID Digest '09: SID International Symposium Digest of Technical Papers, May 31, 2009, pp. 191-193.
Cho, D. et al., "21.2: Al and Sn—Doped Zinc Indium Oxide Thin Film Transistors for AMOLED Back-Plane," SID Digest '09: SID Internaitonal Symposium Digest of Technical Papers, May 31, 2009, pp. 280-283.
Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.
Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Ohara, H. et al., "21.3:4.0 In. QVGA AMOLED Display Using In—Ga—Zn—Oxide TFTS With a Novel Passivation Layer," SID Digest '09: SID International Symposium Digest of Technical Papers, May 31, 2009, pp. 284-287.
Godo, H. et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

(56) References Cited

OTHER PUBLICATIONS

Osada, T. et al., "Development of Driver-Integrated Panel Using Amorphous In—Ga—Zn—Oxide TFT," AM-FPD '09 Digest of Technical Papers, Jul. 1, 2009, pp. 33-36.

Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Nakamura, M., "Synthesis of Homologous Compound with New Long-Period Structure," NIRIM Newsletter, Mar. 1, 1995, vol. 150, pp. 1-4.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Orita, M. et al., "Mechanism of Electrical Conductivity of Transparent InGaZnO4," Physical Review. B, Jan. 15, 2000, vol. 61, No. 3, pp. 1811-1816.

Van de Walle, C., "Hydrogen as a Cause of Doping in Zinc Oxide," Physical Review Letters, Jul. 31, 2000, vol. 85, No. 5, pp. 1012-1015.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Janotti, A. et al., "Oxygen Vacancies in ZnO," Applied Physics Letters, 2005, vol. 87, pp. 122102-1-122102-3.

Clark, S. et al., "First Principles Methods Using CASTEP," Zeitschrift fur Kristallographie, 2005, vol. 220, pp. 567-570.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects in ZnO," Physical Review. B, Oct. 4, 2007, vol. 76, No. 16, pp. 165202-1-165202-22.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Park, J. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, J. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Hsieh, H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Oba, F. et al., "Defect Energetics in ZnO: A Hybrid Hartree-Fock Density Functional Study," Physical Review. B, 2008, vol. 77, pp. 245202-1-245202-6.

Kim, S. et al., "High-Performance Oxide Thin Film Transistors Passivated by Various Gas Plasmas," 214th ECS Meeting, 2008, No. 2317, ECS.

Hayashi, R. et al., "42.1: Invited Paper: Improved Amorphous In—Ga—Zn—O TFTS," SID Digest '08: SID International Symposium Digest of Technical Papers, May 20, 2008, vol. 39, pp. 621-624.

Son, K. et al., "42.4L: Late-News Paper: 4 Inch QVGA AMOLED Driven by the Threshold Voltage Controlled Amorphous Gizo (Ga2O3—In2O3—ZnO) TFT," SID Digest '08: SID International Symposium Digest of Technical Papers, May 20, 2008, vol. 39, pp. 633-636.

Park, Sang-Hee et al., "42.3: Transparent ZnO Thin Film Transistor for the Application of High Aperture Ratio Bottom Emission AM-OLED Display," SID DIGEST '08: SID International Symposium Digest of Technical Papers, May 20, 2008, vol. 39, pp. 629-632.

Fung, T. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Mo, Y. et al., "Amorphous Oxide TFT Backplanes for Large Size AMOLED Displays," IDW '08: Proceedings of the 6th International Display Workshops, Dec. 3, 2008, pp. 581-584.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Fortunato, E. et al., "Wide-Bandgap High-Mobility ZNO Thin-Film Transistors Produced at Room Temperature," Applied Physics Letters, Sep. 27, 2004, vol. 85, No. 13, pp. 2541-2543.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Oh, M. et al., "Improving the Gate Stability of ZNO Thin-Film Transistors With Aluminum Oxide Dielectric Layers," Journal of the Electrochemical Society, 2008, vol. 155, No. 12, pp. H1009-H1014.

Park, J. et al., "Dry Etching of ZnO Films and Plasma-Induced Damage to Optical Properties," Journal of Vacuum Science & Technology B, Mar. 1, 2003, vol. 21, No. 2, pp. 800-803.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

\* cited by examiner

FIG. 32A1
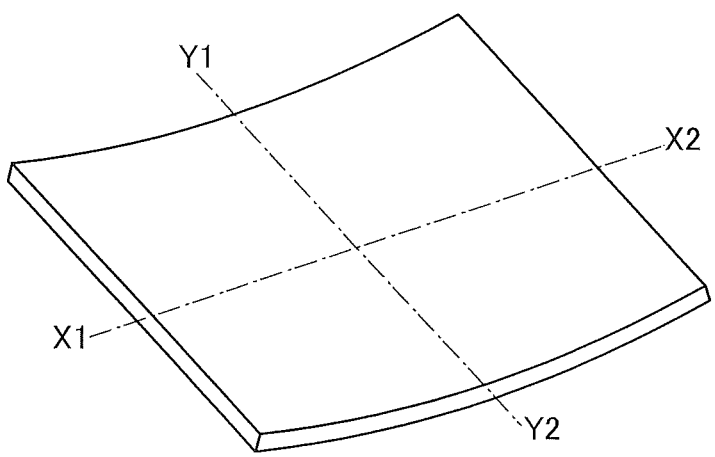
FIG. 32A2
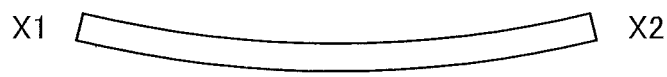
FIG. 32A3
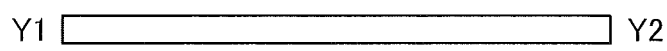
FIG. 32B1
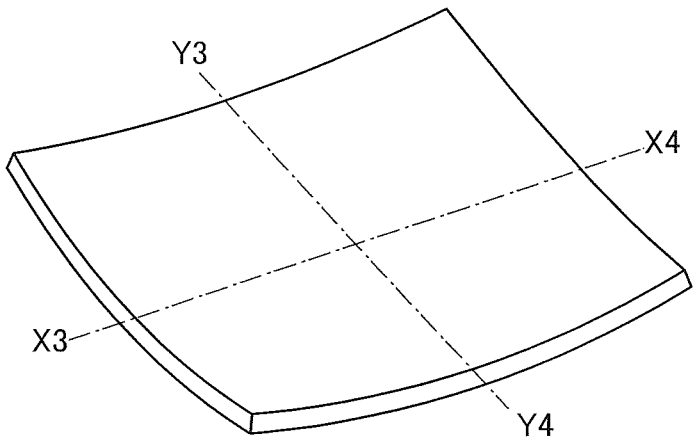
FIG. 32B2
FIG. 32B3

crystal structure of InMZnO$_4$

SEMICONDUCTOR DEVICE, MODULE, AND ELECTRONIC DEVICE

TECHNICAL FIELD

The present invention relates to, for example, a transistor or a semiconductor device. The present invention relates to, for example, a method for manufacturing a transistor or a semiconductor device. The present invention relates to, for example, a display device, a light-emitting device, a lighting device, a power storage device, a memory device, a processor, or an electronic device. The present invention relates to a method for manufacturing a display device, a liquid crystal display device, a light-emitting device, a memory device, or an electronic device. The present invention relates to a driving method of a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where a driver circuit and a pixel circuit are formed over the same substrate, it is preferable to use polycrystalline silicon, which can be used to form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

The transistor including an oxide semiconductor has different features from a transistor including amorphous silicon or polycrystalline silicon. For example, a display device in which a transistor including an oxide semiconductor is used is known to have small power consumption. An oxide semiconductor can be formed by a sputtering method or the like, and thus can be used in a transistor included in a large display device. Because a transistor including an oxide semiconductor has high field-effect mobility, a high-performance display device in which, for example, a driver circuit and a pixel circuit are formed over the same substrate can be obtained. In addition, there is an advantage that capital investment can be reduced because part of production equipment for a transistor including amorphous silicon can be retrofitted and utilized.

REFERENCE

Patent Document

[Patent Document 1] Japanese Published Patent Application No. S63-239117

[Patent Document 2] Japanese Translation of PCT international Application No. H11-505377

DISCLOSURE OF INVENTION

An object is to provide an element with stable electrical characteristics. An object is to provide a device including plural kinds of elements with stable electrical characteristics. An object is to provide a transistor with stable electrical characteristics. Another object is to provide a transistor with normally-off electrical characteristics. Another object is to provide a transistor with a small subthreshold swing value. Another object is to provide a transistor having a small short-channel effect. Another object is to provide a transistor having a low leakage current in an off state. Another object is to provide a transistor with excellent electrical characteristics. Another object is to provide a highly reliable transistor. Another object is to provide a transistor with high frequency characteristics.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems (1) One embodiment of the present invention is a semiconductor device including a first insulator, a transistor over the first insulator, a second insulator over the transistor, and a third insulator over the second insulator. The second insulator includes an opening reaching the first insulator. The opening is filled with a fourth insulator. The first insulator, the third insulator, and the fourth insulator each have a lower hydrogen-transmitting property than the second insulator.

(2) One embodiment of the present invention is the semiconductor device according to (1) in which the opening is located to surround the transistor in four sides.

(3) One embodiment of the present invention is a semiconductor device including a first insulator, a transistor over the first insulator, a second insulator over the transistor, and a third insulator over the second insulator. The second insulator includes a first opening and a second opening reaching the first insulator and the transistor, respectively. The first opening is filled with a fourth insulator. The second opening is filled with a conductor. The first insulator, the third insulator, the fourth insulator, and the conductor each have a lower hydrogen-transmitting property than the second insulator.

(4) One embodiment of the present invention is the semiconductor device according to (3) in which the first opening is located to surround the transistor in four sides.

(5) One embodiment of the present invention is the semiconductor device according to (3) or (4) in which the conductor includes a first region and a second region and the first region has a lower hydrogen-transmitting property than the second region.

(6) One embodiment of the present invention is the semiconductor device according to (5) in which the first region is interposed between the second region and each of the second insulator and the third insulator.

(7) One embodiment of the present invention is the semiconductor device according to (5) or (6) in which the first region includes a region that is in contact with the transistor.

(8) One embodiment of the present invention is the semiconductor device according to any one of (5) to (7) in which the first region includes a region that is in contact with the second opening.

(9) One embodiment of the present invention is the semiconductor device according to any one of (5) to (8) in which the first region includes a region where nitrogen concentration is higher than nitrogen concentration of the second region.

(10) One embodiment of the present invention is the semiconductor device according to any one of (5) to (9) in which the first region includes a hydrogen absorbing metal.

(11) One embodiment of the present invention is the semiconductor device according to any one of (1) to (10) in which the transistor includes an oxide semiconductor.

(12) One embodiment of the present invention is a semiconductor device including a first transistor, a first insulator over the first transistor, a second insulator over the first insulator, a second transistor over the second insulator, a third insulator over the second transistor, and a fourth insulator over the third insulator. The third insulator includes an opening reaching the second insulator. The opening is filled with a fifth insulator. The second insulator, the fourth insulator, and the fifth insulator each have a lower hydrogen-transmitting property than the third insulator.

(13) One embodiment of the present invention is the semiconductor device according to (12) in which the opening is located to surround the second transistor in four sides.

(14) One embodiment of the present invention is the semiconductor device according to (12) or (13) in which the second transistor includes an oxide semiconductor.

(15) One embodiment of the present invention is a module including the semiconductor device according to any one of (1) to (14) and a printed wiring board.

(16) One embodiment of the present invention is an electronic device including the semiconductor device according to any one of (1) to (14) or the module according to (15), and at least one of a speaker, an operation key, and a battery.

An element with stable electrical characteristics can be provided. A device including plural kinds of elements with stable electrical characteristics can be provided. A transistor with stable electrical characteristics can be provided. A transistor with normally-off electrical characteristics can be provided. A transistor with a small subthreshold swing value can be provided. A transistor having a small short-channel effect can be provided. A transistor having a low leakage current in an off state can be provided. A transistor with excellent electrical characteristics can be provided. A highly reliable transistor can be provided. A transistor with high frequency characteristics can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 32A1, 32A2, 32A3, 32B1, 32B2, and 32B3 are perspective views and cross-sectional views of semiconductor devices according to one embodiment of the present invention.

BEST MODE FOR CARRYING OUT THE INVENTION

Figure 1A:
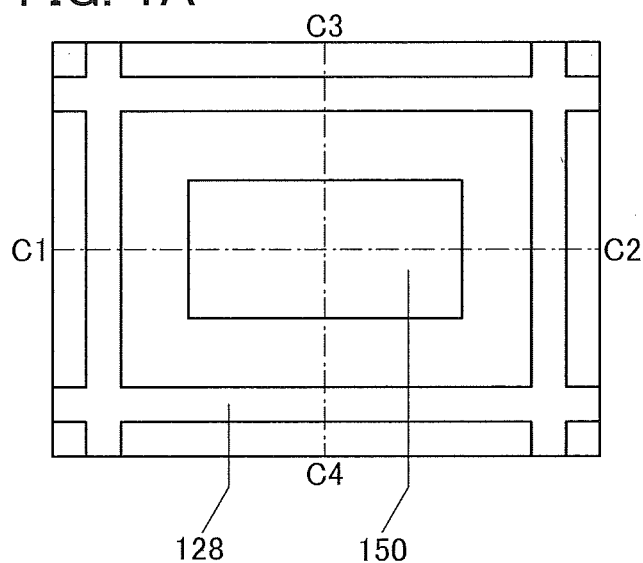
FIGS. 1A and 1B are a top view and a cross-sectional view of a device according to one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential and vice versa. Note that in general, a potential (a voltage) is relative and is determined depending on the amount relative to a certain potential. Therefore, a potential that is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Further, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, the values Might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, a term "semiconductor" can be referred to as an "oxide semiconductor". As the semiconductor, a Group 14 semiconductor such as silicon or germanium; a compound semiconductor such as silicon carbide, germanium silicide, gallium arsenide, indium phosphide, zinc selenide, or cadmium sulfide; or an organic semiconductor can be used.

A device of one embodiment of the present invention will be described. The device of one embodiment of the present invention includes at least one kind of element. In particular, a device including at least one kind of semiconductor element can be referred to as a semiconductor device.

Figure 1B:
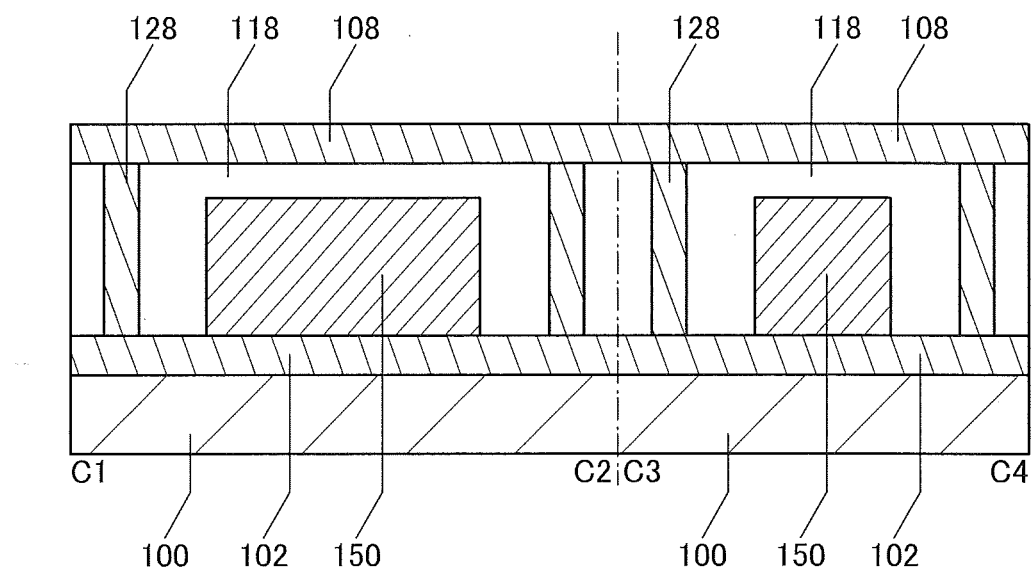

FIG. 1A is a top view of the device of one embodiment of the present invention. FIG. 1B is a cross-sectional view taken along dashed-dotted lines C1-C2 and C3-C4 in FIG. 1A. Note that some components, such as an insulator, may be omitted in the top view for easy understanding.

The device in FIG. 1B includes an insulator 102, an insulator 108, an insulator 118, an insulator 128, and an element 150. The insulator 102 is provided over the substrate 100. The element 150 is provided over the insulator 102. The insulator 118 is provided over the insulator 102 and the element 150 and includes an opening reaching the insulator 102. The insulator 128 is provided in the opening of the insulator 118 and includes a region in contact with the insulator 102. The insulator 108 is provided over the insulator 118 and the insulator 128 and includes a region in contact with the insulator 128.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 100. As a method for providing the device over a flexible substrate, there is a method in which the device is formed over a non-flexible substrate and then the device is separated and transferred to the substrate 100 which is a flexible substrate. In that case, a separation layer is preferably provided between the non-flexible substrate and the device. As the substrate 100, a sheet containing a fiber, a film, or a foil may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

As illustrated in FIGS. 1A and 1B, the device according to one embodiment of the present invention includes the insulator 102 below the element 150, the insulator 108 over the element 150, and the insulator 128 surrounding the element 150 in all directions. The insulator 102, the insulator 108, and the insulator 128 have barrier properties.

The insulator 118, which is a single layer here, may have a stacked-layer structure, in which case the layers are not necessarily formed successively. For example, the layer to be the insulator 118 may be formed in steps before and after the element 150 is formed.

The insulator 102 is an insulator having a low hydrogen-transmitting property (i.e., a hydrogen barrier property). The insulator 108 is an insulator having a low hydrogen-transmitting property. The insulator 128 is an insulator having a low hydrogen-transmitting property. The insulator 118 is an insulator having a high hydrogen-transmitting property. In other words, insulators having low hydrogen-transmitting properties (e.g., the insulator 102, the insulator 108, and the insulator 128) are less likely to transmit hydrogen than an insulator having a high hydrogen-transmitting property (e.g., the insulator 118).

Because the hydrogen atomic radius or the like is small, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include inorganic insulators such as silicon oxide or silicon oxynitride and organic insulators such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator containing crystal grain boundaries can have a high hydrogen-transmitting property. In other words, hydrogen is less likely transmitted through an insulator containing no grain boundaries or few grain boundaries. For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of the device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The insulator 102 is an insulator having a low oxygen-transmitting property (i.e., an oxygen barrier property). The insulator 108 is an insulator having a low oxygen-transmitting property. The insulator 128 is an insulator having a low oxygen-transmitting property. The insulator 118 is an insulator having a high oxygen-transmitting property. In other words, insulators having low oxygen-transmitting properties (e.g., the insulator 102, the insulator 108, and the insulator 128) are less likely to transmit oxygen than an insulator having a high oxygen-transmitting property (e.g., the insulator 118).

The insulator 102 is an insulator having a low water-transmitting property (i.e., a water barrier property). The insulator 108 is an insulator having a low water-transmitting property. The insulator 128 is an insulator having a low water-transmitting property. The insulator 118 is an insulator having a high water-transmitting property. In other words, insulators having low water-transmitting properties (e.g., the insulator 102, the insulator 108, and the insulator 128) are less likely to transmit water than an insulator having a high water-transmitting property (e.g., the insulator 118).

The element 150 includes a transistor, a capacitor, a resistor, a memory element, a display element, a light-emitting element, a photoelectric conversion element, or the like. These elements might change characteristics of the element 150 because of the movement of water, hydrogen, or oxygen. Thus, the element 150 is surrounded by the insulator which has a low water-transmitting property, a low hydrogen-transmitting property, and/or a low oxygen-transmitting property as shown in FIGS. 1A and 1B, the variation in characteristics of the element 150 can be suppressed.

An example in which characteristics of the elements are changed due to water, hydrogen, and/or oxygen will be described.

As a material of the transistor, a Group 14 semiconductor such as silicon or germanium; a compound semiconductor such as silicon carbide, germanium silicide, gallium arsenide, indium phosphide, zinc selenide, cadmium sulfide, or an oxide semiconductor; or an organic semiconductor can be used.

The characteristics of, for example, a transistor including silicon, germanium, silicon carbide, germanium silicide, or the like are improved by hydrogen and are degraded by oxygen. It is thus preferable to keep hydrogen around the element 150 and not to remain excess oxygen around the element 150. Note that excess oxygen means oxygen which exists in an insulator or the like and which does not bond with (which is liberated from) the insulator or the like or oxygen with low bonding energy with the insulator or the like.

Here, an insulator including excess oxygen may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in thermal desorption spectroscopy (TDS) analysis in the range of a surface temperature of 100° C. to 700° C. or 100° C. to 500° C.

The method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density of a signal attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The characteristics of a transistor including an oxide semiconductor or the like are degraded by water and hydrogen and are improved by oxygen; thus, oxygen preferably remains around the element 150. In addition, it is preferable that water and hydrogen (particularly, excess hydrogen) do not exist or less water and hydrogen exist around the element 150.

When a capacitor includes the semiconductor which is given as an example of a material for the transistor, the characteristics of the capacitor might be changed due to water, hydrogen, and/or oxygen. Furthermore, when a resistor includes the semiconductor which is given as an example of a material for the transistor, the characteristics of the resistor might be changed due to water, hydrogen, and/or oxygen.

When a memory element includes the above-described transistor, capacitor, and/or resistor, the characteristics of the memory element might be changed due to water, hydrogen, and/or oxygen. The change in characteristics of the memory element might cause a problem in which data cannot be written into and/or read from the memory element, a problem in which written data is erased, or the like. Examples of the memory element include a dynamic random access memory (DRAM), a static random access memory (SRAM), a ferroelectric random access memory (FeRAM), a resistance random access memory (ReRAM), a magnetic random access memory (MRAM), and a flash memory.

When a display element includes the above-described capacitor and/or resistor, for example, the characteristics of the display element might be changed due to water, hydrogen, and/or oxygen. The change in characteristics of the display element might cause a problem in which images are not displayed or cause display variation in display grayscale or display unevenness. In the case of using an organic electroluminescence (EL) element, which is a light-emitting element, the quality of an electrode and/or an organic compound might be changed by water and/or oxygen.

The characteristics of, for example, a photoelectric conversion element including silicon are improved by water and hydrogen and are degraded by oxygen; thus, water and hydrogen preferably remains around the element 150. In addition, it is preferable that oxygen do not exist around the element 150.

When the element 150 is surrounded by insulators having barrier properties, change in the characteristics of the element 150 can be suppressed as described above. Water, hydrogen, and/or oxygen remained around the element 150 can stabilize the characteristics of the element 150 in some cases.

<Modification Example of Device: 1>

Figure 2A:
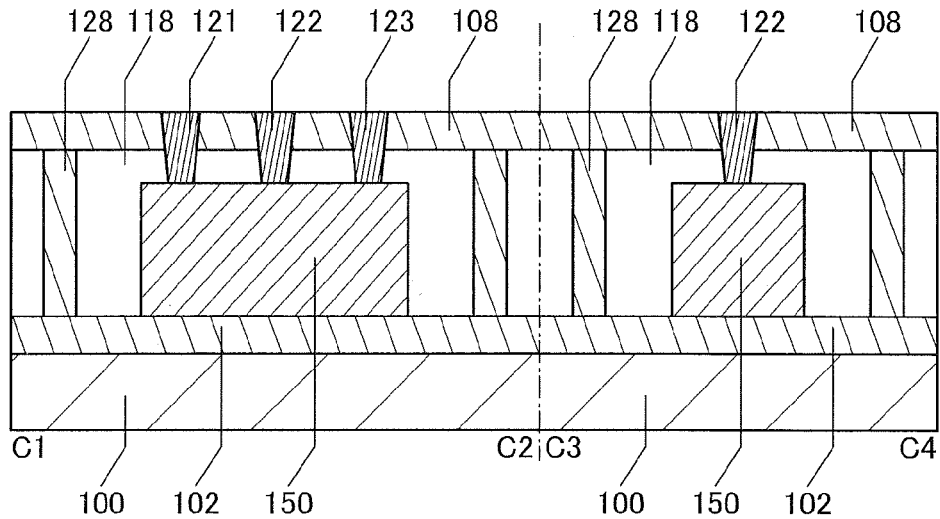
FIGS. 2A to 2C are cross-sectional views of a device according to one embodiment of the present invention.
Figure 2B:
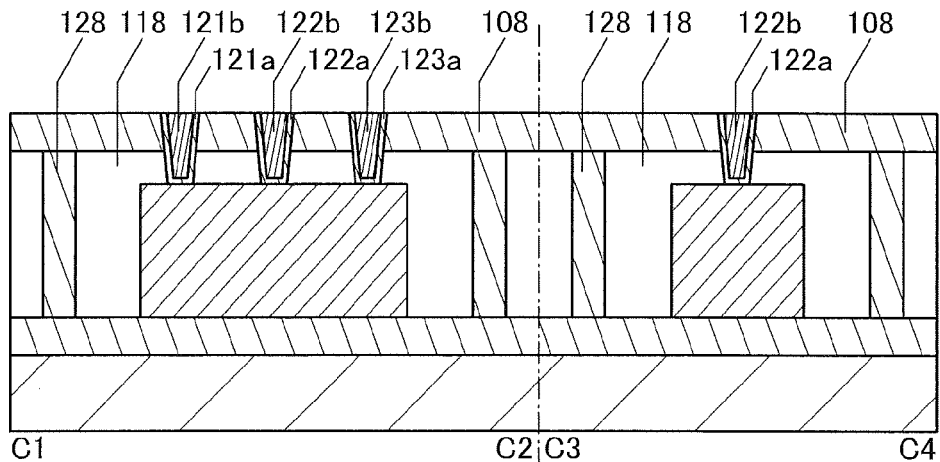
Figure 2C:
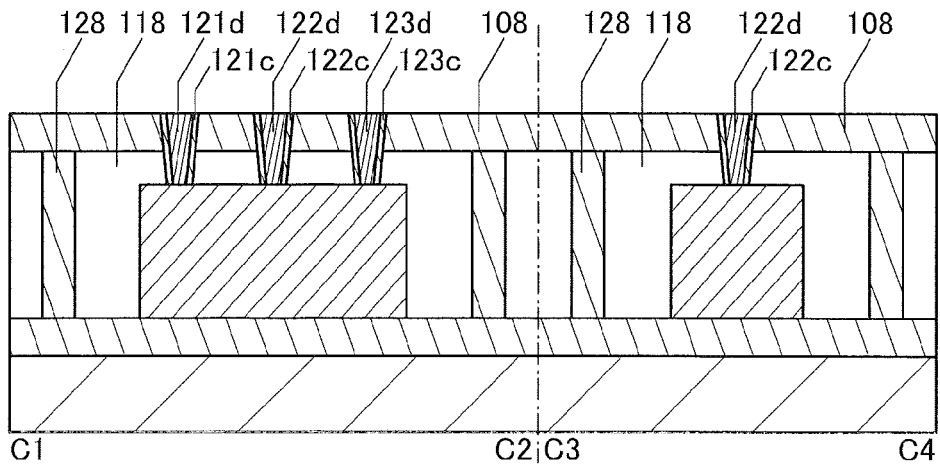

FIGS. 2A, 2B, and 2C are cross-sectional views of devices of one embodiment of the present invention, in each of which the element 150 of the device shown in FIGS. 1A and 1B is connected to an electrode and the like.

The device in FIG. 2A includes three openings in the insulator 108 and the insulator 118 which reach the element 150. The three openings are filled with conductors 121, 122, and 123, respectively. Each of the conductor 121, the conductor 122, and the conductor 123 has a function of inputting a signal to the element 150 and/or a function of outputting a signal from the element 150, for example. Although the number of openings is three in the non-limiting examples of FIG. 2A and the like, it can be other than three.

Each of the conductor 121, the conductor 122, and the conductor 123 is a conductor having a barrier property.

Each of the conductor 121, the conductor 122, and the conductor 123 is a conductor having a low hydrogen-transmitting property. Conductors having low hydrogen-transmitting properties (e.g., the conductor 121, the conductor 122, and the conductor 123) are less likely to transmit hydrogen than an insulator having a high hydrogen-transmitting property (e.g., the insulator 118).

Because the hydrogen atomic radius or the like is small, hydrogen is likely to be diffused in a conductor (i.e., the diffusion coefficient of hydrogen is large). For example, a low-density conductor has a high hydrogen-transmitting property. In other words, a high-density conductor has a low hydrogen-transmitting property. The density of a low-density conductor is not always low throughout the conductor;

a conductor including a low-density part is also referred to as a low-density conductor. This is because the low-density part serves as a hydrogen path. Although a density that allows hydrogen to be transmitted is not limited, it is typically lower than 6.0 g/cm$^3$. Examples of a high-density conductor include a metal, such as chromium, manganese, iron, cobalt, nickel, copper, zinc, zirconium, niobium, molybdenum, ruthenium, rhodium, palladium, silver, indium, tin, hafnium, tantalum, tungsten, iridium, platinum, or gold, an alloy containing at least one of these metal elements, and a compound such as oxide or nitride containing at least one of these metal elements. Note that a high-density conductor is not limited to these conductors. For example, the conductors may contain one or more of boron, fluorine, neon, phosphorus, chlorine, and argon.

A conductor containing crystal grain boundaries can have a high hydrogen-transmitting property. In other words, hydrogen is less likely transmitted through a conductor containing no grain boundaries or few grain boundaries. For example, a non-polycrystalline conductor (e.g., an amorphous conductor) has a lower hydrogen-transmitting property than a polycrystalline conductor.

A conductor having a high hydrogen-bonding energy has a low hydrogen-transmitting property in some cases. For example, when a conductor which forms a hydrogen compound by bonding with hydrogen (also referred to as a hydrogen absorbing alloy) has bonding energy at which hydrogen is not released at temperatures in fabrication and operation of the device, the conductor can be in the category of a conductor having a low hydrogen-transmitting property. For example, a conductor which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. A conductor which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. A conductor which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases.

The conductor 121 is a conductor having a low oxygen-transmitting property. The conductor 122 is a conductor having a low oxygen-transmitting property. The conductor 123 is a conductor having a low oxygen-transmitting property. In other words, conductors having low oxygen-transmitting properties (e.g., the conductor 121, the conductor 122, and the conductor 123) are less likely to transmit oxygen than an insulator having a high oxygen-transmitting property (e.g., the insulator 118). In particular, the conductor 121 is a conductor having a low oxygen-reactivity (a low reactivity with oxygen). The conductor 122 is a conductor having a low oxygen-reactivity. The conductor 123 is a conductor having a low oxygen-reactivity. A conductor having a low oxygen-reactivity is not oxidized or is slightly oxidized at temperatures in fabrication and operation of the device (e.g., the thickness of an oxidized region is less than 10 nm, preferably less than 5 nm, further preferably less than 3 nm). A conductor having a low oxygen-reactivity hardly reacts with oxygen and is hardly increased in resistance and thus is suitable for passing current.

The conductor 121 is a conductor having a low water-transmitting property. The conductor 122 is a conductor having a low water-transmitting property. The conductor 123 is a conductor having a low water-transmitting property. In other words, conductors having low water-transmitting properties (e.g., the conductor 121, the conductor 122, and the conductor 123) are less likely to transmit water than an insulator having a high water-transmitting property (e.g., the insulator 118).

The element 150 includes a transistor, a capacitor, a resistor, a memory element, a display element, or the like. These elements might change characteristics of the element 150 because of the movement of water, hydrogen, or oxygen. Thus, the element 150 is surrounded by the insulator and the conductor which has a low water-transmitting property, a low hydrogen-transmitting property, and/or a low oxygen-transmitting property as shown in FIG. 2A, the variation in characteristics of the element 150 can be suppressed.

Note that a device of one embodiment of the present invention is not limited to the device shown in FIG. 2A.

The device in FIG. 2B includes three openings in the insulator 108 and the insulator 118 which reach the element 150. A conductor 121a, a conductor 122a, and a conductor 123a are provided along the side surfaces and the bottom surfaces of their respective openings. A conductor 121b, a conductor 122b, and a conductor 123b are provided on the conductor 121a, the conductor 122a, and the conductor 123a, respectively. The conductor 121a and the conductor 121b have the same function as the conductor 121. The conductor 122a and the conductor 122b have the same function as the conductor 122. The conductor 123a and the conductor 123b have the same function as the conductor 123. Although the number of openings is three in the non-limiting examples of FIG. 2B and the like, it can be other than three.

The device shown in FIG. 2A is an example in which one conductor has a plurality of functions, whereas the device shown in FIG. 2B is an example in which two conductors have their respective functions; for example, the conductor 121a, the conductor 122a, and the conductor 123a have barrier properties and the conductor 121b, the conductor 122b, and the conductor 123b have high conductivities. The device in FIG. 2B, in which two conductors have their respective functions, can have a higher degree of freedom of device configuration by combination of conductors. In addition, each of the functions of the conductors can be improved as compared to the case where one conductor is used.

When the conductor 121a, the conductor 122a, and the conductor 123a have barrier properties, the conductor 121b, the conductor 122b, and the conductor 123b do not necessarily have barrier properties, though they may have barrier properties. For example, the conductor 121b, the conductor 122b, and the conductor 123b may have different barrier properties.

Note that a device of one embodiment of the present invention is not limited to the devices shown in FIGS. 2A and 2B.

The device in FIG. 2C includes three openings in the insulator 108 and the insulator 118 which reach the element 150. A conductor 121c, a conductor 122c, and a conductor 123c are provided along the side surfaces of their respective openings. Note that the conductor 121c, the conductor 122c, and the conductor 123c are not provided on the bottom surfaces of the openings. A conductor 121d, a conductor 122d, and a conductor 123d are provided in their respective openings. The conductor 121c and the conductor 121d have the same function as the conductor 121. The conductor 121c and the conductor 122d have the same function as the conductor 122. The conductor 123c and the conductor 123d have the same function as the conductor 123. Although the number of openings is three in the non-limiting examples of FIG. 2C and the like, it can be other than three.

The device shown in FIG. 2C is an example in which two conductors have their respective functions; for example, the conductor 121c, the conductor 122c, and the conductor 123c have barrier properties and the conductor 121d, the conductor 122d, and the conductor 123d have high conductivities. The device in FIG. 2C, in which two conductors have their respective functions, can have a higher degree of freedom of device configuration by combination of conductors. In addition, each of the functions of the conductors can be improved as compared to the case where one conductor is used. In the device shown in FIG. 2C, the conductor 121d, the conductor 122d, and the conductor 123d are electrically connected to the element 150 without the conductor 121c, the conductor 122c, and the conductor 123c provided therebetween. Thus, the conductor 121c, the conductor 122c, and the conductor 123c are not limited to conductors and may be semiconductors or insulators, for example. When the conductor 121c, the conductor 122c, and the conductor 123c are insulators, any of the above-described insulators having high barrier properties can be used, for example.

When the conductor 121c, the conductor 122c, and the conductor 123c have barrier properties, the conductor 121d, the conductor 122d, and the conductor 123d do not necessarily have barrier properties, though they may have barrier properties. For example, the conductor 121d, the conductor 122d, and the conductor 123d may have different barrier properties.

<Modification Example of Device: 2>

Figure 3A:
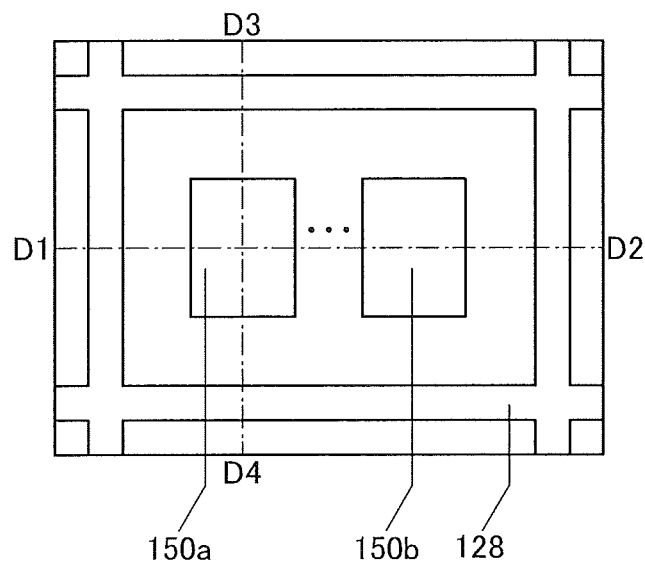
FIGS. 3A and 3B are a top view and a cross-sectional view of a device according to one embodiment of the present invention.
Figure 3B:
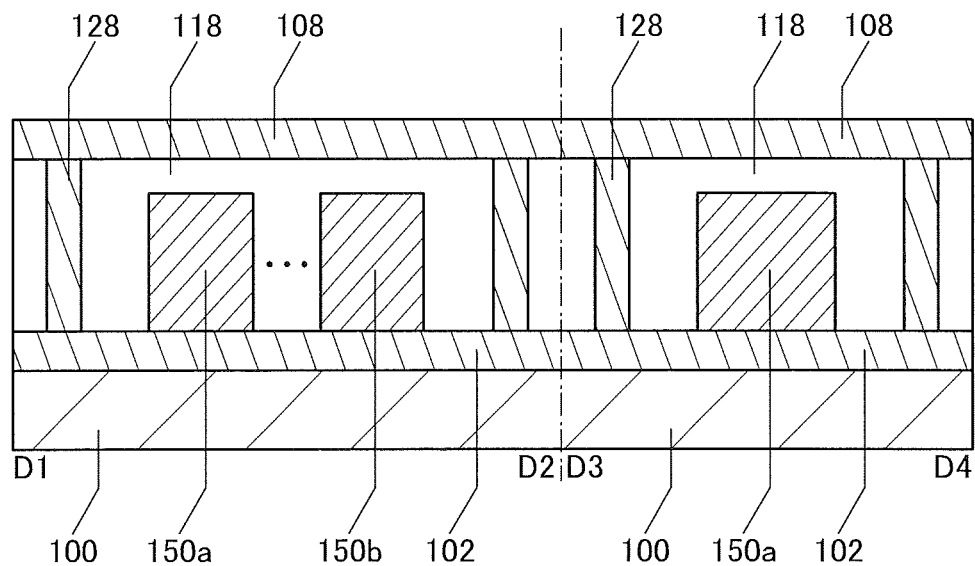
Figure 4A:
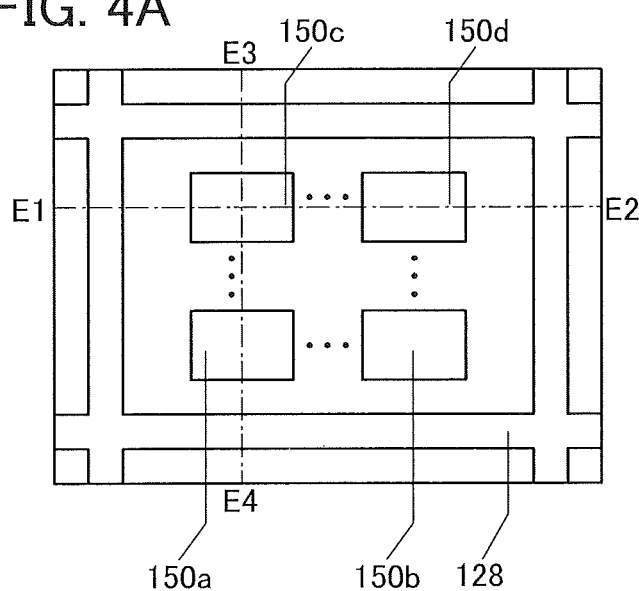
FIGS. 4A and 4B are a top view and a cross-sectional view of a device according to one embodiment of the present invention.
Figure 4B:
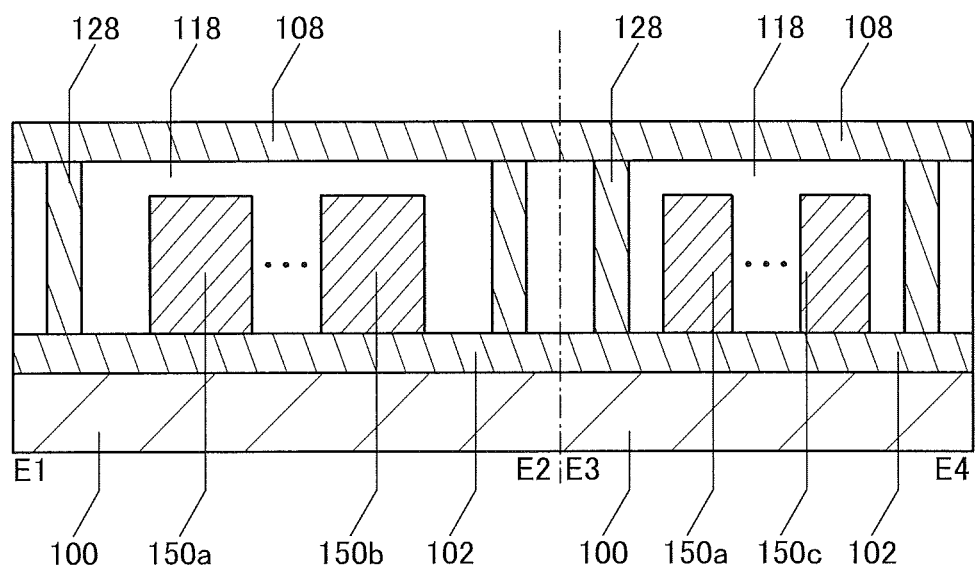

FIGS. 3A and 3B and FIGS. 4A and 4B show modification examples of the device shown in FIGS. 1A and 1B: devices shown in FIGS. 3A and 3B and FIGS. 4A and 4B include a plurality of the elements. Note that FIG. 3A and FIG. 4A are top views of the devices and FIG. 3B and FIG. 4B are cross-sectional views of the devices.

The device shown in FIGS. 3A and 3B includes, in a region surrounded by an insulator having a barrier property, an element group including two or more elements (e.g., an element 150a and an element 150b) arranged in a row direction. The device shown in FIGS. 4A and 4B includes, in a region surrounded by an insulator having a barrier property, an element group including two or more elements (e.g., an element 150a, an element 150b, an element 150c, and an element 150d) arranged in a row direction and in a column direction.

The devices shown in FIGS. 3A and 3B and FIGS. 4A and 4B, each of which includes an element group in a region surrounded by an insulator having a barrier property, can be highly integrated as compared with the device shown in FIGS. 1A and 1B.

Note that in the devices shown in FIGS. 3A and 3B and FIGS. 4A and 4B, the elements and the like may be connected to electrodes as in the devices shown in FIGS. 2A to 2C.

<Modification Example of Device: 3>

Figure 5A:
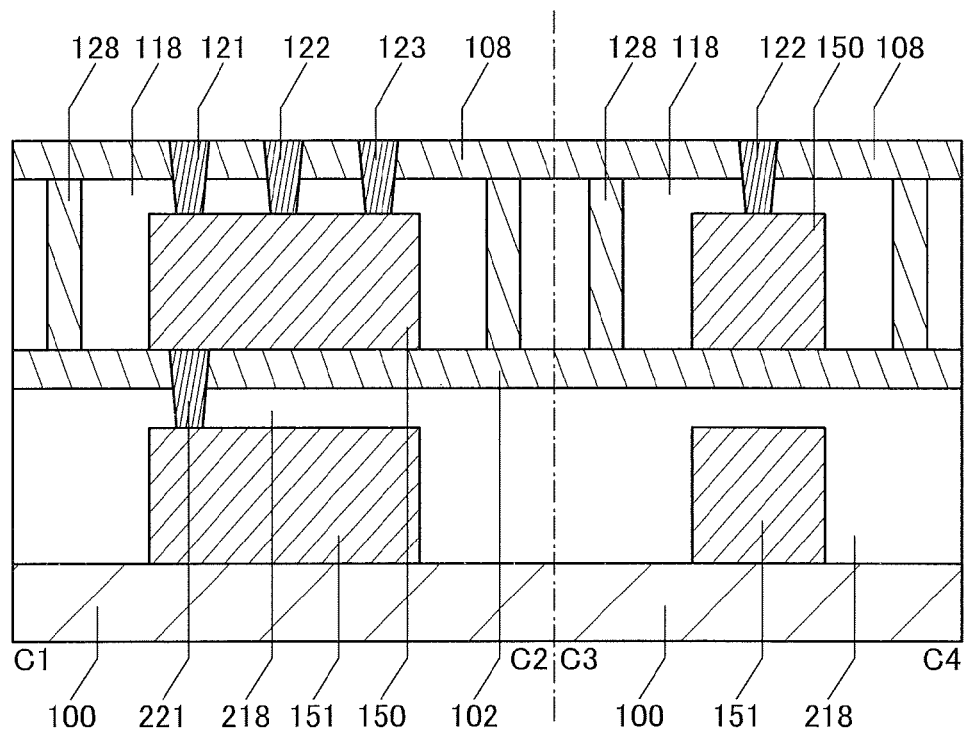
FIGS. 5A and 5B are cross-sectional views of a device according to one embodiment of the present invention.
Figure 5B:
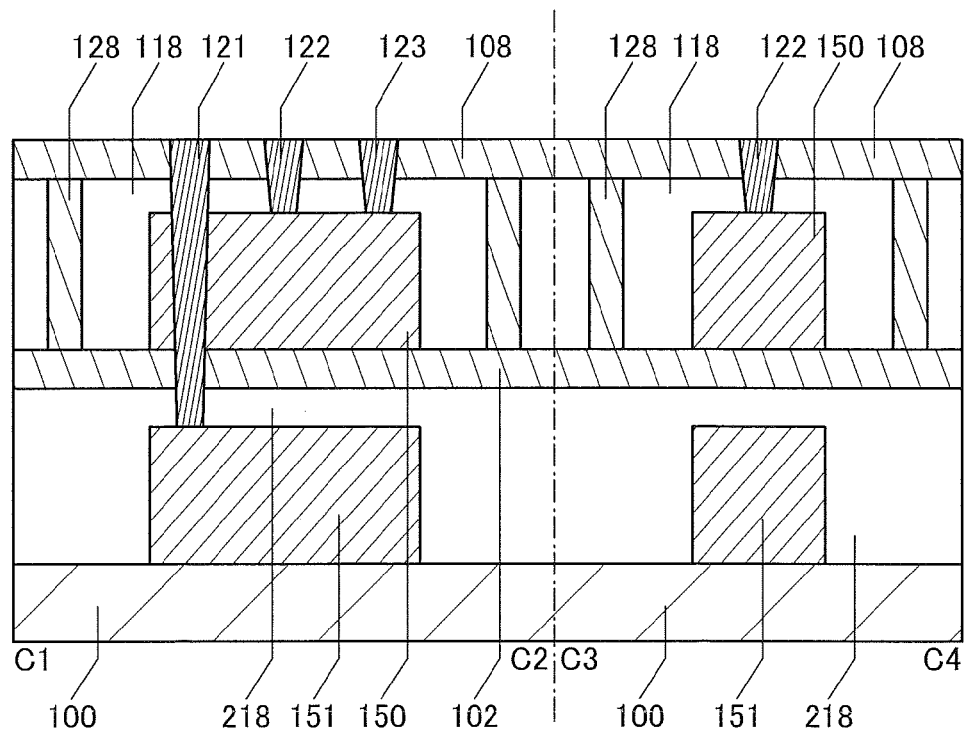

FIG. 5A and FIG. 5B are cross-sectional views of devices of one embodiment of the present invention.

The device shown in FIG. 5A includes the insulator 102, the insulator 108, the insulator 118, and the insulator 128, the element 150, an insulator 218, the conductor 121, the conductor 122, and the conductor 123, a conductor 221, and an element 151. The element 151 is provided over the substrate 100. The insulator 218 is provided over the substrate 100 and the element 151. The insulator 102 is provided over the insulator 218. The element 150 is provided over the insulator 102. The insulator 118 is provided over the insulator 102 and the element 150 and includes an opening reaching the insulator 102. The insulator 128 is provided in the opening of the insulator 118 and includes a region in contact with the insulator 102. The insulator 108 is provided over the insulator 118 and the insulator 128 and includes a region in contact with the insulator 128.

The device in FIG. 5A includes three openings in the insulator 108 and the insulator 118 which reach the element 150. The three openings are filled with conductors 121, 122, and 123, respectively. Each of the conductor 121, the conductor 122, and the conductor 123 has a function of inputting a signal to the element 150 and/or a function of outputting a signal from the element 150, for example. Although the number of openings is three in the non-limiting examples of FIG. 5A and the like, it can be other than three.

The device in FIG. 5A includes an opening in the insulator 102 and the insulator 218 which reach the element 151. The opening is filled with a conductor 221. The conductor 221 has a function of inputting a signal to the element 151 and/or a function of outputting a signal from the element 151, for example. For example, signals can be transmitted between the element 150 and the element 151 through the conductor 221. Although the number of openings is one in the non-limiting examples of FIG. 5A and the like, it can be other than one.

The insulator 218, which is a single layer here, may have a stacked-layer structure, in which case the layers are not necessarily formed successively. For example, the layer to be the insulator 218 may be formed in steps before and after the element 151 is formed.

The insulator 218 is an insulator having a high hydrogen-transmitting property. In other words, insulators having low hydrogen-transmitting properties (e.g., the insulator 102, the insulator 108, and the insulator 128) are less likely to transmit hydrogen than an insulator having a high hydrogen-transmitting property (e.g., the insulator 218).

The conductor 121 is referred to for the conductor 221.

The element 150 is referred to for the element 151. Note that the element 151 is preferably of a different type from the element 150. For example, the characteristics of the element 151 is improved by hydrogen, whereas the characteristics of the element 150 is degraded by hydrogen, in which case hydrogen can be transmitted only to the element 151 because the element 150 is surrounded by an insulator and a conductor having low hydrogen-transmitting properties. Thus, the characteristics of the element 151 can be improved and the element 150 can be prevented from being degraded. In another case in which the characteristics of the element 150 is improved by oxygen, whereas the characteristics of element 151 is degraded by oxygen; oxygen can be supplied only to the element 150 because the element 150 is surrounded by an insulator and a conductor having low oxygen-transmitting properties. Thus, the characteristics of the element 150 can be improved and the element 151 can be prevented from being degraded.

Since the element 150 and the element 151 are of different types, a device that utilizes their respective characteristics of the element 150 and the element 151 can be provided. For example, a circuit configuration of a storage device described later can be provided.

Stacking the element 150 and the element 151 leads to a reduction in the device area as compared with a structure in which the elements are not stacked.

The number of kinds of the element 151 may be, but not limited to, one and may be two or more.

Although the element 150 is located over the element 151 in the non-limiting example, the element 151 may be surrounded by an insulator having a barrier property, for example.

The device shown in FIG. 5B is different from the device in FIG. 5A in that the conductor 221 is not provided and that the conductor 121 penetrates the element 150 to reach the element 151. The device in FIG. 5A is accordingly referred to for the device in FIG. 5B.

The conductor 121 is electrically connected to the element 151 and the element 150. Note that the conductor 121 is not necessarily connected electrically to the element 151 and/or the element 150. Since the element 150 and the element 151 are electrically connected through one conductor, the degree of freedom of device design can be increased, which might lead to high integration of the device. Furthermore, the number of steps is reduced, which might lead to easier fabrication of the device.

Although one conductor is used as an electrode in FIGS. 5A and 5B as in the device shown in FIG. 2A, two conductors may be used as an electrode as in the device shown in FIG. 2B or 2C.

<Method for Manufacturing Device: 1>

A method for manufacturing the device shown in FIG. 5A will be described with reference to cross-sectional views of FIGS. 6A and 6B, FIGS. 7A and 7B, and FIGS. 8A and 8B.

First, the substrate 100 is prepared.

Then, the element 151 is formed. The element 151 is formed over the substrate 100 herein a non-limiting example of the device of one embodiment of the present invention. For example, the element 151 can be formed using part of the substrate 100 in the case of using a semiconductor substrate as the substrate 100.

Figure 6A:
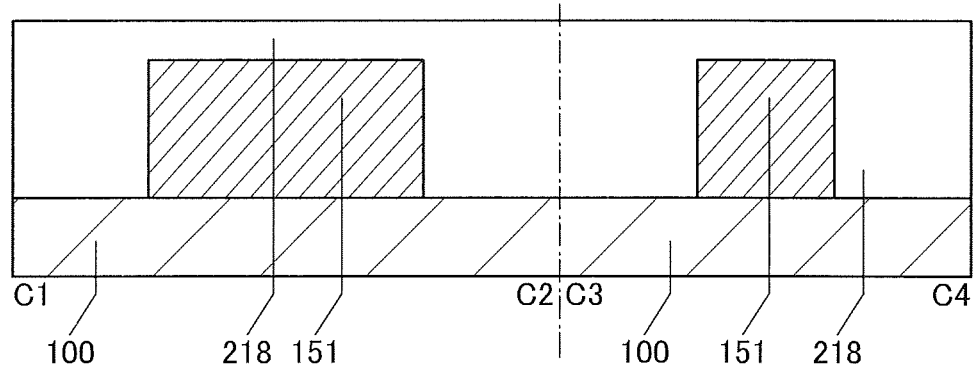
FIGS. 6A and 6B are cross-sectional views illustrating a method for manufacturing a device according to one embodiment of the present invention.

Next, the insulator 218 is formed (see FIG. 6A). The insulator 218 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects (pinholes) can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

The insulator 218 is not necessarily formed at this stage; part of a layer forming the insulator 218 may be formed before or at the same time as the element 151 is formed. Accordingly, the insulator 218 can have a stacked-layer structure in which a first insulator under the element 151 and a second insulator over the element 151.

The top surface of the insulator 218 is preferably planarized by chemical mechanical polishing (CMP) treatment or the like after the insulator 218 is formed.

Next, the insulator 102 is formed. The insulator 102 can be formed by a sputtering method, a CVD method, an MBE method, a PLD method, an ALD method, or the like. An ALD method is particularly preferable because steps can be sufficiently covered thereby; the insulator 102 can be formed along the shape of the insulator 218 even if particles or the like are attached thereon. Thus, the insulator 102 formed by an ALD method can reliably cover the insulator 218. Note that an ALD apparatus described later is preferably used for forming the device of one embodiment of the present invention.

Next, a resist or the like is formed over the insulator 102, and an opening exposing the element 151 is formed in the insulator 102 and the insulator 218 using the resist. Note that a simple description "a resist is formed" also means the case where an anti-reflection layer is formed below the resist.

The resist is removed after the object is processed by etching or the like. Plasma treatment and/or wet etching are/is used for removing the resist. Note that as the plasma treatment, plasma aching is preferable. In the case where the resist or the like is not sufficiently removed, the remaining resist or the like may be removed using ozone water and/or hydrofluoric acid at a concentration higher than or equal to 0.001 volume % and lower than or equal to 1 volume %, and the like.

Next, a conductor to be the conductor 221 is formed. The conductor can be formed by a sputtering method, a CVD method, an MBE method, a PLD method, an ALD method, or the like. Note that the opening in the insulator 102 and the insulator 218 is preferably filled with the conductor. Thus, if the aspect ratio of the opening is high, a CVD method (e.g., an MCVD method) or an ALD method is preferably used. Alternatively, a stacked-layer conductor as shown in FIG. 2B may be formed by combination of a CVD method and an ALD method; for example, a conductor is formed to cover the side surface and the bottom surface of the opening by an ALD method, and then, another conductor is formed over the conductor by a CVD method.

Figure 6B:
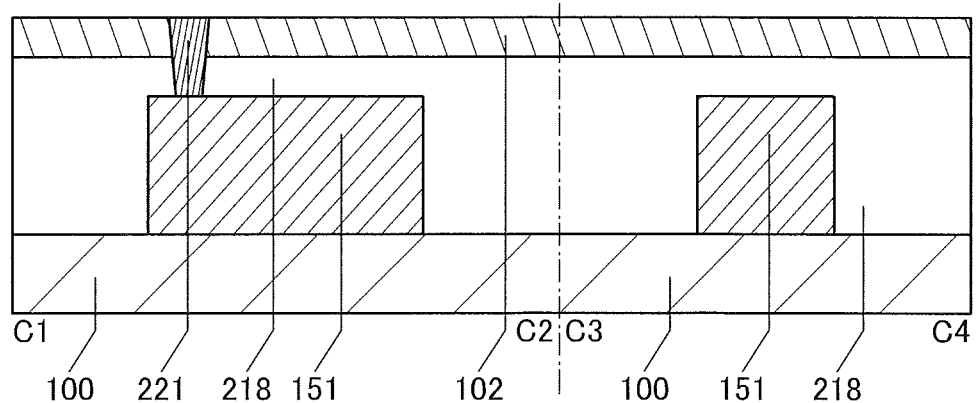

Next, part of the conductor to be the conductor 221 above the insulator 102 is removed, so that the conductor 221 remains only in the opening in the insulator 102 and the insulator 218 (see FIG. 6B). A CMP method or the like can be used for removing the conductor, which is to be the conductor 221.

Figure 7A:
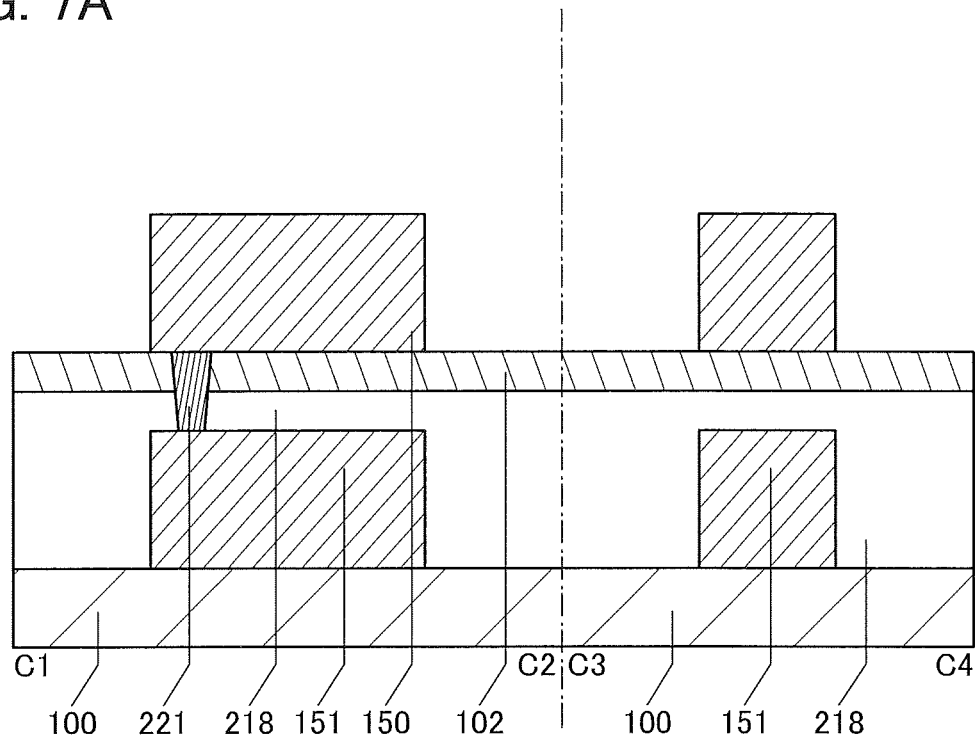
FIGS. 7A and 7B are cross-sectional views illustrating a method for manufacturing a device according to one embodiment of the present invention.

Next, the element 150 is formed over the insulator 102 and the conductor 221 (see FIG. 7A).

Figure 7B:
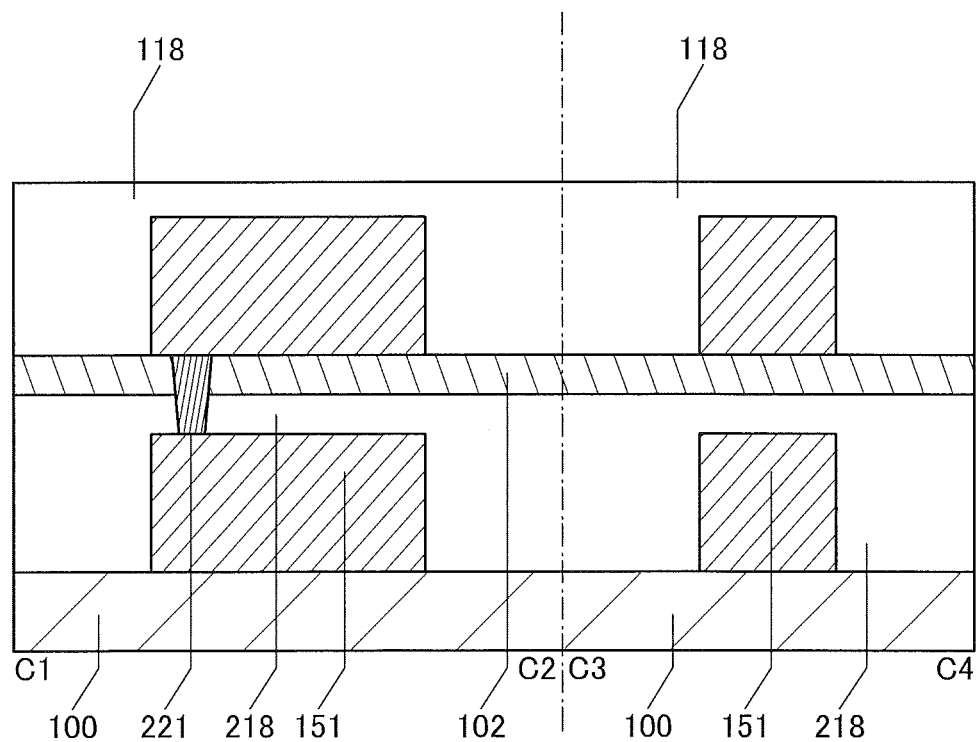

Next, the insulator 118 is formed (see FIG. 7B). The insulator 118 can be formed by a sputtering method, a CVD method, an MBE method, a PLD method, an ALD method, or the like.

The insulator 118 is not necessarily formed at this stage; part of a layer forming the insulator 118 may be formed before the element 150 is formed or at the same time as the element 150 is formed. Accordingly, the insulator 118 can have a stacked-layer structure a stacked-layer structure in which a first insulator under the element 150 and a second insulator over the element 150.

Next, a resist or the like is formed over the insulator 118, and an opening exposing the insulator 102 is formed in the insulator 118 using the resist. The resist is removed after the object is processed by etching or the like.

The top surface of the insulator 118 is preferably planarized after the insulator 118 is formed.

Next, an insulator to be the insulator 128 is formed. The insulator can be formed by a sputtering method, a CVD method, an MBE method, a PLD method, an ALD method, or the like. Note that the opening in the insulator 118 is preferably filled with the insulator. Thus, if the aspect ratio of the opening is high, a CVD method (e.g., an MOCVD method) or an ALD method is preferably used. Alternatively, a stacked-layer insulator may be formed by combination of a CVD method and an ALD method; for example, an insulator is formed to cover the side surface and the bottom surface of the opening by an ALD method, and then, another insulator is formed over the conductor by a CVD method.

Figure 8A:
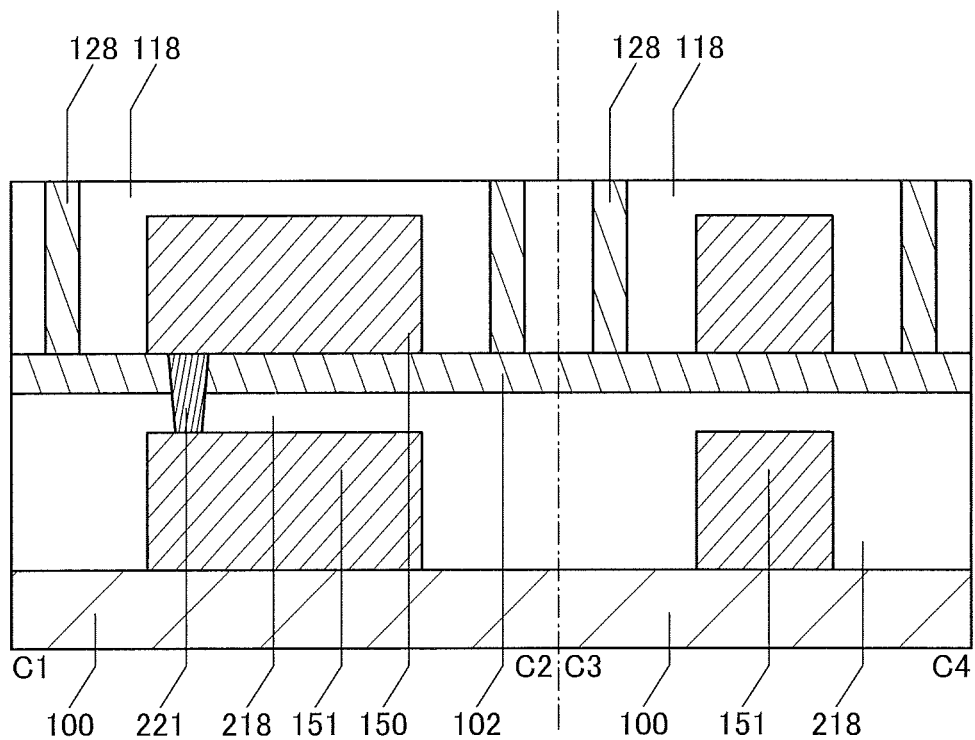
FIGS. 8A and 8B are cross-sectional views illustrating a method for manufacturing a device according to one embodiment of the present invention.

Next, part of the insulator to be the insulator 128 above the insulator 118 is removed, so that the insulator 128 remains only in the opening in the insulator 118 (see FIG. 8A). A CMP method or the like can be used for removing the insulator, which is to be the insulator 128.

Next, the insulator 108 is formed. The insulator 108 can be formed by a sputtering method, a CVD method, an MBE method, a PLD method, an ALD method, or the like. An ALD method is particularly preferable because steps can be sufficiently covered thereby; the insulator 108 can be formed along the shape of the insulator 118 even if particles or the like are attached thereon. Thus, the insulator 108 formed by an ALD method can reliably cover the insulator 118. Note that an ALD apparatus described later is preferably used for forming the device of one embodiment of the present invention.

Next, a resist or the like is formed over the insulator 108, and three openings exposing the element 150 are formed in the insulator 108 and the insulator 118 using the resist. The resist is removed after the objects are processed by etching or the like.

Next, conductors to be the conductor 121, the conductor 122, and the conductor 123 are formed. The conductors can be formed by a sputtering method, a CVD method, an MBE method, a PLD method, an ALD method, or the like. Note that the openings in the insulator 108 and the insulator 118 are preferably filled with the conductors. Thus, if the aspect ratio of the openings is high, a CVD method (e.g., an MCVD method) or an ALD method is preferably used. Alternatively, stacked-layer conductors as shown in FIG. 2B may be formed by combination of a CVD method and an ALD method; for example, a conductor is formed to cover the side surfaces and the bottom surfaces of the openings by an ALD method, and then, another conductor is formed over the conductor by a CVD method.

Figure 8B:
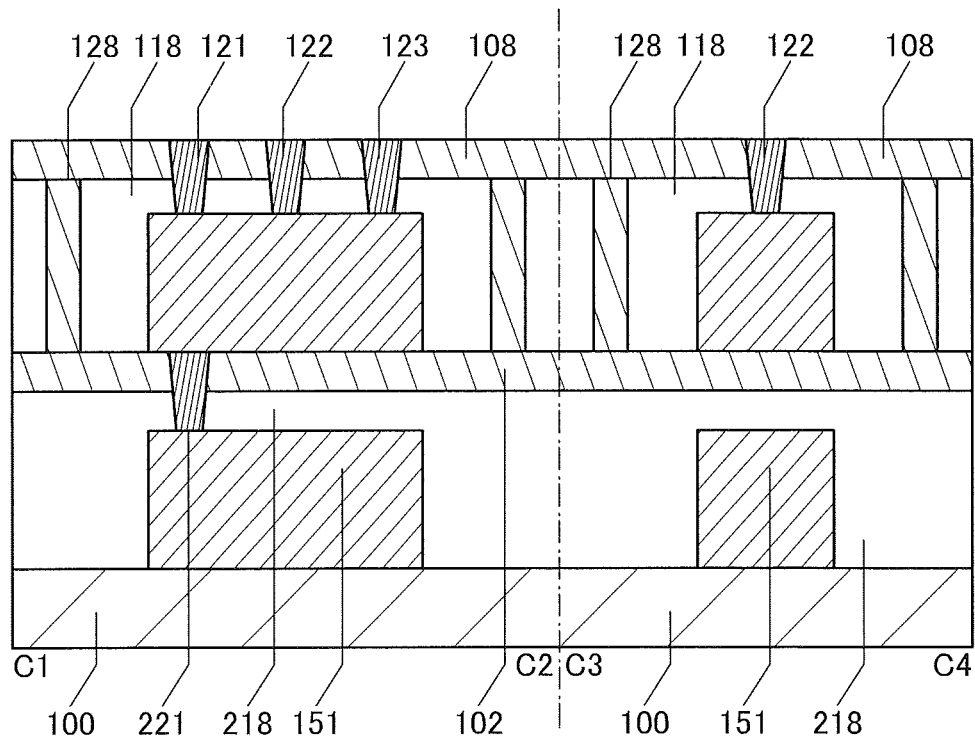

Next, part of the conductors to be the conductor 121, the conductor 122, and the conductor 123 above the insulator 108 is removed, so that the conductor 121, the conductor 122, and the conductor 123 remain only in the openings in the insulator 108 and the insulator 118 (see FIG. 8B). A CMP method or the like can be used for removing the conductors, which is to be the conductor 121, the conductor 122, and the conductor 123.

Through the above steps, the device illustrated in FIG. 5A can be manufactured.

<Method for Manufacturing Device: 2>

A method for manufacturing the device shown in FIG. 5B will be described with reference to cross-sectional views of FIGS. 9A and 9B and FIGS. 10A and 10B. Since the manufacturing method of the device shown in FIG. 5B is similar to that of the device shown in FIG. 5A, the manufacturing method of the device shown in FIG. 5A can be referred to appropriately.

First, the substrate 100 is prepared.

Then, the element 151 is formed.

Next, the insulator 218 is formed.

The top surface of the insulator 218 is preferably planarized after the insulator 218 is formed.

Figure 9A:
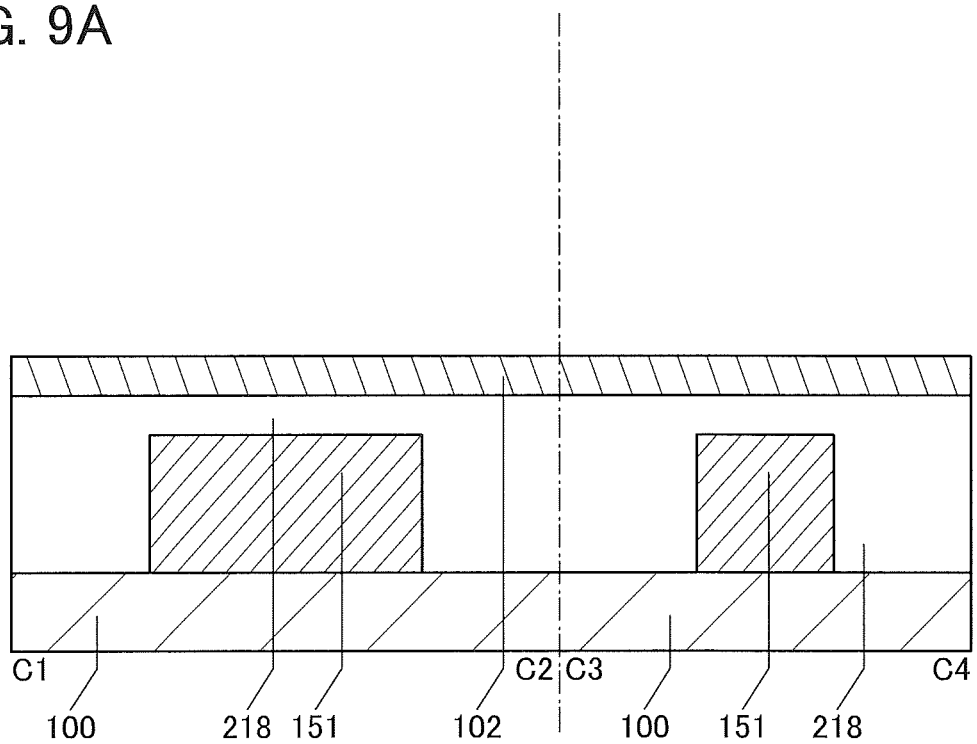
FIGS. 9A and 9B are cross-sectional views illustrating a method for manufacturing a device according to one embodiment of the present invention.

Next, the insulator 102 is formed (see FIG. 9A).

The element 150 is then formed over the insulator 102.

Next, the insulator 118 is formed.

Next, a resist or the like is formed over the insulator 118, and an opening exposing the insulator 102 is formed in the insulator 118 using the resist. The resist is removed after the object is processed by etching or the like.

Next, an insulator to be the insulator 128 is formed.

Figure 9B:
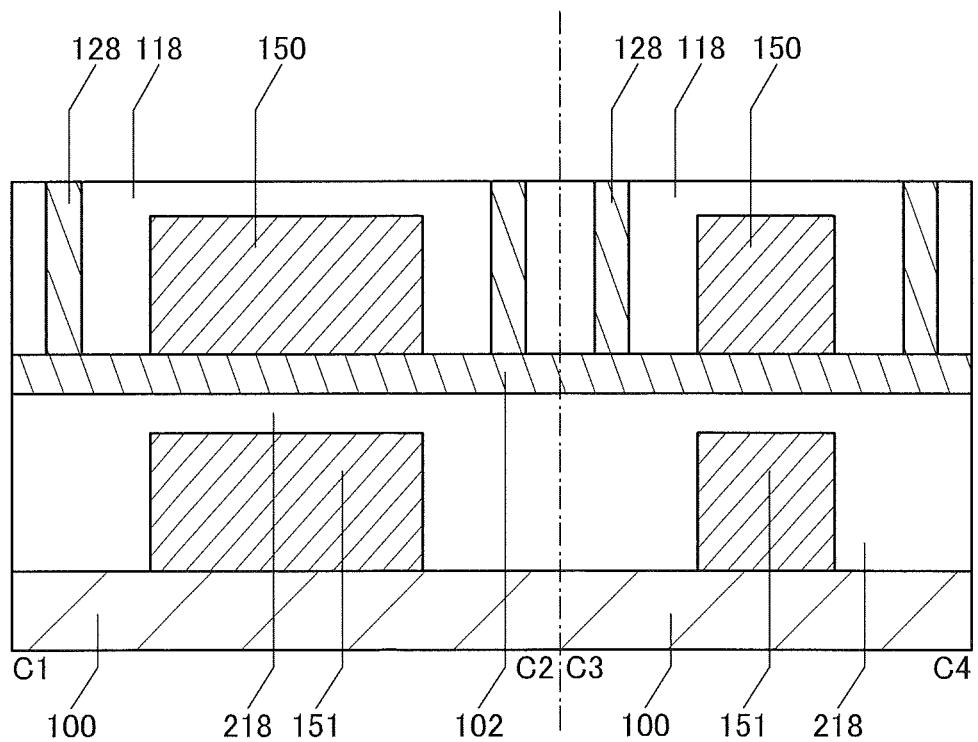

Next, part of the insulator to be the insulator 128 above the insulator 118 is removed, so that the insulator 128 remains only in the opening in the insulator 118 (see FIG. 9B).

Next, the insulator 108 is formed.

Next, a resist or the like is formed over the insulator 108, and an opening exposing the element 151 are formed in the insulator 108 and the insulator 118, the element 150, and the insulator 102 and the insulator 218 using the resist. The resist is removed after the objects are processed by etching or the like.

Figure 10A:
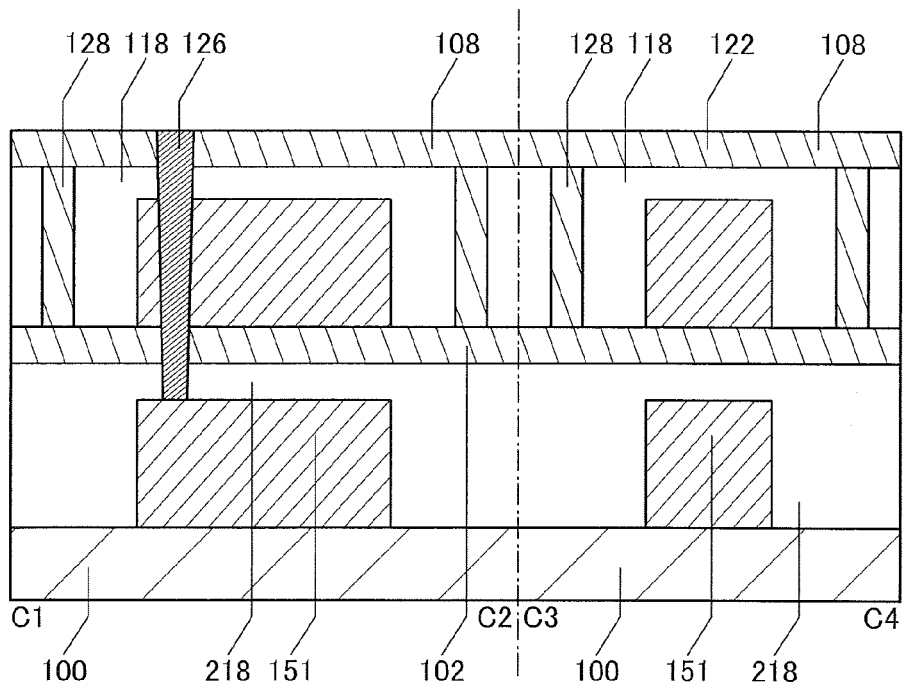
FIGS. 10A and 10B are cross-sectional views illustrating a method for manufacturing a device according to one embodiment of the present invention.

Next, the opening is filled with a sacrificial layer 126 (see FIG. 10A). The above-described insulator, semiconductor, or conductor can be used for the sacrificial layer 126. To fill the opening with the sacrificial layer 126, the insulator, semiconductor, or conductor to be the sacrificial layer 126 is formed and then the insulator, semiconductor, or conductor above the insulator 108 is removed by a CMP method or the like.

Next, a resist or the like is formed over the insulator 108 and the sacrificial layer 126, and two openings exposing the element 150 are formed in the insulator 108 and the insulator 118 using the resist. The resist is removed after the objects are processed by etching or the like.

Then, the sacrificial layer 126 is removed under selected conditions so that the insulators, the semiconductors, and the conductors of the device can be left.

Next, conductors to be the conductor 121, the conductor 122, and the conductor 123 are formed.

Figure 10B:
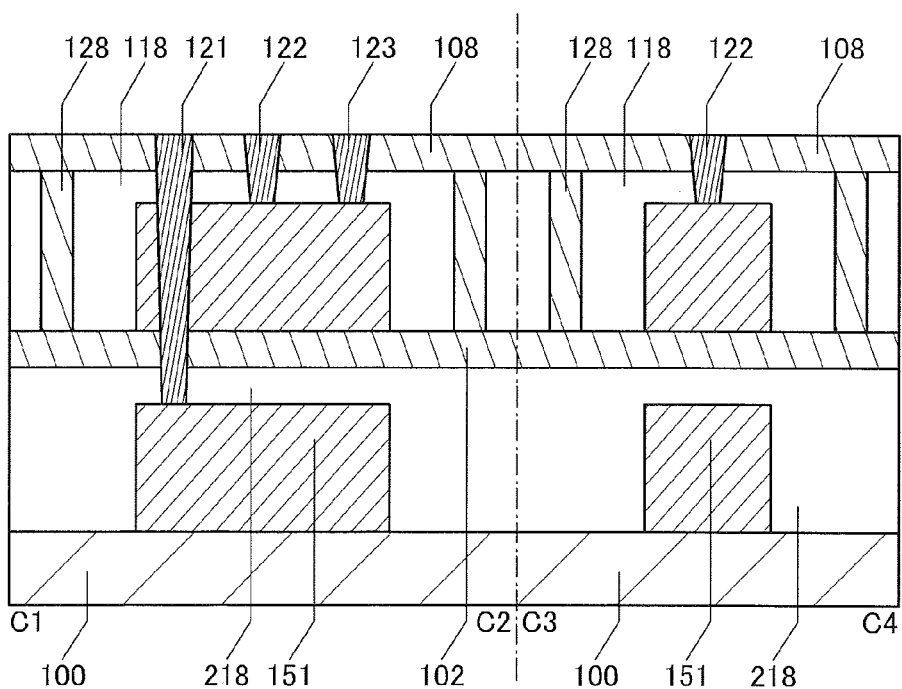

Next, part of the conductors to be the conductor 121, the conductor 122, and the conductor 123 above the insulator 108 are removed to form the conductor 121 which remains in the opening in the insulator 108 and the insulator 118, the element 150, and the insulator 102 and the insulator 218 and the conductor 122 and the conductor 123 which remain in the two openings in the insulator 108 and the insulator 118 (see FIG. 10B). The conductors to be the conductor 121, the conductor 122, and the conductor 123 can be removed by a CMP method or the like.

Through the above steps, the device illustrated in FIG. 5B can be manufactured.

<ALD Method>

An example in which an insulator, a semiconductor, or a conductor is formed in an opening by an ALD method will be described.

Here, the steps shown in FIG. 7B and FIG. 8A are described as examples. In FIGS. 11A to 11G, a sample including the insulator 102 and the insulator 118 is enlarged for easy understanding.

First, the sample is put in an ALD apparatus. The sample is put on a stage in the ALD apparatus. The stage temperature can be determined as appropriate depending on the type of a gas used for the deposition: for example, higher than or equal to 15° C. and lower than or equal to 400° C., preferably higher than or equal to 70° C. and lower than or equal to 300° C. The ALD apparatus is then evacuated using a vacuum pump.

Next, an oxidation gas is supplied into the ALD apparatus. One or more of oxygen, ozone, water, nitrous oxide, alcohol (e.g., methanol or ethanol), and hydrogen peroxide may be used as the oxidation gas. The oxidation gas is supplied, whereby hydroxyl is formed on the sample surface in some cases.

Next, the supply of the oxidation gas is stopped, and an inert gas is supplied into the ALD apparatus for purging. Nitrogen, argon, or the like can be used as the inert gas. Note that the oxidation gas may be exhausted using a vacuum pump without supplying an inert gas. The step of supplying an oxidation gas is not necessarily performed.

Next, a precursor is supplied into the ALD apparatus. The precursor reacts with and chemically adsorbs the hydroxyl on the sample surface, whereby a precursor layer 190 is formed. The chemical adsorption is completed when the sample surface is covered by the precursor layer 190 (see FIG. 11A). A metal complex may be used as the precursor. A metal complex including one or more ligands selected from halogen (e.g., fluorine, chlorine, bromine, or iodine), alkyl (e.g., $CH_3$ or $C_2H_5$), alkoxide (e.g., $OCH_3$ or $OC_2H_5$), amide (e.g., $N(CH_3)_2$, $NCH_3C_2H_5$, or $N(C_2H_5)_2$), cyclopentadienyl, substituted cyclopentadienyl (e.g., pentamethylcyclopentadienyl), and indene. Alternatively, a diketonate complex or an amidinate complex may be used. As the central metal of the metal complex, magnesium, aluminum, gallium, yttrium, zirconium, lanthanum, neodymium, hafnium, or tantalum can be used.

Then, the supply of the precursor is stopped. An inert gas is supplied into the ALD apparatus for purging (see FIG. 11B). Note that the precursor may be exhausted using a vacuum pump without supplying an inert gas.

Figure 11A:
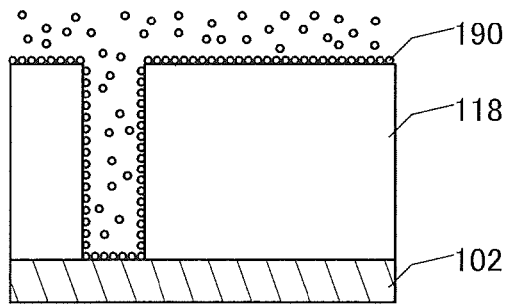
FIGS. 11A to 11G are diagrams illustrating an example of an ALD apparatus.
Figure 11B:
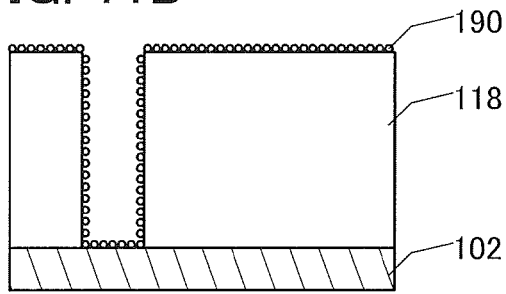
Figure 11C:
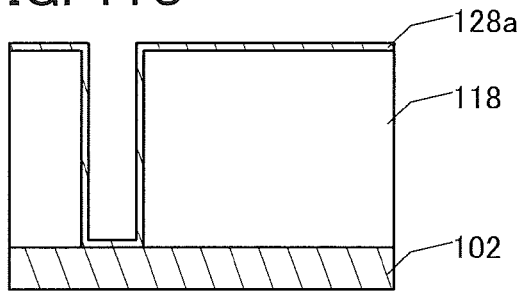
Figure 11D:
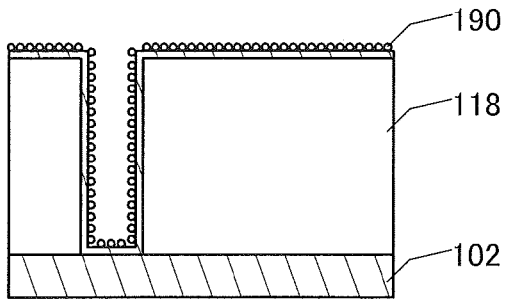

An oxidation gas is supplied into the ALD apparatus, whereby a metal oxide layer 128a is formed on the sample surface (see FIG. 11C).

Next, the supply of the oxidation gas is stopped, and an inert gas is supplied into the ALD apparatus for purging. Note that the oxidation gas may be exhausted using a vacuum pump without supplying an inert gas.

Next, a precursor is supplied into the ALD apparatus. The precursor reacts with and chemically adsorbs the hydroxyl on the surface of the metal oxide layer 128a, whereby a precursor layer 190 is formed. The chemical adsorption is completed when the sample surface is covered by the precursor layer 190 (see FIG. 11D).

Then, the supply of the precursor is stopped. An inert gas is supplied into the ALD apparatus for purging. Note that the precursor may be exhausted using a vacuum pump without supplying an inert gas.

Figure 11E:
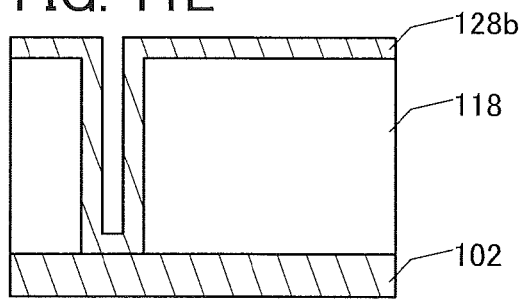
Figure 11F:
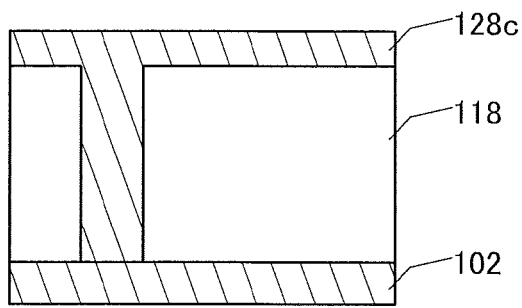
Figure 11G:
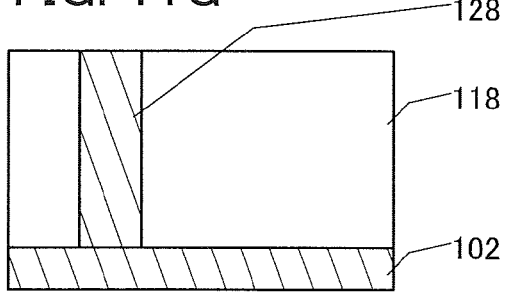

Next, an oxidation gas is supplied into the ALD apparatus, whereby a metal oxide layer 128b whose thickness is twice the metal oxide layer 128a is formed (see FIG. 11E). In this manner, the precursor layer 190 reacts with an oxidation gas repeatedly, whereby a metal oxide layer 128c with which an opening in the insulator 118 is filled can be formed (see FIG. 11F).

Next, the metal oxide layer 128c is removed from the top surface so that the insulator 118 can be exposed and the top surface of the metal oxide layer 128c and the top surface of the insulator 118 are level with each other. Thus, the insulator 128 can remain in the opening in the insulator 118 (see FIG. 11G). A CMP method or the like can be used for the process.

Note that the metal oxide layer 128c may be left to serve as the insulator 128 and the insulator 108.

Although the metal oxide layer is formed by reacting an oxidation gas and a precursor layer here, one embodiment of the present invention is not limited thereto. For example, a radical generated by converting an oxidation gas into plasma reacts with a precursor layer to form a metal oxide layer. In the case of generating a radical with plasma, not only an oxidation gas but also a nitriding gas or a reducing gas can be used, in which case a metal nitride layer or a metal layer can be formed. Therefore, a conductor to be the conductor 121 or the like, which is formed in the step shown in FIG. 10B, or part of the conductor can be formed by an ALD method.

<Transistor 1>

Figure 12A:
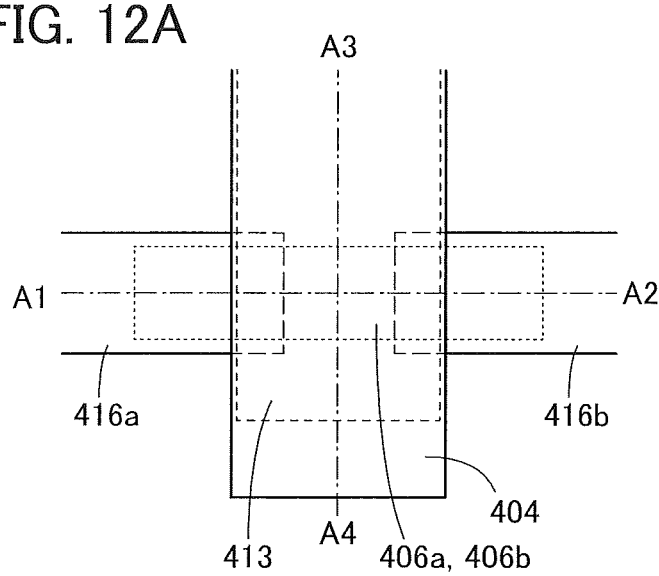
FIGS. 12A and 12B are a top view and a cross-sectional view illustrating a transistor according to one embodiment of the present invention.
Figure 12B:
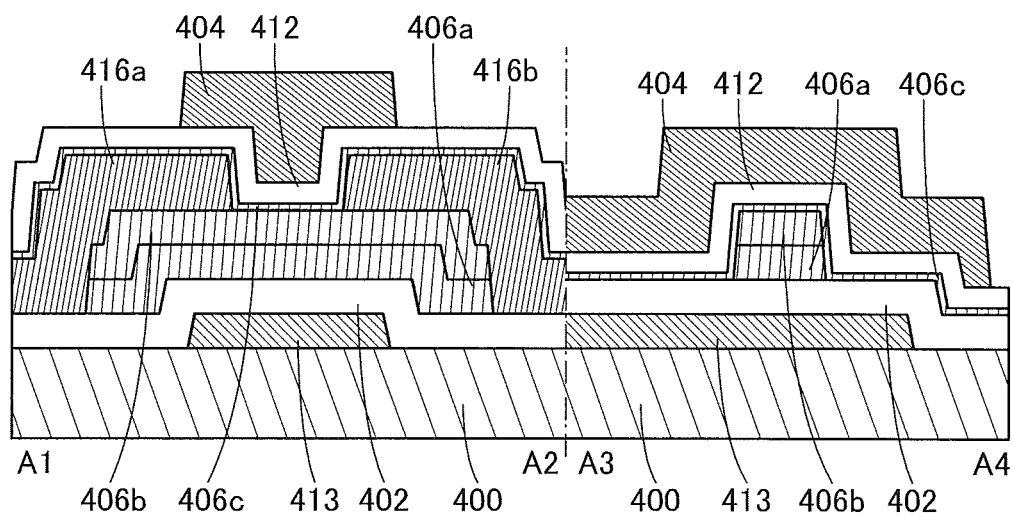

FIGS. 12A and 12B are a top view and a cross-sectional view of a transistor which can be used as an element of a device of one embodiment of the present invention. FIG. 12A is a top view and FIG. 12B is a cross-sectional view taken along dashed-dotted line A1-A2 and dashed-dotted line A3-A4 in FIG. 12A. Note that for simplification of the drawing, some components in the top view in FIG. 12A are not illustrated.

The transistor in FIGS. 12A and 12B includes a conductor 413 over an insulator 400, an insulator 402 over the insulator 400 and the conductor 413, a semiconductor 406a over the insulator 402, a semiconductor 406b over the semiconductor 406a, a conductor 416a and a conductor 416b which are in contact with a top surface and a side surface of the semiconductor 406b and which are distanced from each other, a semiconductor 406c over the semiconductor 406b, the conductor 416a, and the conductor 416b, an insulator 412 over the semiconductor 406c, and a conductor 404 over the insulator 412. The conductor 413 is, but not limited to, part of the transistor in FIGS. 12A and 12B. For example, the conductor 413 may be a component independent of the transistor.

The conductor 404 includes a region that faces the top surface and the side surface of the semiconductor 406b with the insulator 412 provided therebetween in the cross section taken along line A3-A4. The conductor 413 includes a region which faces a bottom surface of the semiconductor 406b with the insulator 402 provided therebetween.

The semiconductor 406b serves as a channel formation region of the transistor. The conductor 404 serves as a first gate electrode (also referred to as a front gate electrode) of the transistor. The conductor 413 serves as a second gate electrode (also referred to as a back gate electrode) of the transistor. The conductor 416a and the conductor 416b serve as a source electrode and a drain electrode of the transistor. The insulator 400 has a barrier property.

As illustrated in FIG. 12B, the semiconductor 406b can be electrically surrounded by an electric field of the conductor 404 and/or the conductor 413 (a structure in which a semiconductor is electrically surrounded by an electric field of a conductor is referred to as a surrounded channel (s-channel) structure). Therefore, a channel is formed in the entire semiconductor 406b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 406b. Therefore, as the semiconductor 406b has a larger thickness, the channel region becomes larger. In other words, the thicker the semiconductor 406b is, the larger the on-state current of the transistor is. In addition, when the semiconductor 406b is thicker, the proportion of the region with high carrier controllability increases, leading to a smaller subthreshold swing value. For example, the semiconductor 406b includes a region with a thickness greater than or equal to 20 nm, preferably greater than or equal to 40 nm, further preferably greater than or equal to 60 nm, still further preferably greater than or equal to 100 nm. In addition, to prevent a decrease in the productivity of the semiconductor device, the semiconductor 406b has a region with a thickness, for example, less than or equal to 300 nm, preferably less than or equal to 200 nm, further preferably less than or equal to 150 nm.

The s-channel structure is suitable for a miniaturized transistor because a high on-state current can be obtained. A semiconductor device including the miniaturized transistor can have a high integration degree and high density. For example, the transistor includes a region in which the channel length is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

The insulator 102 is referred to for the insulator 400.

The conductor 413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 preferably contains excess oxygen in the case where the semiconductor 406b is an oxide semiconductor.

Each of the conductor 416a and the conductor 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 412 preferably contains excess oxygen in the case where the semiconductor 406b is an oxide semiconductor.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

Figure 13A:
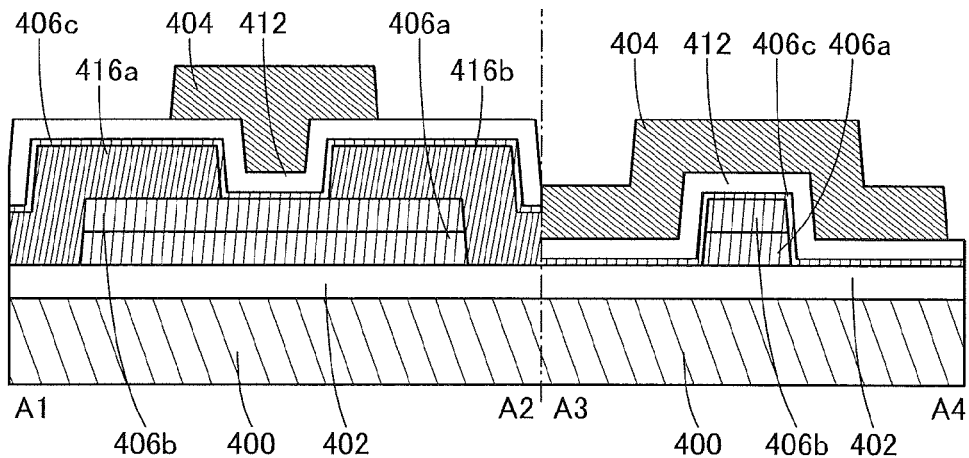
FIGS. 13A to 13C are cross-sectional views illustrating a transistor according to one embodiment of the present invention.
Figure 13B:
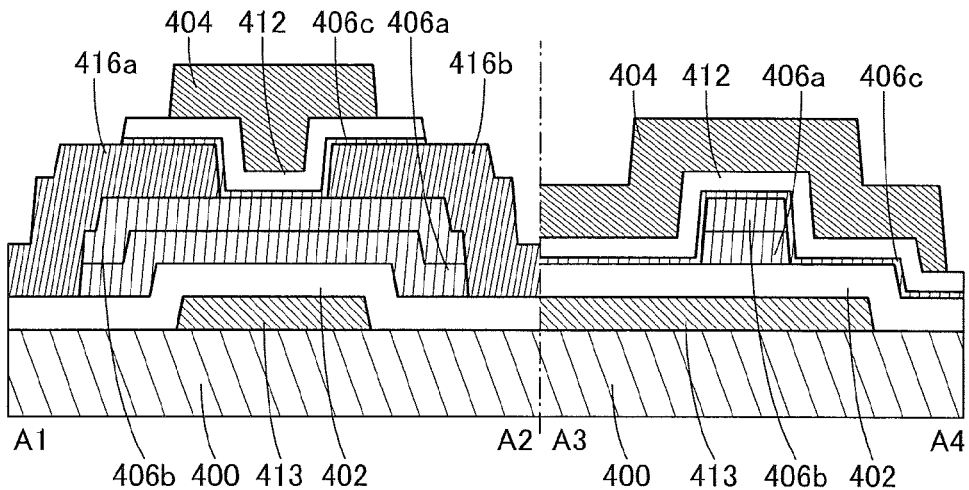
Figure 13C:
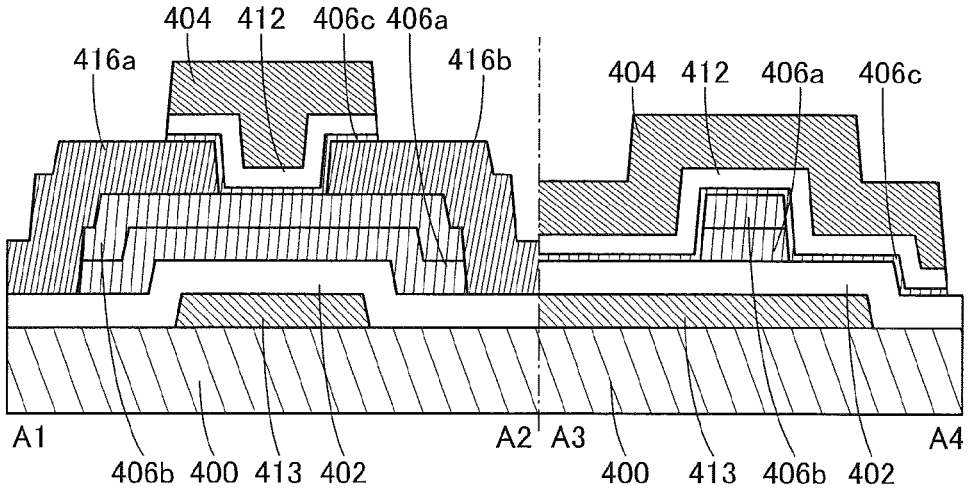
Figure 14A:
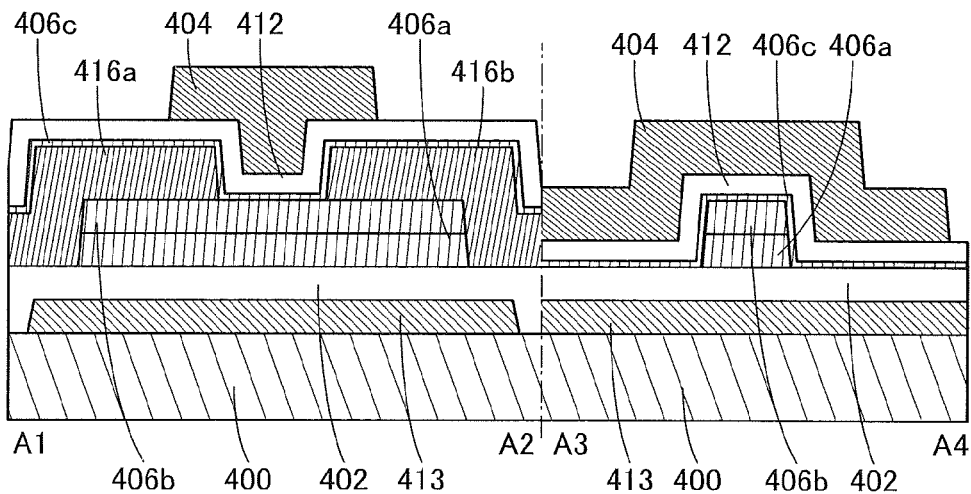
FIGS. 14A to 14C are cross-sectional views illustrating a transistor according to one embodiment of the present invention.
Figure 14B:
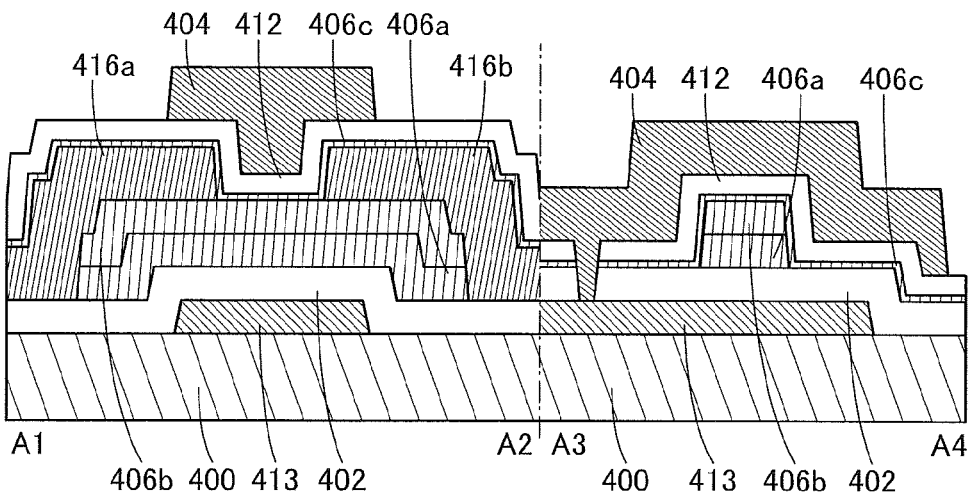
Figure 14C:
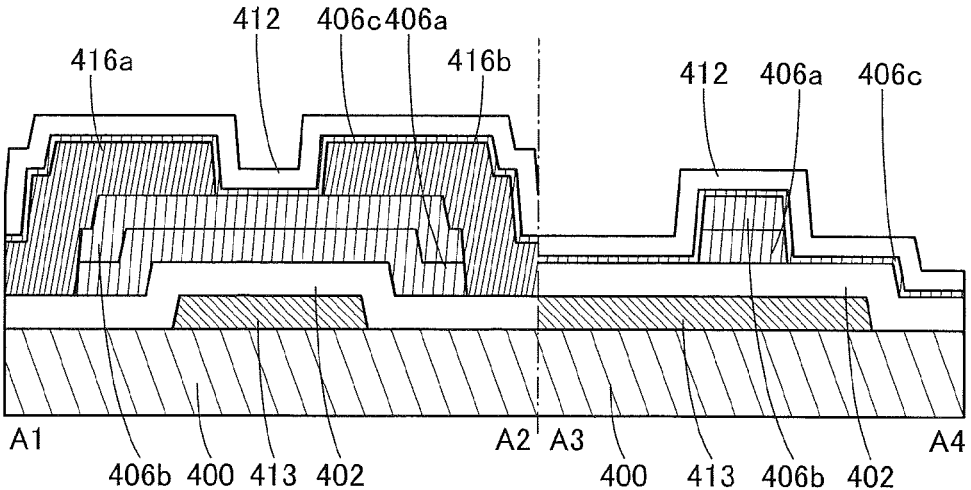

Note that the conductor 413 is not necessarily formed (see FIG. 13A). The insulator 412 and the semiconductor 406c may extend beyond the conductor 404 (see FIG. 13B). The insulator 412 and the semiconductor 406c do not necessarily extend beyond the conductor 404 (see FIG. 13C). In the A1-A2 cross section, the width of the conductor 413 may be larger than that of the semiconductor 406b (see FIG. 14A). The conductor 413 may be in contact with the conductor 404 through an opening (see FIG. 14B). The conductor 404 is not necessarily provided (see FIG. 14C).

<Semiconductor>

The semiconductor 406a, the semiconductor 406b, and the semiconductor 406c will be described.

By placing the semiconductor 406a over the semiconductor 406b and placing the semiconductor 406c under the semiconductor 406b, electrical characteristics of the transistor can be increased in some cases.

The semiconductor 406b is an oxide semiconductor containing indium, for example. The oxide semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily crystallized, in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406b. Since the semiconductor 406a and the semiconductor 406c each include one or more elements, or two or more elements other than oxygen included in the semiconductor 406b, a defect state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406b, and the semiconductor 406c are not necessarily simple ratios of integers.

As the semiconductor 406b, an oxide having an electron affinity higher than those of the semiconductor 406a and the semiconductor 406c is used. For example, as the semiconductor 406b, an oxide having an electron affinity higher than those of the semiconductor 406a and the semiconductor 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 406b having the highest electron affinity in the semiconductor 406a, the semiconductor 406b, and the semiconductor 406c.

Figure 15:
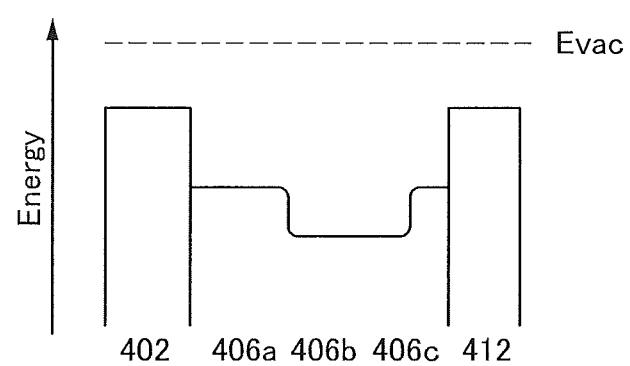
FIG. 15 is a band diagram of a region including an oxide semiconductor according to one embodiment of the present invention.

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of defect states. For that reason, the stack including the semiconductor 406a, the semiconductor 406b, and the semiconductor 406c has a band structure where energy is changed continuously at each interface and in the vicinity of the interface (continuous junction) (see FIG. 15). Note that boundaries of the semiconductor 406a, the semiconductor 406b, and the semiconductor 406c are not clear in some cases.

At this time, electrons move mainly in the semiconductor 406b, not in the semiconductor 406a and the semiconductor 406c. As described above, when the density of defect states at the interface between the semiconductor 406a and the semiconductor 406b and the density of defect states at the interface between the semiconductor 406b and the semiconductor 406c are decreased, electron movement in the semiconductor 406b is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of a top surface or a bottom surface (a formation surface; here, the semiconductor 406a) of the semiconductor 406b is less than 1 nm, preferably less than 0.6 nm, further preferably less than 0.5 nm, still further preferably less than 0.4 nm. The average surface roughness (also referred to as Ra) with the measurement area of 1×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the semiconductor 406c is preferably as small as possible to increase the on-state current of the transistor. For example, the semiconductor 406c is formed to include a region having a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. For example, the semiconductor 406c is formed to include a region having a thickness of greater than or equal to 0.3 nm, preferably greater than or equal to 1 nm, further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406c.

The semiconductor 406b includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the hydrogen concentration in the semiconductor 406a and the semiconductor 406c in order to reduce the hydrogen concentration in the semiconductor 406b. The semiconductor 406a and the semiconductor 406c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. Furthermore, the semiconductor 406b includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$. It is preferable to reduce the nitrogen concentration in the semiconductor 406a and the semiconductor 406c in order to reduce the nitrogen concentration in the semiconductor 406b. The semiconductor 406a and the semiconductor 406c includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406b, and the semiconductor 406c is provided under or over the semiconductor 406a or under or over the semiconductor 406c may be employed. An n-layer structure (n is an integer of 5 or more) in which one or more of the semiconductors described as examples of the semiconductor 406a, the semiconductor 406b, and the semiconductor 406c is provided at two or more of the following positions: over the semiconductor 406a, under the semiconductor 406a, over the semiconductor 406c, and under the semiconductor 406c.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 39A:
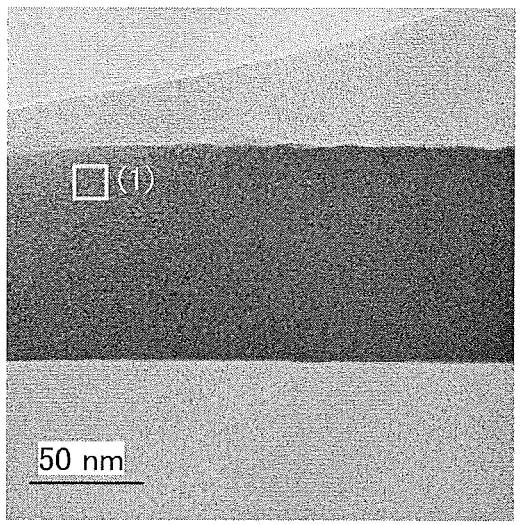
FIGS. 39A to 39D are Cs-corrected high-resolution TEM images of a cross section of a CAAC-OS and a cross-sectional schematic view of the CAAC-OS.

A CAAC-OS observed with TEM is described below. FIG. 39A shows a high-resolution IBM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 39B:
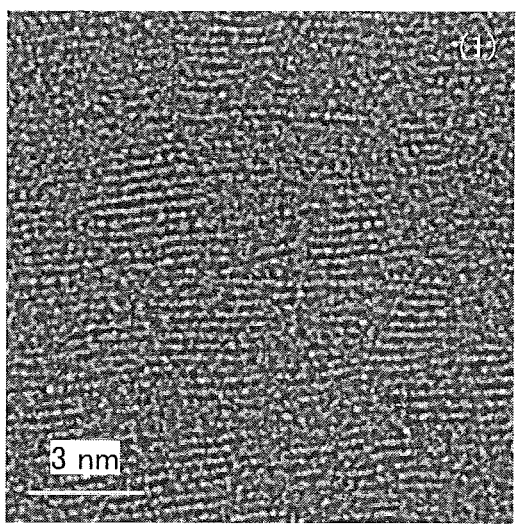

FIG. 39B is an enlarged Cs-corrected high-resolution TEM image of a region (1) in FIG. 39A. FIG. 39B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 39C:
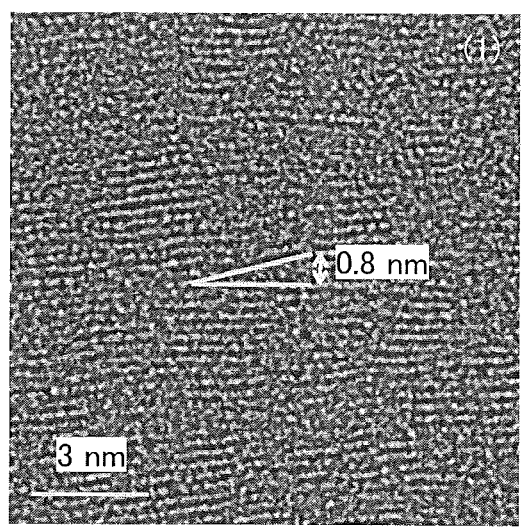

As shown in FIG. 39B, the CAAC-OS has a characteristic atomic arrangement. The characteristic atomic arrangement is denoted by an auxiliary line in FIG. 39C. FIGS. 39B and 39C prove that the size of a pellet is approximately 1 nm to 3 nm, and the size of a space caused by tilt of the pellets is approximately 0.8 nm. Therefore, the pellet can also be referred to as a nanocrystal (nc). Note that a CAAC-OS can be referred to as an oxide semiconductor including c-axis aligned nanocrystals (CANC).

Figure 39D:
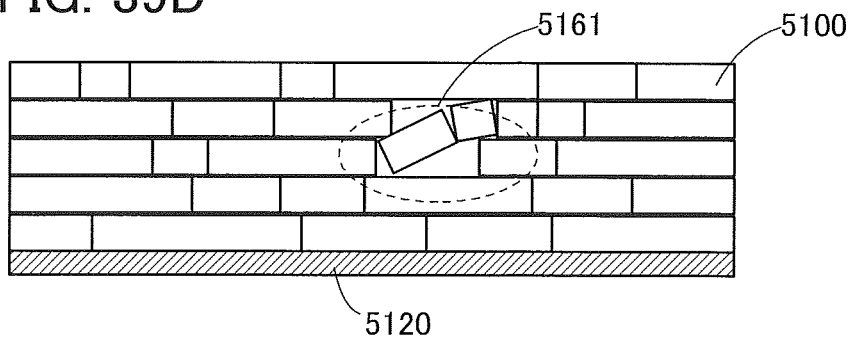

Here, according to the Cs-corrected high-resolution TEM images, the schematic arrangement of pellets 5100 of a CAAC-OS over a substrate 5120 is illustrated by such a structure in which bricks or blocks are stacked (see FIG. 39D). The part in which the pellets are tilted as observed in FIG. 39C corresponds to a region 5161 shown in FIG. 39D.

Figure 40A:
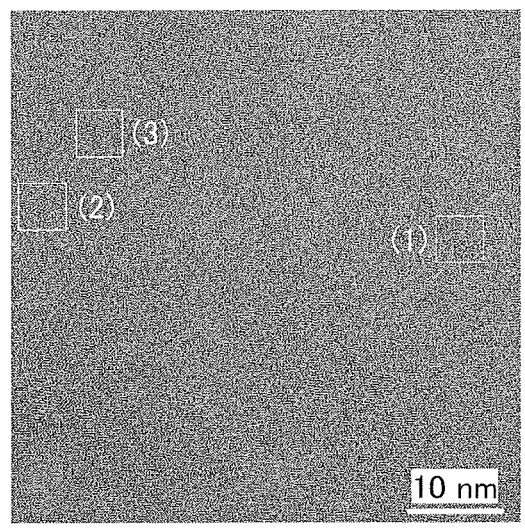
FIGS. 40A to 40D are Cs-corrected high-resolution TEM images of a plane of a CAAC-OS.
Figure 40B:
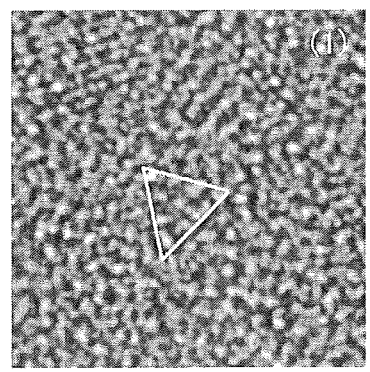
Figure 40C:
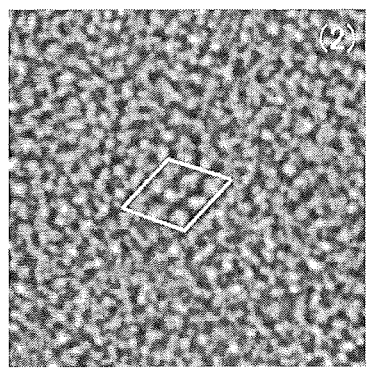
Figure 40D:
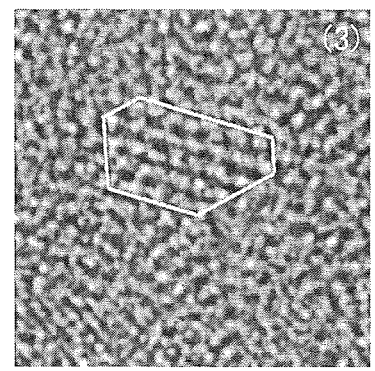

FIG. 40A shows a Cs-corrected high-resolution TEM image of a plane of the CAAC-OS observed from a direction substantially perpendicular to the sample surface. FIGS. 40B, 40C, and 40D are enlarged Cs-corrected high-resolution TEM images of a region (1), a region (2), and a region (3) FIG. 40A, respectively. FIGS. 40B, 40C, and 40D indicate that metal atoms are arranged in a triangular, quadrangular, or hexagonal configuration in a pellet. However, there is no regularity of arrangement of metal atoms between different pellets.

Figure 41A:
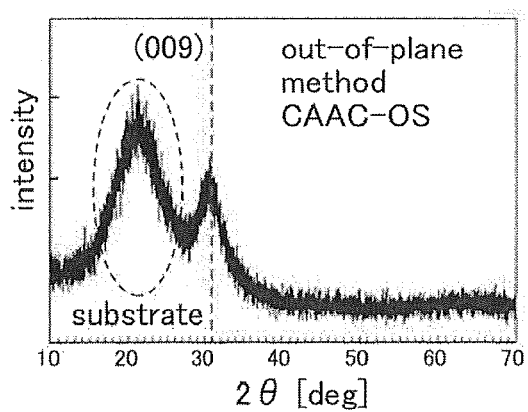
FIGS. 41A to 41C are diagrams showing structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 41A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 41B:
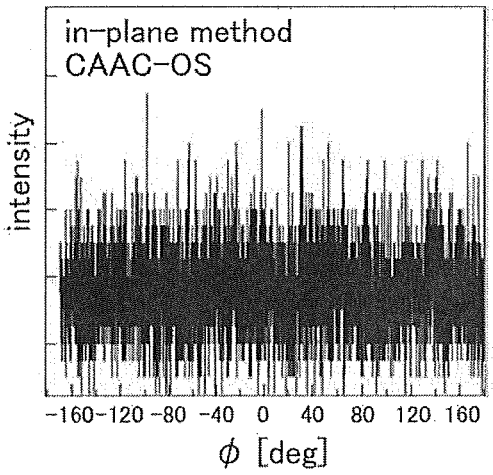
Figure 41C:
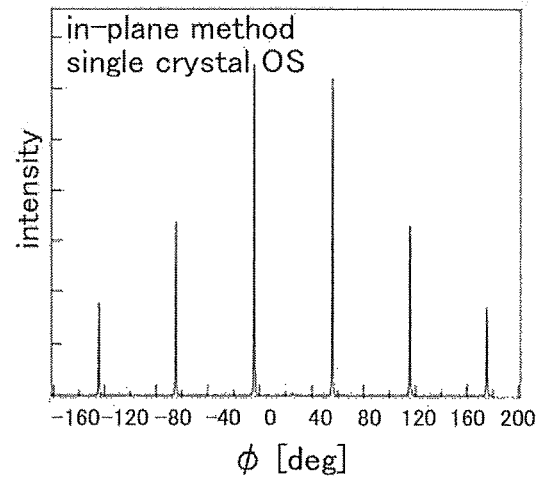

On the other hand, in structural analysis of the CAAC-OS by an in-plane method in which an X-ray is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 41B, a peak is not clearly observed. In contrast, in the case of a single crystal oxide semiconductor of $InGaZnO_4$, when $\phi$ scan is performed with $2\theta$ fixed at around 56°, as shown in FIG. 41C, six peaks which are derived from crystal planes equivalent to the (110) plane are observed. Accordingly, the structural analysis using XRD shows that the directions of a-axes and b-axes are irregularly oriented in the CAAC-OS.

Figure 42A:
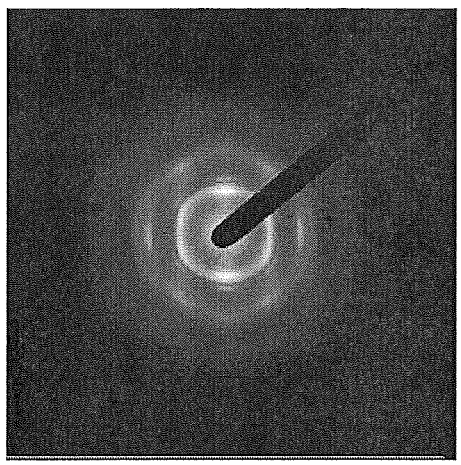
FIGS. 42A and 42B are diagrams showing electron diffraction patterns of a CAAC-OS.
Figure 42B:
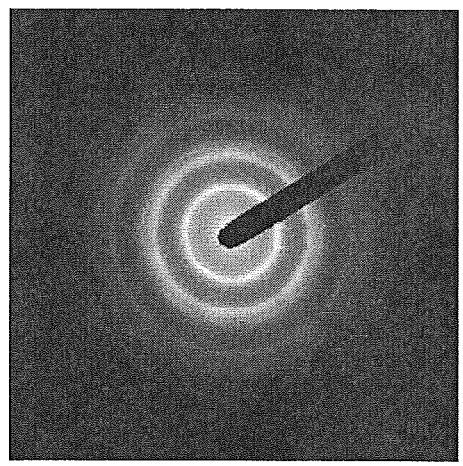

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 42A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 42B shows a diffraction pattern obtained in such a manner that an electron beam with a probe diameter of 300 nm is incident on the same sample in a direction perpendicular to the sample surface. As shown in FIG. 42B, a ring-like diffraction pattern is observed. Thus, the electron diffraction also indicates that the a-axes and b-axes of the pellets included in the CAAC-OS do not have regular alignment. The first ring in FIG. 42B is considered to be derived from the (010) plane, the (100) plane, and the like of the $InGaZnO_4$ crystal. The second ring in FIG. 42B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density; specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region where a crystal part is observed and a region where a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a pellet of the nc-OS may be referred to as a pellet in the following description.

In the nc-OS, a microscopic region (for example, a region with a size of greater than or equal to 1 nm and less than or equal to 10 nm, in particular, a region with a size of greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the diameter of a pellet, a peak that shows a crystal plane does not appear. Furthermore, a halo pattern is shown in an electron diffraction pattern of the nc-OS obtained by using an electron beam having a probe diameter larger than the diameter of a pellet (e.g., larger than or equal to 50 nm). Meanwhile, spots are shown in a nanobeam electron diffraction pattern of the nc-OS obtained by using an electron beam having a probe diameter close to, or smaller than the diameter of a pellet. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. However, there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that the a-like OS has an unstable structure as compared with a CAAC-OS and an nc-OS, change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The spacing between these adjacent layers is equivalent to the lattice spacing on the (009) plane (also referred to as d value). The value is calculated to 0.29 nm from crystal structure analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 43:
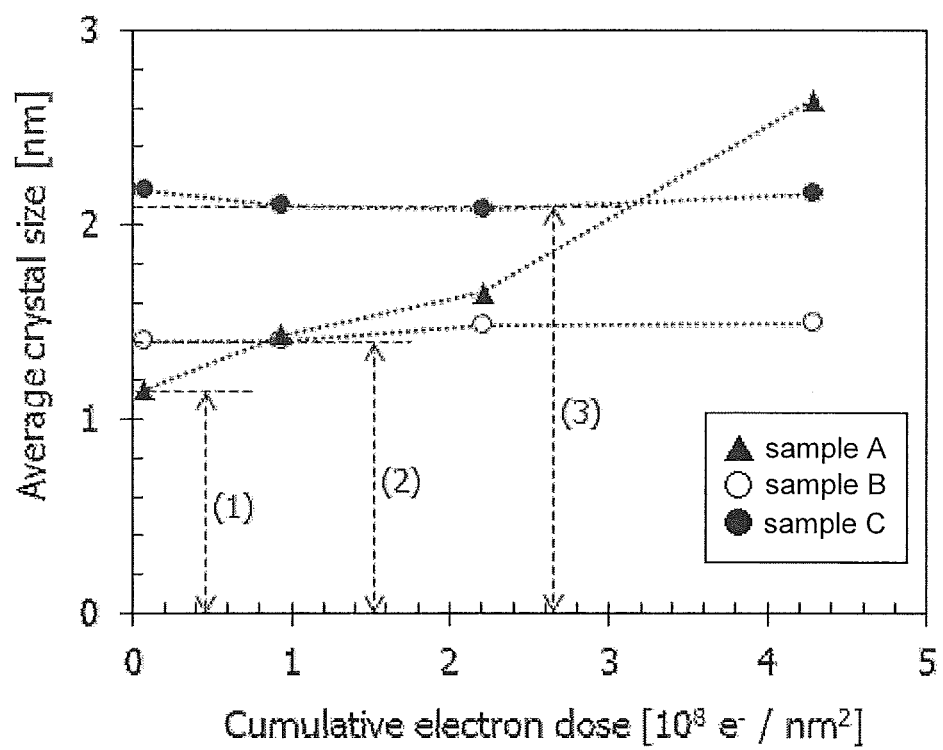
FIG. 43 is a diagram showing a change in crystal part of an In—Ga—Zn oxide induced by electron irradiation.

FIG. 43 shows change in the average size of crystal parts (at 22 points to 45 points) in each sample. Note that the crystal part size corresponds to the length of a lattice fringe. FIG. 43 indicates that the crystal part size in the a-like OS increases with an increase in the cumulative electron dose. Specifically, as shown by (1) in FIG. 43, a crystal part of approximately 1.2 nm (also referred to as an initial nucleus) at the start of TEM observation grows to a size of approximately 2.6 nm at a cumulative electron dose of 4.2×

$10^8$ e⁻/nm². In contrast, the crystal part size in the nc-OS and the CAAC-OS shows little change from the start of electron irradiation to a cumulative electron dose of $4.2\times10^8$ e⁻/nm². Specifically, as shown by (2) and (3) in FIG. 43, the average crystal sizes in the nc-OS and the CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that a single crystal oxide semiconductor with the same composition does not exist in some cases. In that case, single crystal oxide semiconductors with different compositions are combined at an adequate ratio, which makes it possible to calculate density equivalent to that of a single crystal oxide semiconductor with a desired composition. The density of a single crystal oxide semiconductor with a desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

An example of a method for forming a CAAC-OS film will be described below.

Figure 44A:
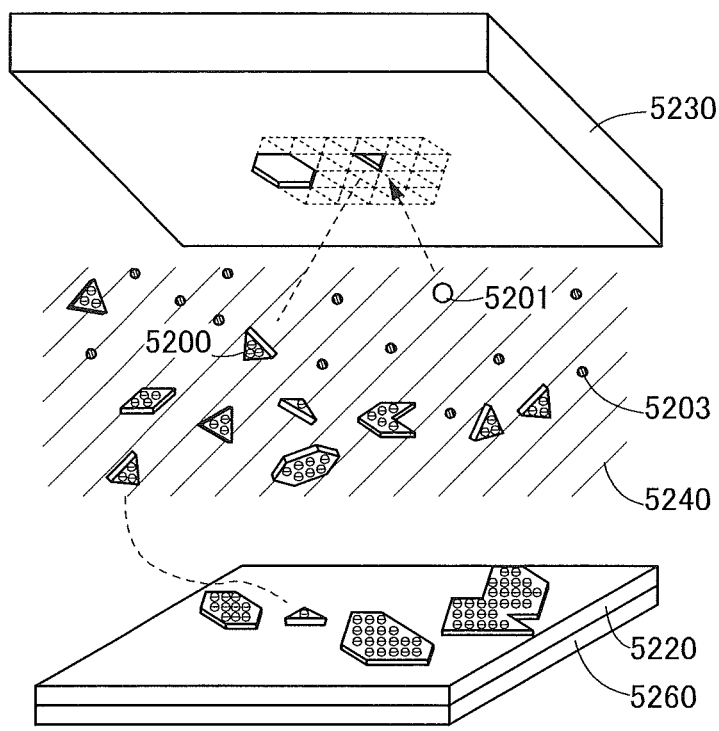
FIGS. 44A to 44D are diagrams illustrating a deposition mechanism of a CAAC-OS.

FIG. 44A is a schematic view of the inside of a film formation chamber. The CAAC-OS film can be formed by a sputtering method.

As shown in FIG. 44A, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets is arranged to face the target 5230 with the backing plate positioned therebetween. A sputtering method in which the disposition speed is increased by utilizing a magnetic field of the magnets is referred to as a magnetron sputtering method.

The distance d between the substrate 5220 and the target 5230 (also referred to as a target-substrate distance (T-S distance)) is greater than or equal to 0.01 m and less than or equal to 1 in, preferably greater than or equal to 0.02 m and less than or equal to 0.5 m. The film formation chamber is mostly filled with a deposition gas (e.g., an oxygen gas, an argon gas, or a mixed gas containing oxygen at 5 vol % or higher) and the pressure in the film formation chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation (O⁺) and an argon cation (Ar⁺).

Figure 45:
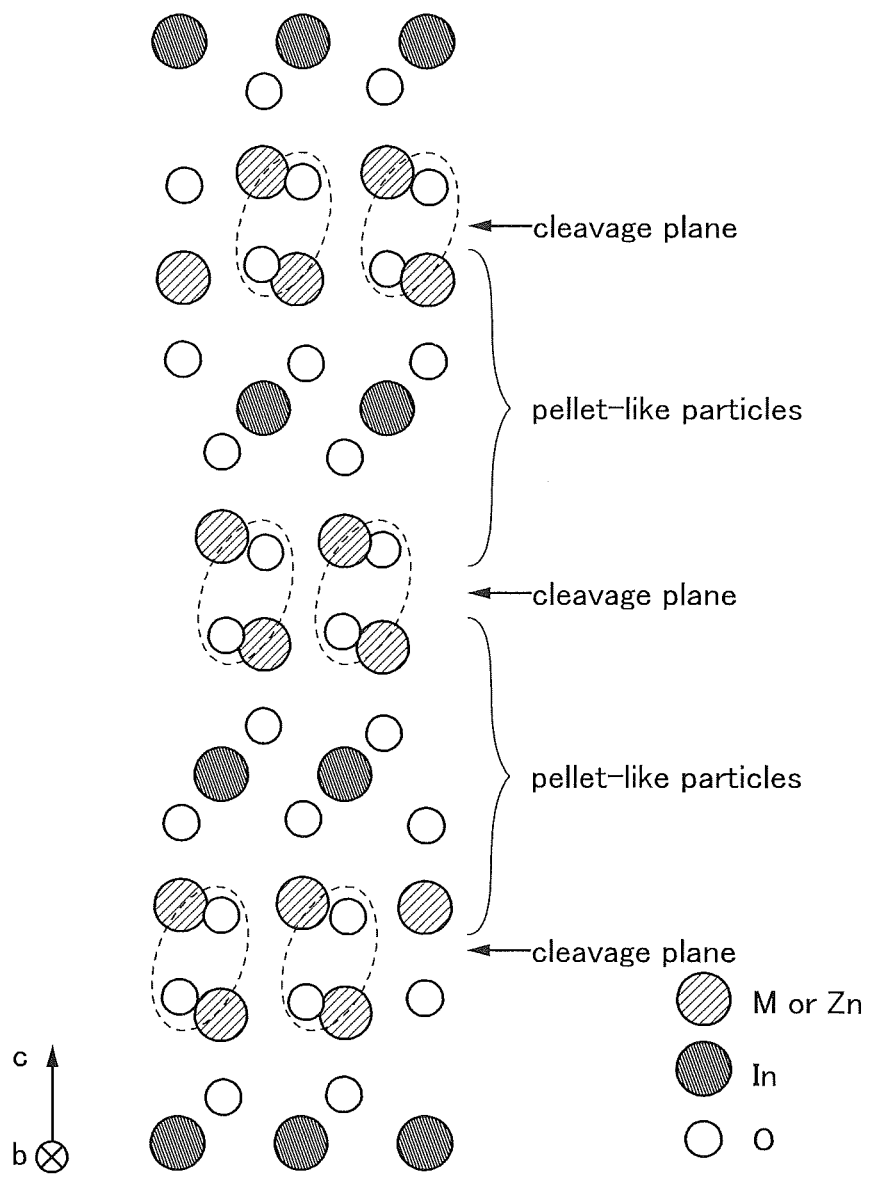
FIG. 45 is a diagram illustrating a crystal structure of $InMZnO_4$.

Here, the target 5230 has a polycrystalline structure which includes a plurality of crystal grains and in which a cleavage plane exists in any of the crystal grains. As an example, a crystal structure of InMZnO$_4$ (the element M is aluminum, gallium, yttrium, or tin, for example) included in the target 5230 is illustrated in FIG. 45. Note that FIG. 45 illustrates the crystal structure of InMZnO$_4$ observed from a direction parallel to a b-axis. In the crystal of InMZnO$_4$, oxygen atoms are negatively charged, whereby repulsive force is generated between the two adjacent M-Zn—O layers. Thus, the InMZnO$_4$ crystal has a cleavage plane between the two adjacent M-Zn—O layers.

Figure 44B:
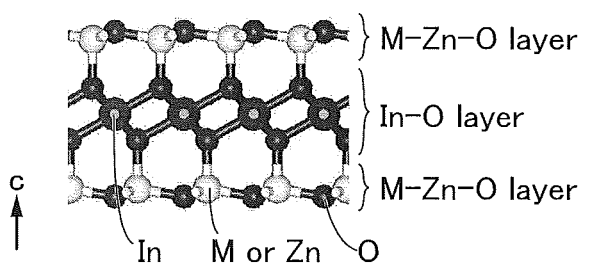
Figure 44C:
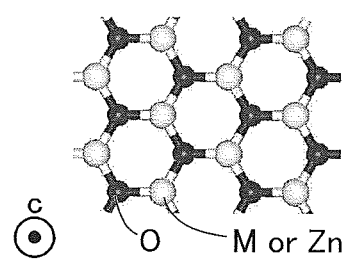

The ion 5201 generated in the high-density plasma region is accelerated toward the target 5230 side by an electric field, and then collides with the target 5230. At this time, a pellet 5200 which is a flat-plate-like or pellet-like sputtered particles is separated from the cleavage plane (FIG. 44A). The pellet 5200 is between the two cleavage planes shown in FIG. 45. Thus, when the pellet 5200 is observed, the cross-section thereof is as shown in FIG. 44B, and the top surface thereof is as shown in FIG. 44C. Note that the structure of the pellet 5200 may be distorted by an impact of collision of the ion 5201. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 3 nm, preferably greater than or equal to 1.2 nm and less than or equal to 2.5 nm. For example, the ion 5201 collides with the target 5230 including the In-M-Zn oxide. Then, the pellet 5200 including three layers of an M-Zn—O layer, an In—O layer, and an M-Zn—O layer is separated. Note that the particle 5203 is also sputtered from the target 5230 along with the separation of the pellet 5200. The particle 5203 has an atom or an aggregate of several atoms. Therefore, the particle 5203 can be referred to as an atomic particle.

The pellet 5200 may receive a charge when passing through the plasma 5240, so that surfaces thereof are negatively or positively charged. For example, the pellet 5200 receives a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that part of the particles 5203 is discharged to the outside by a vacuum pump or the like because the particle 5203 is small in mass.

Next, deposition of the pellet 5200 and the particle 5203 on the surface of the substrate 5220 is described with reference to FIGS. 46A to 46E.

Figure 46A:
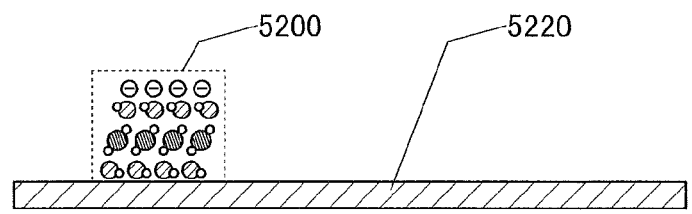
FIGS. 46A to 46E are diagrams illustrating a deposition mechanism of a CAAC-OS.

First, a first of the pellets 5200 is deposited over the substrate 5220. Since the pellet 5200 has a flat-plate-like shape, it is deposited so that the flat plane faces to the surface of the substrate 5220 (FIG. 46A). Here, a charge on a surface of the pellet 5200 on the substrate 5220 side is lost through the substrate 5220.

Figure 46B:
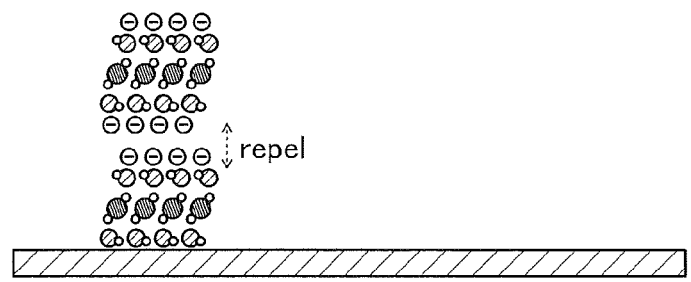

Next, a second of the pellets 5200 reaches the substrate 5220. Here, since another surface of the first of the pellets 5200 and surfaces of the second of the pellets 5200 are charged, they repel each other (FIG. 46B).

Figure 46C:
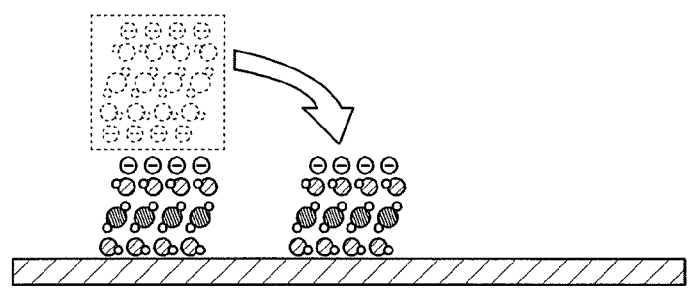

As a result, the second of the pellets 5200 avoids being deposited over the first of the pellets 5200, and is deposited over the surface of the substrate 5220 so as to be a little distance away from the first of the pellets 5200 (FIG. 46C). With repetition of this, millions of the pellets 5200 are deposited over the surface of the substrate 5220 to have a thickness of one layer. A region where any pellet 5200 is not deposited is generated between adjacent pellets 5200.

Figure 46D:
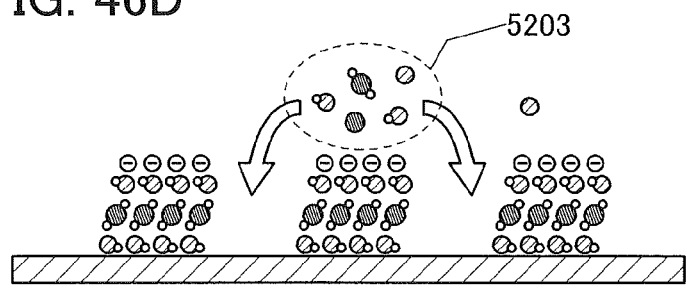

Next, the particle 5203 reaches the surface of the substrate 5220 (FIG. 46D).

The particle 5203 cannot be deposited over an active region such as the surface of the pellet 5200. Therefore, the particle 5203 is deposited so as to fill a region where the pellets 5200 are not deposited. The particles 5203 grow in the horizontal (lateral) direction between the pellets 5200, thereby connecting the pellets 5200. In this way, the particles 5203 are deposited until they fill regions where the pellets 5200 are not deposited. This mechanism is similar to a deposition mechanism of the ALD method.

Figure 46E:
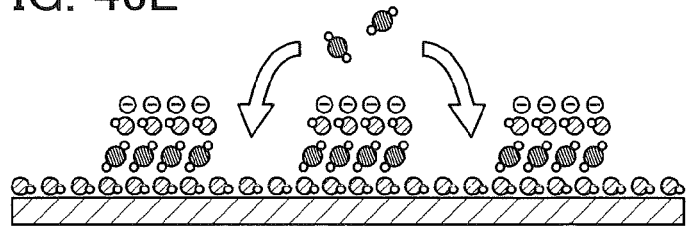

Note that there can be several mechanisms for the lateral growth of the particles 5203 between the pellets 5200. For example, as shown in FIG. 46E, the pellets 5200 can be connected from side surfaces of the first M-Zn—O layers. In this case, after the first M-Zn—O layers make connection, the In—O layers and the second M-Zn—O layers are connected in this order (the first mechanism).

Figure 47A:
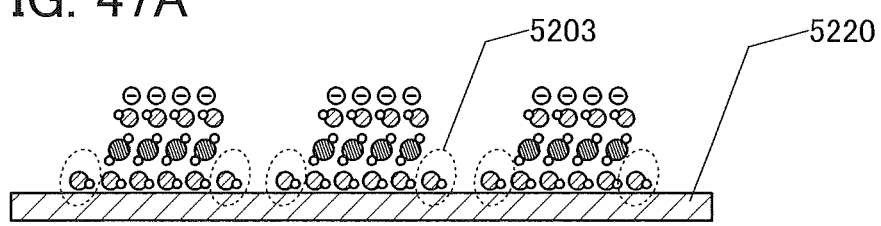
FIGS. 47A to 47C are diagrams illustrating a deposition mechanism of a CAAC-OS.
Figure 47B:
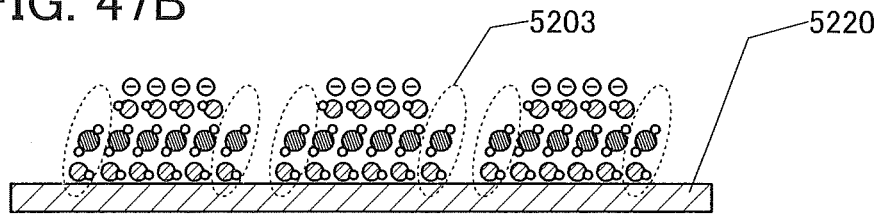
Figure 47C:
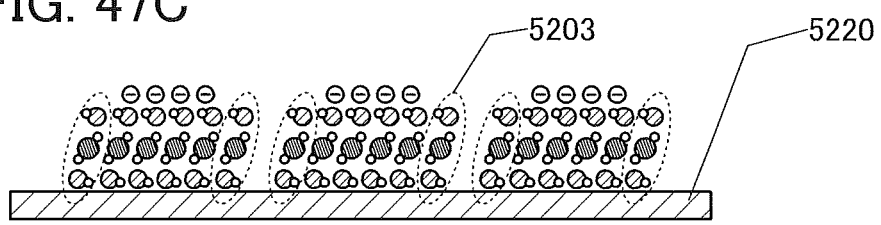

Alternatively, as shown in FIG. 47A, first, the particles 5203 are connected to the sides of the first M-Zn—O layers so that each side of the first M-Zn—O layer has one particle 5203. Then, as shown in FIG. 47B, the particle 5203 is connected to each side of the In—O layers. After that, as shown in FIG. 47C, the particle 5203 is connected to each side of the second M-Zn—O layers (the second mechanism). Note that the connection can also be made by the simultaneous occurrence of the deposition in FIGS. 47A, 47B, and 47C (the third mechanism).

As shown in the above, the above three mechanisms are considered as the mechanisms of the lateral growth of the particles 5203 between the pellets 5200. However, the particles 5203 may grow up laterally between the pellets 5200 by other mechanisms.

Therefore, even when the orientations of a plurality of pellets 5200 are different from each other, generation of crystal boundaries can be suppressed since the particles 5203 laterally grow to fill gaps between the plurality of pellets 5200. In addition, as the particles 5203 make smooth connection between the plurality of pellets 5200, a crystal structure different from a single crystal and a polycrystal is formed. In other words, a crystal structure including distortion between minute crystal regions (pellets 5200) is formed. The regions filling the gaps between the crystal regions are distorted crystal regions, and thus, it will be not appropriate to say that the regions have an amorphous structure.

Figure 44D:
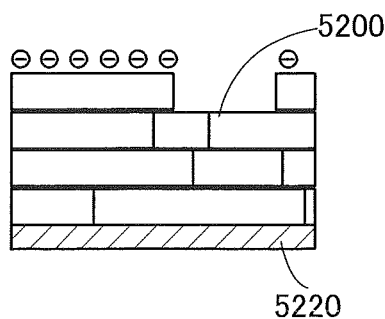

When the particles 5203 completely fill the regions between the pellets 5200, a first layer with a thickness almost the same as that of the pellet 5200 is formed. Then, a new first of the pellets 5200 is deposited over the first layer, and a second layer is formed. With repetition of this cycle, the stacked-layer thin film structure is formed (FIG. 44D).

A deposition way of the pellets 5200 changes depending on the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and lower than 500° C., preferably higher than or equal to 140° C. and lower than 450° C., or further preferably higher than or equal to 170° C. and lower than 400° C. Therefore, even when a large-sized substrate of the 8th generation or more is used as the substrate 5220, a warp or the like hardly occur.

Figure 48:
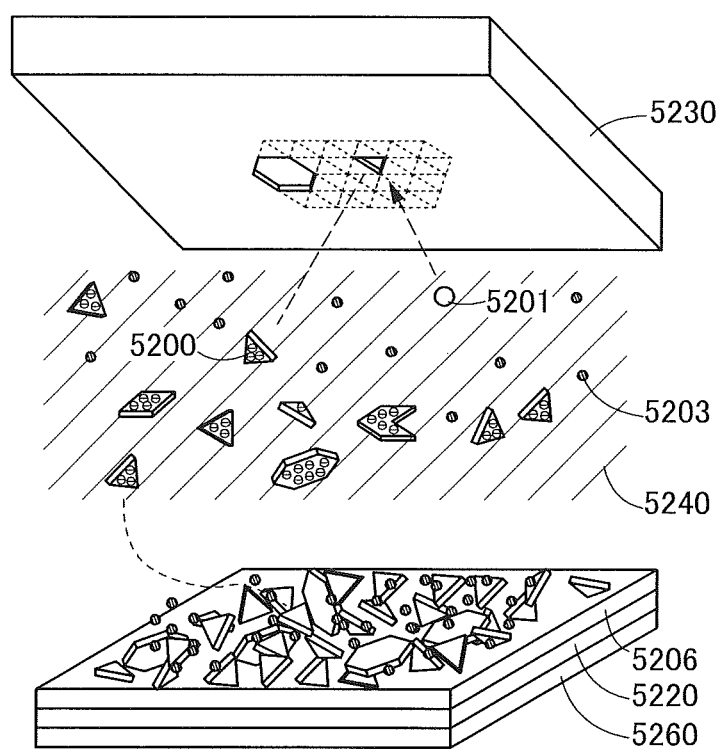
FIG. 48 is a diagram illustrating a deposition mechanism of a CAAC-OS.

On the other hand, if the surface temperature of the substrate 5220 is low, the migration of the pellets 5200 over the substrate 5220 does not easily occur. As a result, the pellets 5200 are stacked to form a nanocrystalline oxide semiconductor (nc-OS) or the like with low orientation (see FIG. 48). In the nc-OS, the pellets 5200 are possibly deposited with certain gaps since the pellets 5200 are negatively charged. Therefore, the nc-OS film has low orientation but some regularity, and thus it has a denser structure than an amorphous oxide semiconductor.

When spaces between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 5200 are considered to be deposited on the substrate 5220. A CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., such as amorphous silicon oxide), a CAAC-OS can be formed.

In addition, even when the surface of the substrate 5220 (formation surface) has an uneven shape, the pellets 5200 are aligned along the shape.

The composition of a CAAC-OS will be described below. For explanation of the composition, the case of an In-M-Zn oxide that is an oxide semiconductor to be a CAAC-OS is described as an example. The element M is aluminum, gallium, yttrium, tin, or the like. Other elements which can be used as the element M include boron, silicon, titanium, iron, nickel, germanium, zirconium, molybdenum, lanthanum, cerium, neodymium, hafnium, tantalum, and tungsten.

Figure 49:
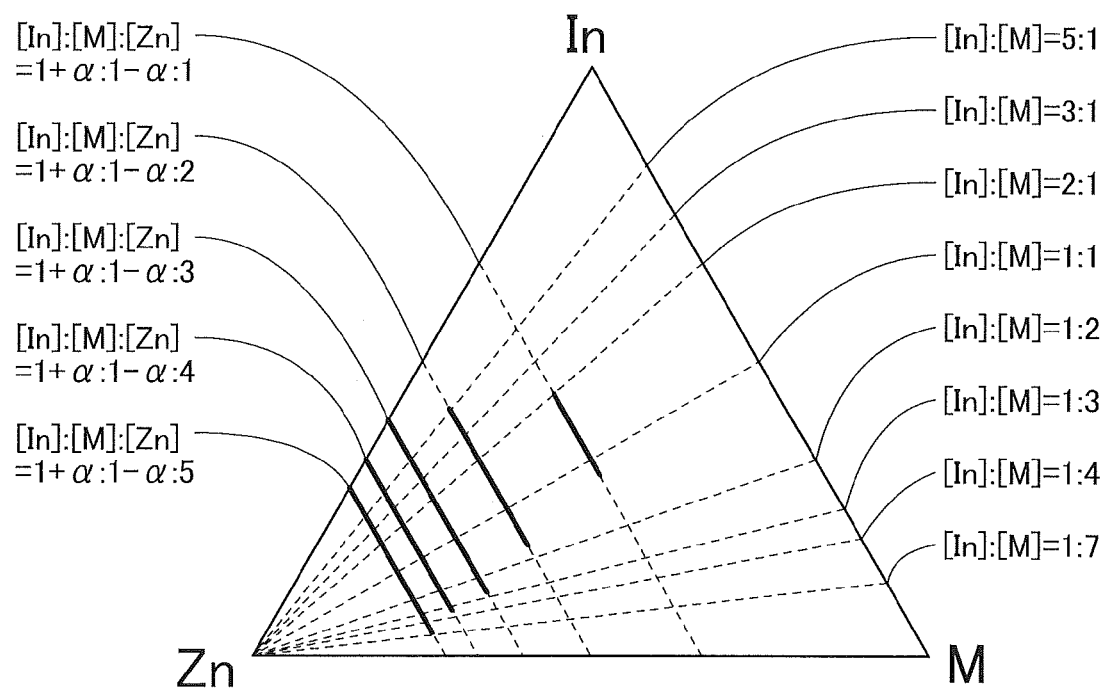
FIG. 49 is a triangular diagram for explaining composition of an In-M-Zn oxide.

FIG. 49 is a ternary diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of the dashed lines denoted as [In]:[M]:[Zn]=1+α:1−α:1, [In]:[M]:[Zn]=1+α:1−α:2, [In]:[M]:[Zn]=1+α:1−α:3, [In]:[M]:[Zn]=1+α:1−α:4, and [In]:[M]:[Zn]=1+α:1−α:5. Note that the bold line on the dashed line represents, for example, the composition that allows an oxide as a raw material mixed and subjected to baking at 1350° C. to be a solid solution.

Therefore, when an oxide has a composition close to the above composition that allows the oxide to be a solid solution, a CAAC-OS having a large region with a single crystal structure can be obtained. When an In-M-Zn oxide is deposited by a sputtering method, the composition of a target is different from the composition of a film in some cases. For example, in the case of using, as a target, an In-M-Zn oxide in which an atomic ratio is 1:1:1, 1:1:1.2, 3:1:2, 4:2:4.1, 1:3:2, 1:3:4, or 1:4:5, an atomic ratio of a film is 1:1:0.7 (approximately 0.5 to 0.9), 1:1:0.9 (approximately 0.8 to 1.1), 3:1:1.5 (approximately 1 to 1.8), 4:2:3 (approximately 2.6 to 3.6), 1:3:1.5 (approximately 1 to 1.8), 1:3:3 (approximately 2.5 to 3.5), or 1:4:4 (approximately 3.4 to 4.4). Thus, in order to obtain a film with a desired composition, a composition of a target may be selected in consideration of a change in the composition.

When a CAAC-OS is deposited, because of heating of a substrate surface (the surface on which the CAAC-OS is deposited), space heating, or the like, the composition of the film is sometimes different from that of a target as a source or the like. For example, since zinc oxide sublimates more easily than indium oxide, gallium oxide, or the like, the source and the film are likely to have different compositions. Thus, a source is preferably selected taking into account the change in composition. Note that a difference between the compositions of the source and the film is also affected by a pressure or a gas used for the deposition as well as a temperature.

<Transistor 2>

Figure 16A:
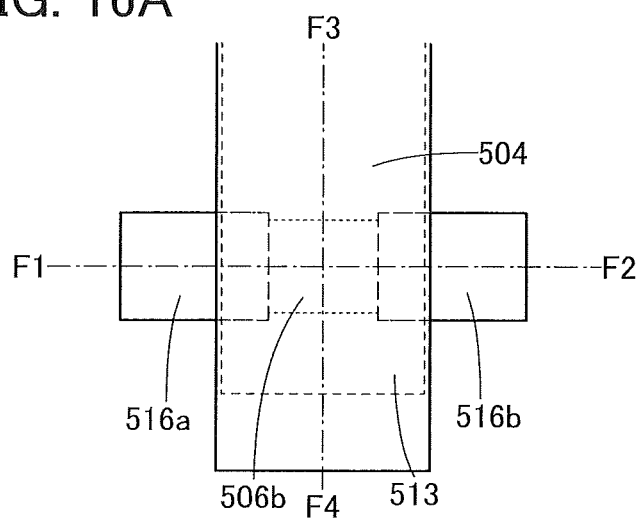
FIGS. 16A and 16B are a top view and a cross-sectional view illustrating a transistor according to one embodiment of the present invention.
Figure 16B:
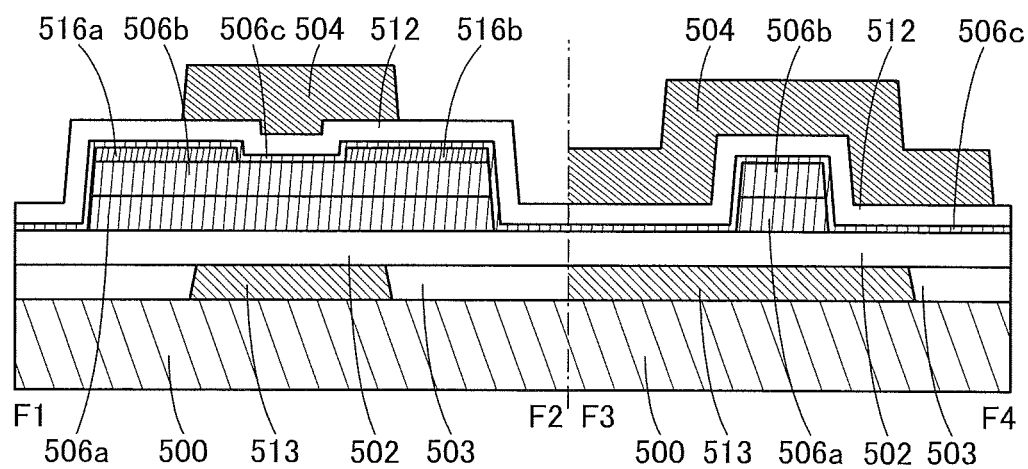

FIGS. 16A and 16B are a top view and a cross-sectional view of a transistor which can be used as an element of a device of one embodiment of the present invention. FIG. 16A is a top view and FIG. 16B is a cross-sectional view taken along dashed-dotted line F1-F2 and dashed-dotted line F3-F4 in FIG. 16A. Note that for simplification of the drawing, some components in the top view in FIG. 16A are not illustrated.

The transistor shown in FIGS. 16A and 16B includes a conductor 513 over an insulator 500, an insulator 503 which is over the insulator 500 and is level with the conductor 513, an insulator 502 over the conductor 513 and the insulator 503, a semiconductor 506a over the insulator 502, a semiconductor 506b over the semiconductor 506a, a conductor 516a and a conductor 516b which are separated from each other and which are in contact with the top surface of the semiconductor 506b, a semiconductor 506c over the insulator 502, the semiconductor 506b, the conductor 516a, and the conductor 516b, an insulator 512 over the semiconductor 506c, and a conductor 504 over the insulator 512. Although the conductor 513 is part of the transistor in this non-limiting example, the conductor 513 may be a component independent of the transistor, for example.

The insulator 400 is referred to for the insulator 500. The conductor 413 is referred to for the conductor 513. The insulator 402 is referred to for the insulator 502. The semiconductor 406a is referred to for the semiconductor 506a. The semiconductor 406b is referred to for the semiconductor 506b. The conductor 416a is referred to for the conductor 516a. The conductor 416b is referred to for the conductor 516b. The semiconductor 406c is referred to for the semiconductor 506c. The insulator 412 is referred to for the insulator 512. The conductor 404 is referred to for the conductor 504.

The insulator 503 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 503 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

As illustrated in FIG. 16B, the transistor has an s-channel structure. The electric field from the conductor 504 and the conductor 513 is less likely to be inhibited by the conductor 516a, the conductor 516b, and the like at the side surface of the semiconductor 506b.

Figure 17A:
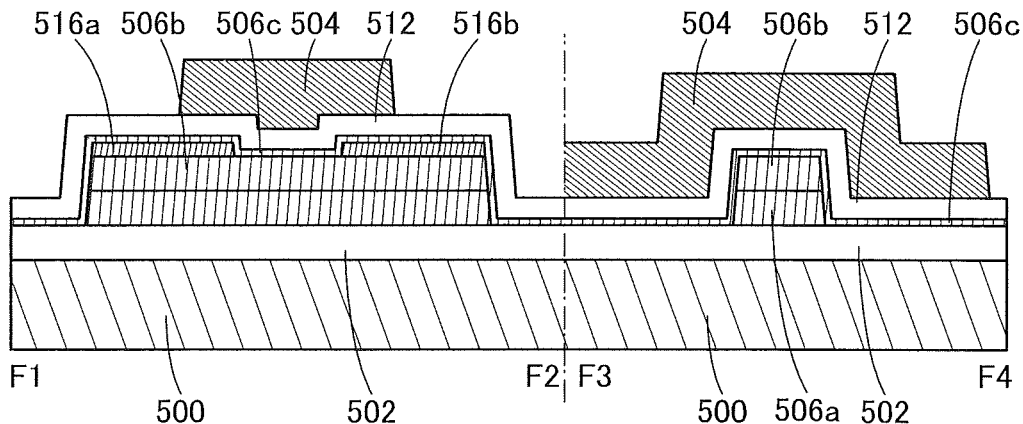
FIGS. 17A to 17C are cross-sectional views illustrating a transistor according to one embodiment of the present invention.
Figure 17B:
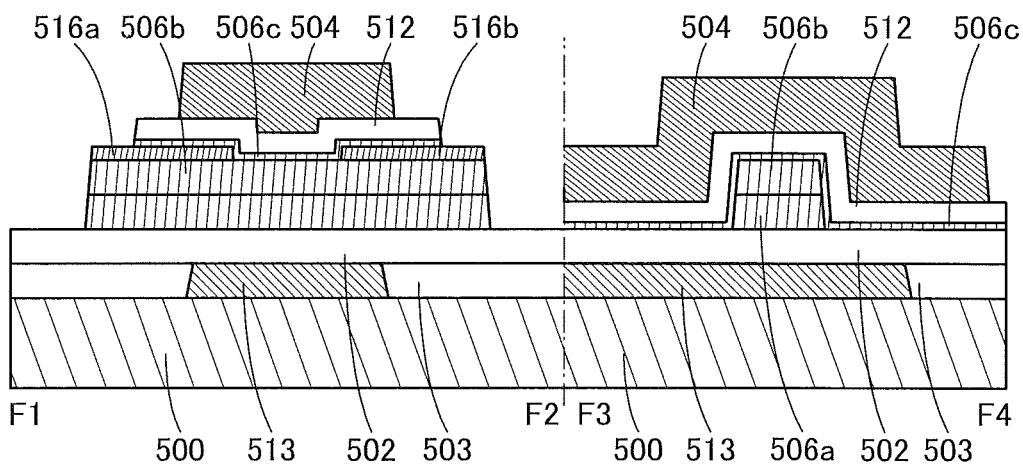
Figure 17C:
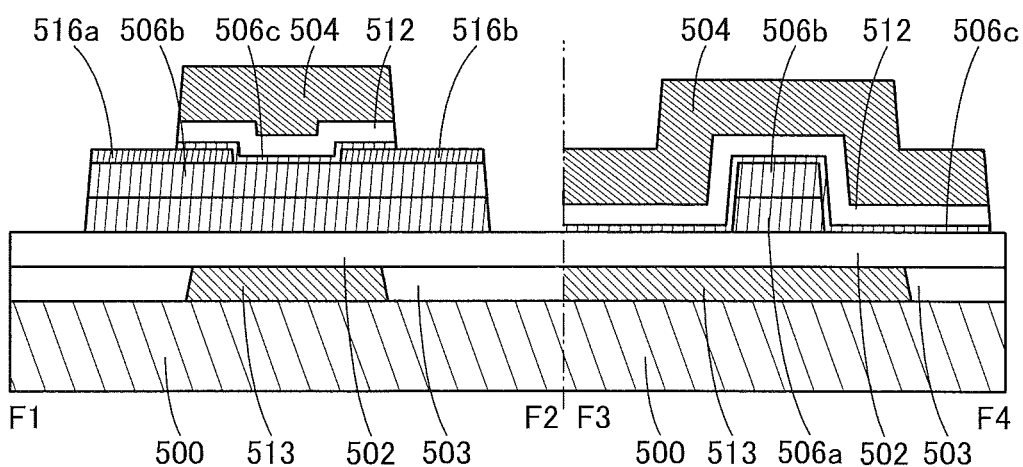
Figure 18A:
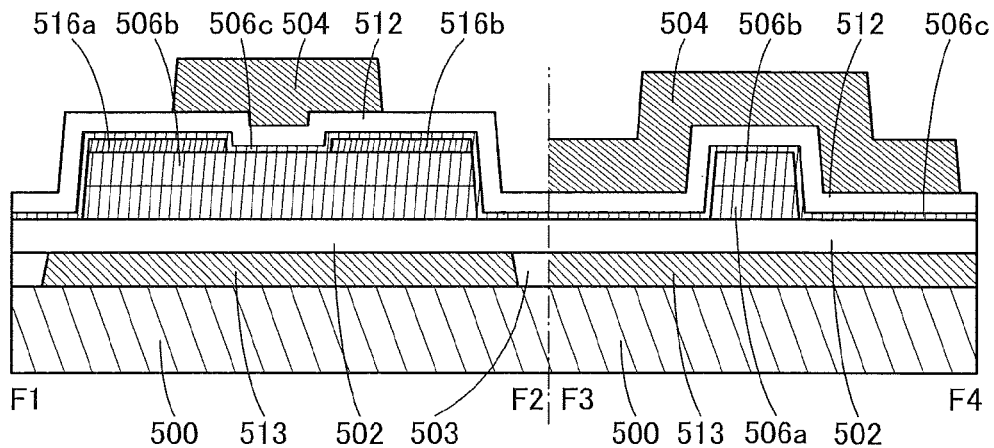
FIGS. 18A to 18C are cross-sectional views of a transistor according to one embodiment of the present invention.
Figure 18B:
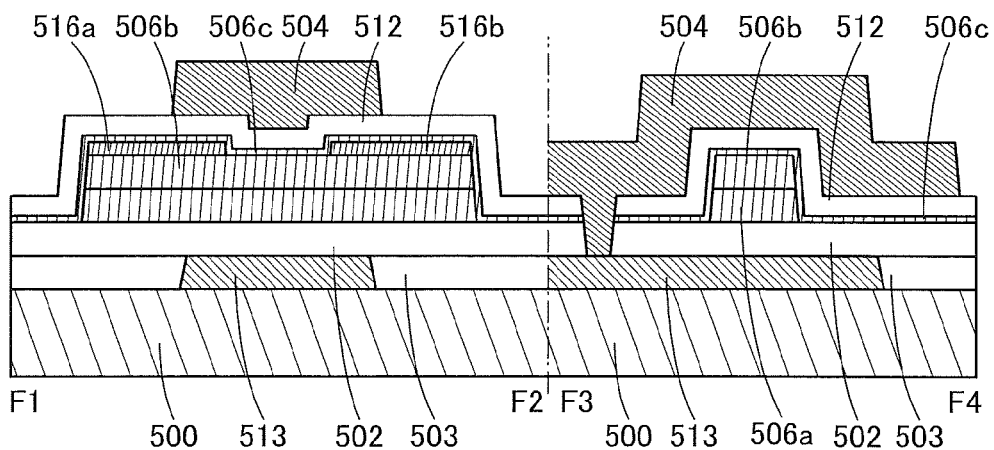
Figure 18C:
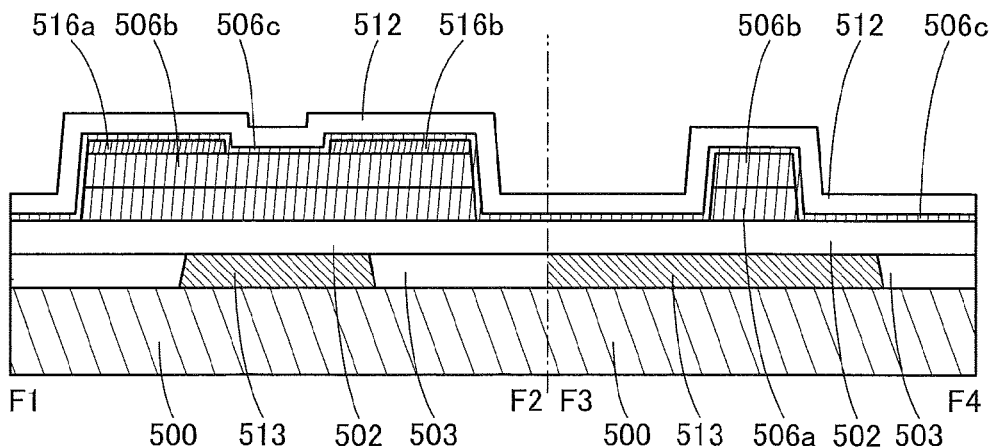

Note that the conductor 513 is not necessarily formed (see FIG. 17A). The insulator 512 and the semiconductor 506c may extend beyond the conductor 504 (see FIG. 17B). The insulator 512 and the semiconductor 506c do not necessarily extend beyond the conductor 504 (see FIG. 17C). In the F1-F2 cross section, the width of the conductor 513 may be larger than that of the semiconductor 506b (see FIG. 18A). The conductor 513 and the conductor 504 may be in contact with each other through an opening (see FIG. 18B). The conductor 504 is not necessarily provided (see FIG. 18C).

<Circuit>

An example of a circuit of a semiconductor device including a transistor or the like of one embodiment of the present invention is described below.

<CMOS Inverter>

Figure 19A:
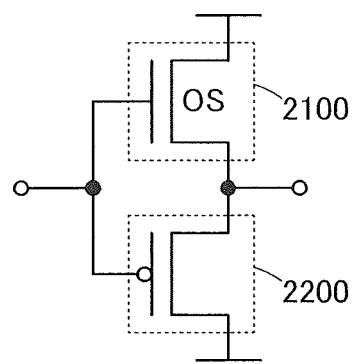
FIGS. 19A and 19B are circuit diagrams illustrating a semiconductor device according to one embodiment of the present invention.

A circuit diagram in FIG. 19A shows a configuration of a so-called CMOS inverter in which a p-channel transistor 2200 and an n-channel transistor 2100 are connected to each other in series and in which gates of them are connected to each other.

<Structure of Semiconductor Device: 1>

Figure 20:
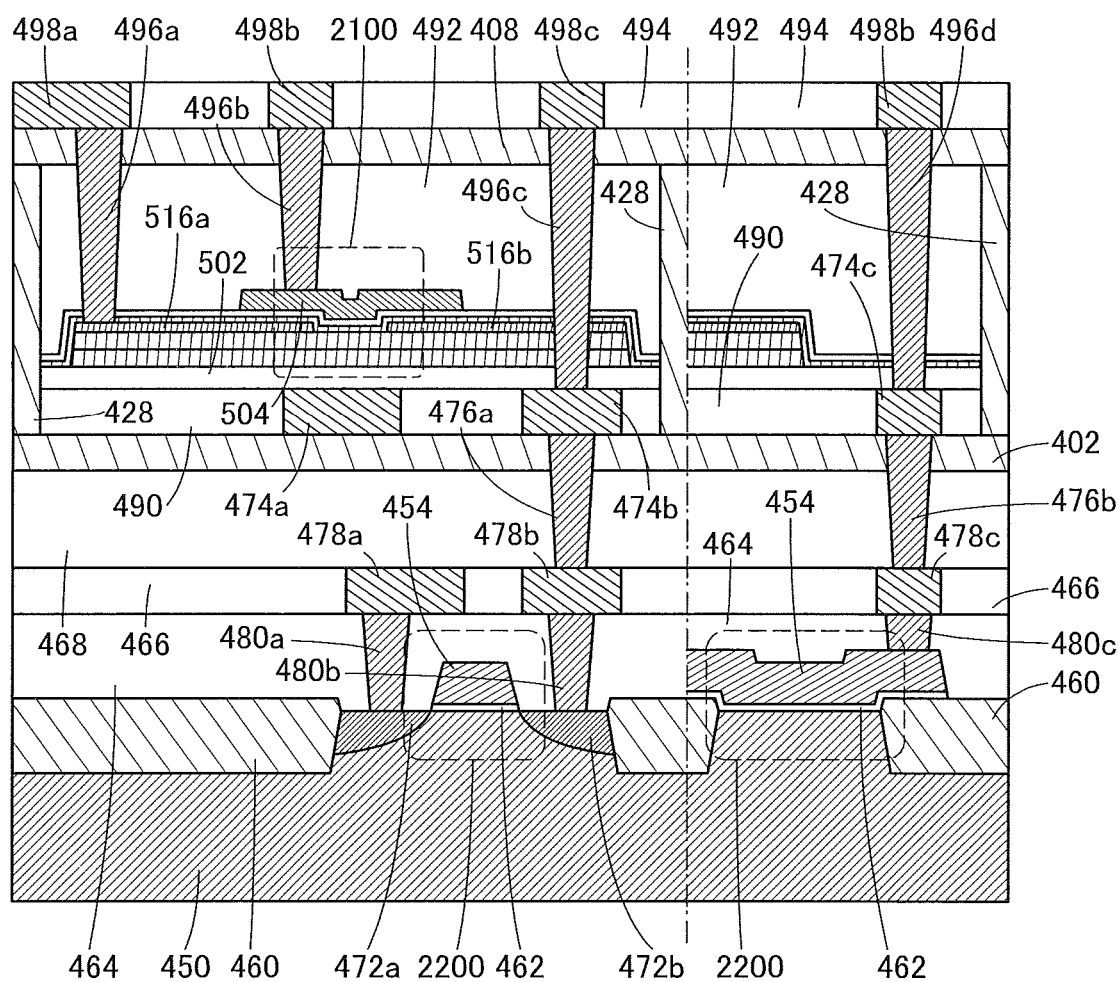
FIG. 20 is a cross-sectional view illustrating a semiconductor device according to one embodiment of the present invention.

FIG. 20 is a cross-sectional view of the semiconductor device of FIG. 19A. The semiconductor device shown in FIG. 20 includes the transistor 2200 and the transistor 2100. The transistor 2100 is placed above the transistor 2200. Although an example where the transistor shown in FIGS. 16A and 16B is used as the transistor 2100 is shown, a semiconductor device of one embodiment of the present invention is not limited thereto. For example, any of the transistors illustrated in FIGS. 12A and 12B, FIGS. 13A to 13C, FIGS. 14A to 14C, FIGS. 17A to 17C, and FIGS. 18A to 18C can be used as the transistor 2100. Therefore, the description regarding the above-mentioned transistors is referred to for the transistor 2100 as appropriate.

The transistor 2200 shown in FIG. 20 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the region 472a and the region 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The region 472a and the region 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device shown in FIG. 20 includes an insulator 464, an insulator 466, an insulator 468, an insulator 402, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, an insulator 502, and insulator 492, an insulator 428, an insulator 408, and an insulator 494.

The insulator 402, the insulator 428, and the insulator 408 are insulators having barrier properties. In other words, the semiconductor device shown in FIG. 20 has a structure in which the transistor 2100 is surrounded by insulators having barrier properties, which is similar to that of the device shown in FIG. 5A. Specifically, the transistor 2100 and the transistor 2200 correspond to the element 150 and the element 151, respectively.

The insulator 464 is placed over the transistor 2200. The insulator 466 is placed over the insulator 464. The insulator 468 is placed over the insulator 466. The insulator 490 is placed over the insulator 468. The transistor 2100 is placed over the insulator 490. The insulator 492 is placed over the transistor 2100. The insulator 494 is placed over the insulator 492.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 and the insulator 402 include an opening reaching the conductor 478b and an opening reaching the conductor 478c. In the openings, the conductor 476a and the conductor 476b are embedded.

The insulator 490 includes an opening overlapping a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 404 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

The insulator 408 and the insulator 492 include an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, the openings are provided through any of components of the transistor 2100 or the like.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulator 464, the insulator 466, the insulator 468, the insulator 490, the insulator 492, and the insulator 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

One or more of the insulator 464, the insulator 466, the insulator 468, the insulator 490, the insulator 492, and the insulator 494 preferably includes an insulator having a barrier property.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

The conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used. Any one or more of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c preferably includes a conductor having a barrier property.

Figure 21:
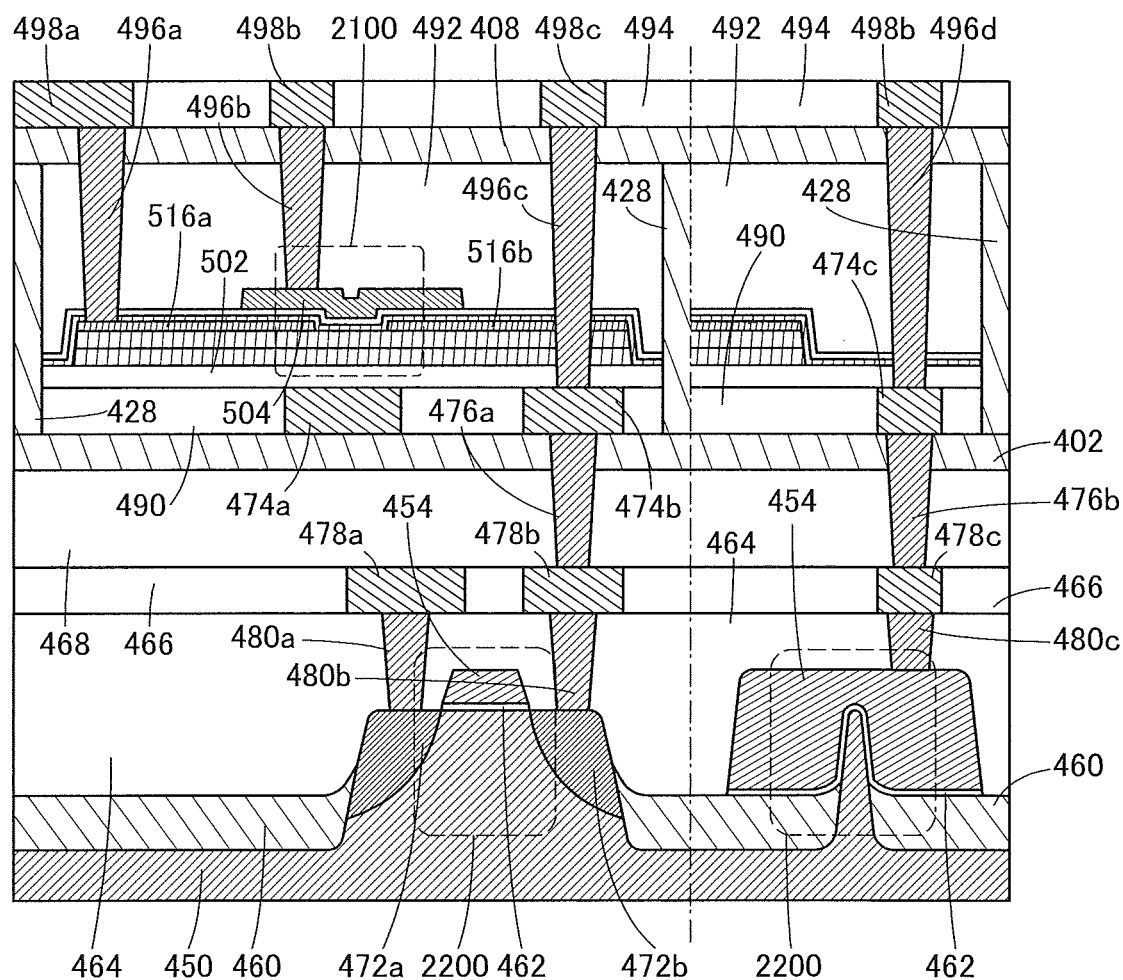
FIG. 21 is a cross-sectional view illustrating a semiconductor device according to one embodiment of the present invention.

Note that a semiconductor device in FIG. 21 is the same as the semiconductor device in FIG. 20 except the structure of the transistor 2200. Therefore, the description of the semiconductor device in FIG. 20 is referred to for the semiconductor device in FIG. 21. In the semiconductor device in FIG. 21, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 22:
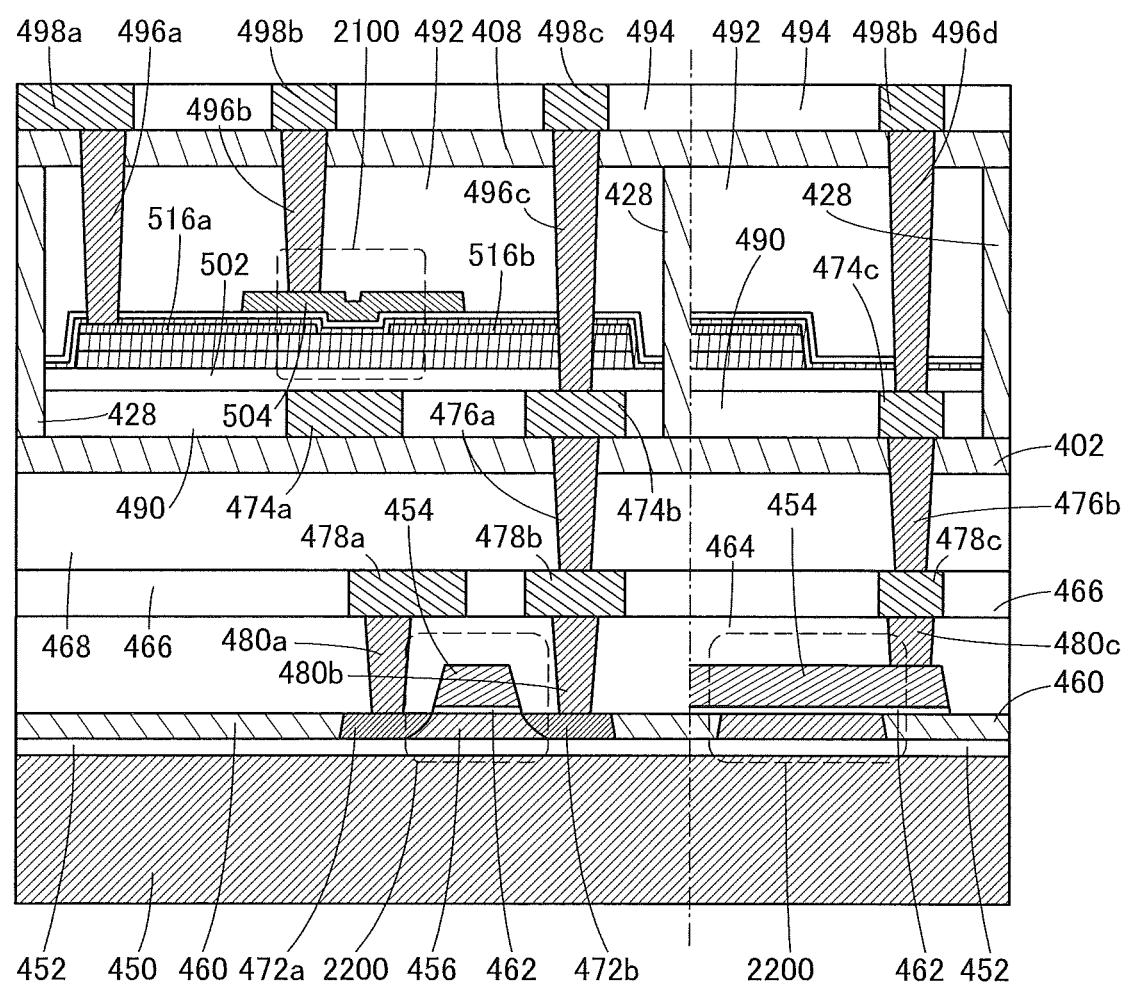
FIG. 22 is a cross-sectional view illustrating a semiconductor device according to one embodiment of the present invention.

Note that a semiconductor device in FIG. 22 is the same as the semiconductor device in FIG. 20 except the structure of the transistor 2200. Therefore, the description of the semiconductor device in FIG. 20 is referred to for the semiconductor device in FIG. 22. In the semiconductor device in FIG. 22, the transistor 2200 is formed using an SOI substrate. In the structure in FIG. 22, a region 456 is separated from the semiconductor substrate 450 with an insulator 452 provided therebetween. Since the SOI substrate is used, a punch-through phenomenon can be suppressed; and thus the off-state characteristics of the transistor 2200 can be improved. Note that the insulator 452 can be formed by turning part of the semiconductor substrate 450 into an insulator. For example, silicon oxide can be used as the insulator 452.

In each of the semiconductor devices shown in FIG. 20 to FIG. 22, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 19B:
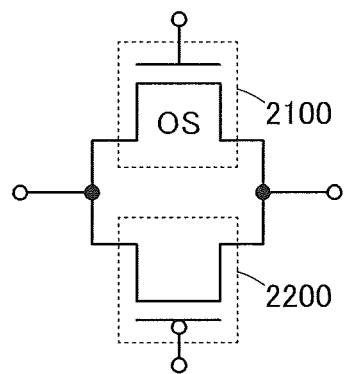

A circuit diagram in FIG. 19B shows a configuration in which sources of the transistor 2100 and the transistor 2200 are connected to each other and drains of the transistor 2100 and the transistor 2200 are connected to each other. With such a configuration, the transistors can function as a so-called CMOS analog switch.

<Memory Device 1>

Figure 23A:
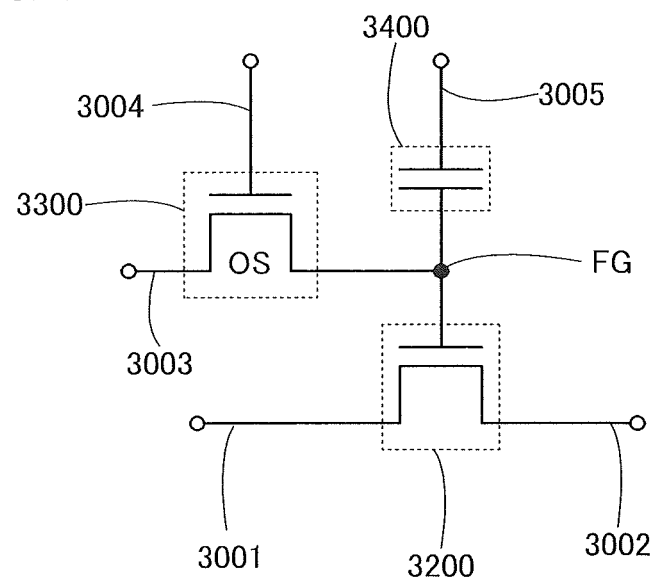
FIGS. 23A and 23B are circuit diagrams illustrating a memory device according to one embodiment of the present invention.
Figure 23B:
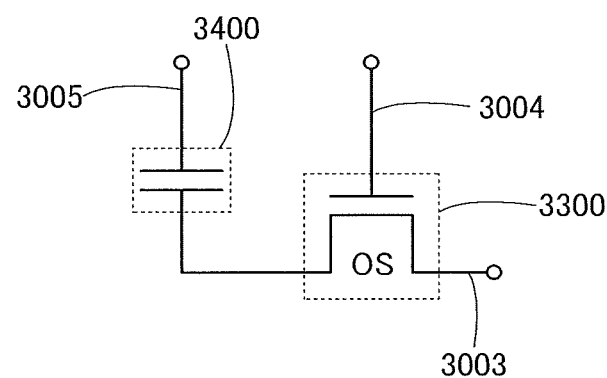

An example of a semiconductor device (memory device) which includes the transistor of one embodiment of the present invention, which can retain stored data even when not powered, and which has an unlimited number of write cycles is shown in FIGS. 23A and 23B.

The semiconductor device illustrated in FIG. 23A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 23A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 23A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is brought into "on state." In the case where the low-level charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in "off state" regardless of the charge supplied to the node FG, that is, a potential lower than $V_{th\_H}$. Alternatively, the fifth wiring 3005 may be supplied with a potential at which the transistor 3200 is brought into "on state" regardless of the charge supplied to the node FG, that is, a potential higher than $V_{th\_L}$.

<Structure of Semiconductor Device: 2>

Figure 24:
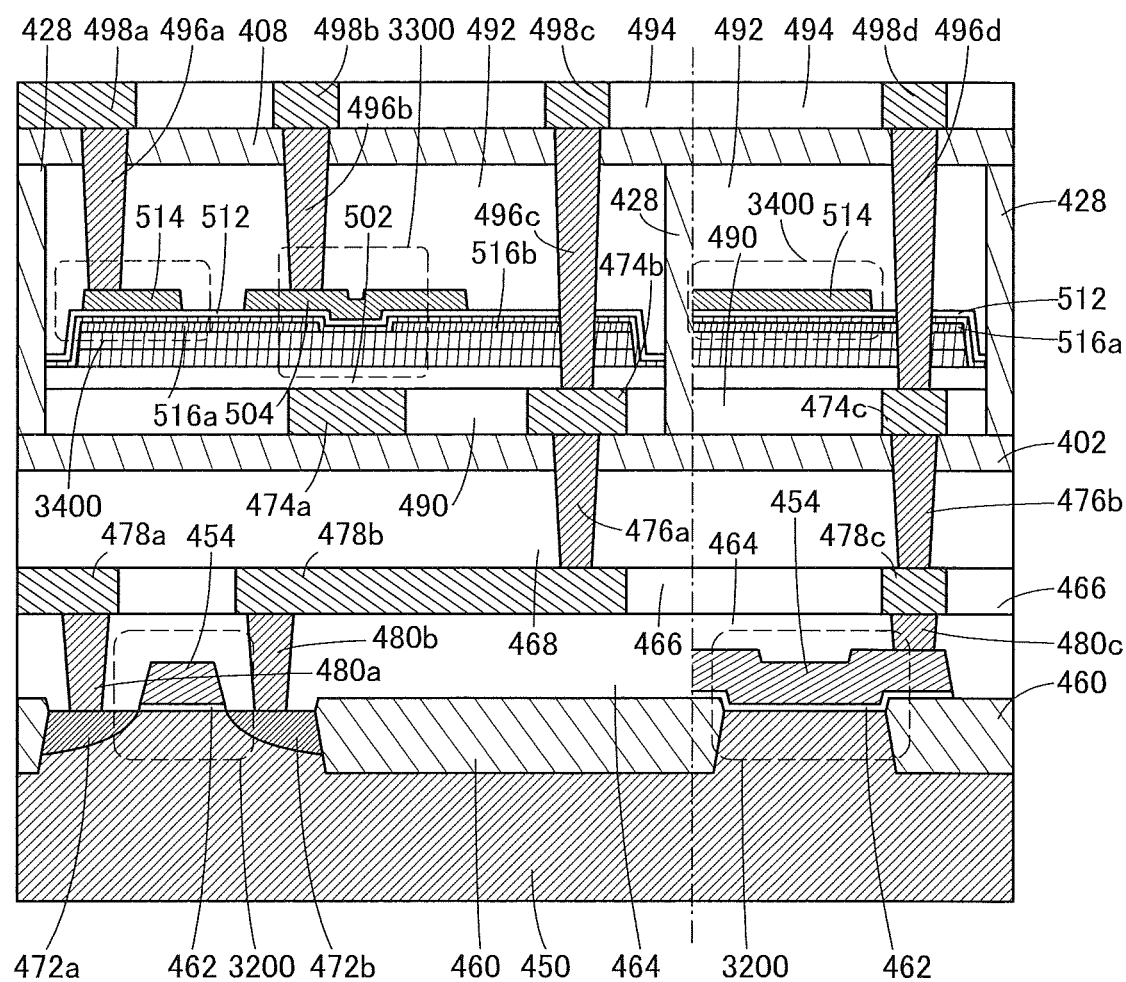
FIG. 24 is a cross-sectional view illustrating a semiconductor device according to one embodiment of the present invention.

FIG. 24 is a cross-sectional view of the semiconductor device of FIG. 23A. The semiconductor device shown in FIG. 24 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 20 is referred to. Note that although the transistor 2200 is illustrated as a p-channel transistor in FIG. 20, the transistor 3200 may be an n-channel transistor.

The transistor 3200 illustrated in FIG. 24 is a transistor using a semiconductor substrate 450. The transistor 3200 includes a region 472a in the semiconductor substrate 450, a region 472b in the semiconductor substrate 450, an insulator 462, and a conductor 454.

The semiconductor device illustrated in FIG. 24 includes the insulator 464, the insulator 466, the insulator 468, the insulator 402, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, the conductor 498d, the insulator 490, the insulator 502, the insulator 492, the insulator 428, the insulator 408, and the insulator 494.

The insulator 402, the insulator 428, and the insulator 408 are insulators having barrier properties. In other words, the semiconductor device shown in FIG. 24 has a structure in which the transistor 3300 is surrounded by insulators having barrier properties, which is similar to that of the device shown in FIG. 5A. Specifically, the transistor 3300 and the transistor 3200 correspond to the element 150 and the element 151, respectively. Note that the semiconductor device shown in FIG. 24 may include the element 150a and the element 150b as in the device shown in FIGS. 3A and 3B, in which case the capacitor 3400, the transistor 3300, and the transistor 3200 shown in FIG. 24 correspond to the element 150a, the element 150b, and the element 151, respectively.

The insulator 464 is provided over the transistor 3200. The insulator 466 is provided over the insulator 464. The insulator 468 is provided over the insulator 466. The insulator 402 is provided over the insulator 468. The insulator 490 is provided over the insulator 402. The transistor 3300 is provided over the insulator 490. The insulator 492 is provided over the transistor 3300. The insulator 494 is provided over the insulator 492.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 and the insulator 402 include an opening reaching the conductor 478b and an opening reaching the conductor 478c. In the openings, the conductor 476a and the conductor 476b are embedded.

The insulator 490 includes an opening overlapping the channel formation region of the transistor 3300, an opening reaching the conductor 476a, and an opening reaching the conductor 476b. In the openings, the conductor 474a, the conductor 474b, and the conductor 474c are embedded.

The conductor 474a may have a function of a bottom gate electrode of the transistor 3300. Alternatively, for example, electric characteristics such as the threshold voltage of the transistor 3300 may be controlled by application of a predetermined potential to the conductor 474a. Further alternatively, for example, the conductor 474a and the conductor 404 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 408 and the insulator 492 include an opening reaching the conductor 474b through the conductor 516b that is one of a source electrode and a drain electrode of the transistor 3300, an opening reaching the conductor 514 that overlaps the conductor 516a that is the other of the source electrode and the drain electrode of the transistor 3300, with the insulator 512 positioned therebetween, an opening reaching the conductor 504 that is the gate electrode of the transistor 3300, and an opening reaching the conductor 474c through the conductor 516a that is the other of the source electrode and the drain electrode of the transistor 3300. In the openings, the conductor 496a, the conductor 496b, the conductor 496c, and the conductor 496d are embedded. Note that in some cases, a component of the transistor 3300 or the like is through other components.

The insulator 494 includes an opening reaching the conductor 496a, an opening reaching the conductor 496b, an opening reaching the conductor 496c, and an opening reaching the conductor 496d. In the openings, the conductor 498a, the conductor 498b, the conductor 498c, and the conductor 498d are embedded.

At least one of the insulator 464, the insulator 466, the insulator 468, the insulator 490, the insulator 492, and the insulator 494 preferably includes an insulator having a barrier property.

The conductor 498d may be formed to have a single-layer structure or a stacked-layer structure including a conductor containing, for example, one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a compound containing aluminum, a compound containing copper and titanium, a compound containing copper and manganese, a compound containing indium, tin, and oxygen, a compound containing titanium and nitrogen, or the like may be used. The conductor 498d preferably includes a conductor having a barrier property.

The source or drain of the transistor 3200 is electrically connected to the conductor 516b that is one of a source electrode and a drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 516a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 514, and an insulator 512. Because the insulator 512 can be formed by the same step as the insulator 512 that functions as a gate insulator of the transistor 3300, productivity can be increased. When a layer formed by the same step as the conductor 504 that functions as a gate electrode of the transistor 3300 is used as the conductor 514, productivity can be increased.

For the structures of other components, the description of FIG. 20 and the like can be referred to as appropriate.

Figure 25:
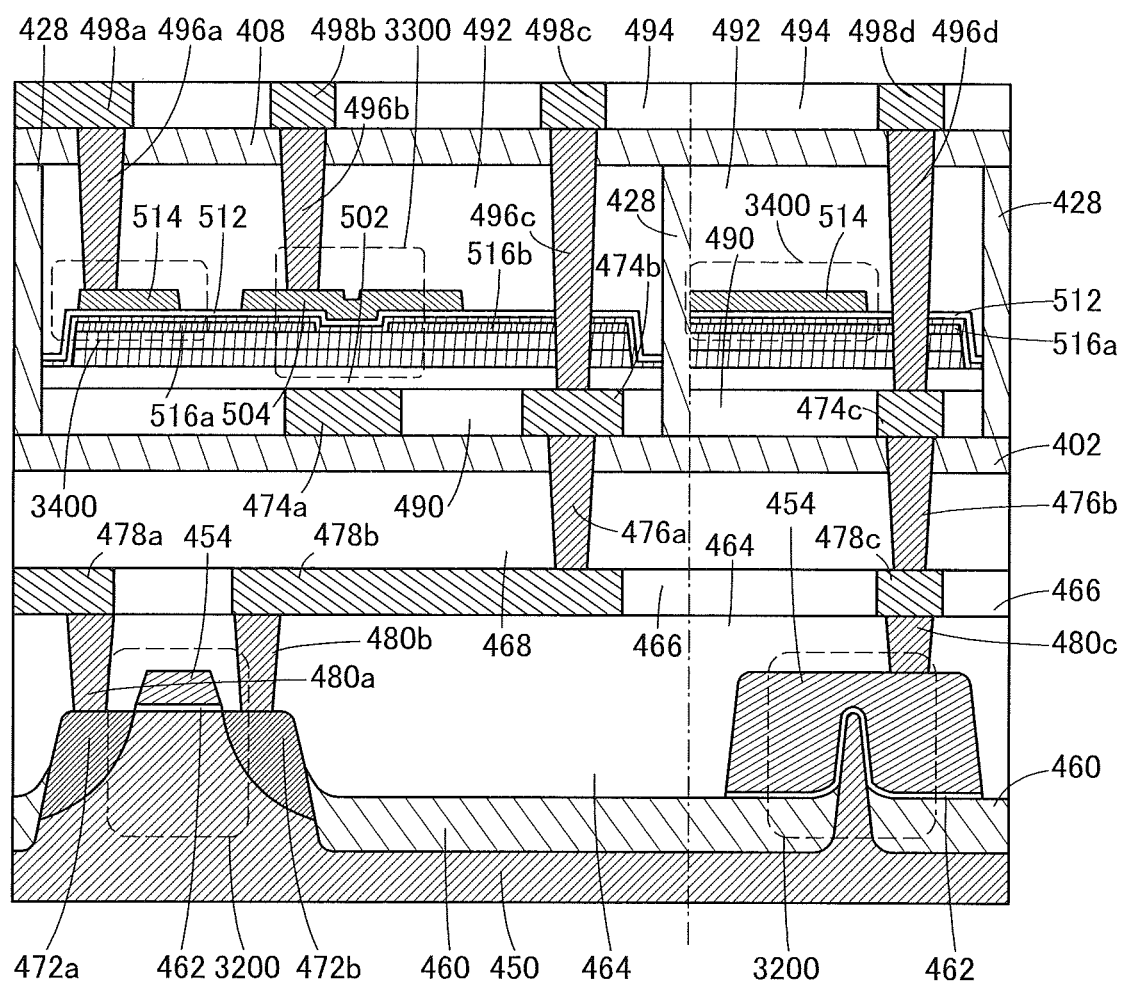
FIG. 25 is a cross-sectional view illustrating a semiconductor device according to one embodiment of the present invention.

A semiconductor device in FIG. 25 is the same as the semiconductor device in FIG. 24 except the structure of the transistor 3200. Therefore, the description of the semiconductor device in FIG. 24 is referred to for the semiconductor device in FIG. 25. Specifically, in the semiconductor device in FIG. 25, the transistor 3200 is a FIN-type transistor. For the FIN-type transistor 3200, the description of the transistor 2200 in FIG. 21 is referred to. Note that although the transistor 2200 is illustrated as a p-channel transistor in FIG. 21, the transistor 3200 may be an n-channel transistor.

Figure 26:
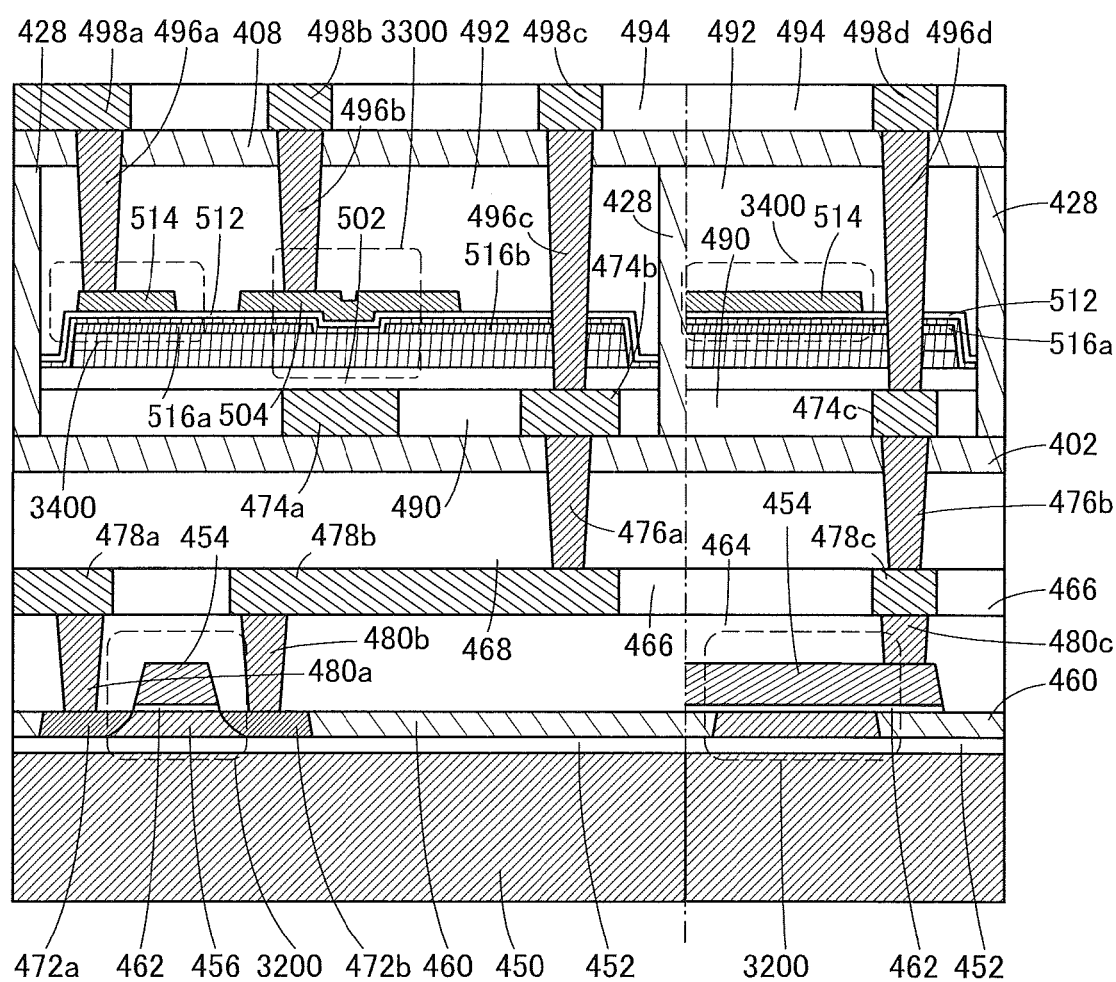
FIG. 26 is a cross-sectional view illustrating a semiconductor device according to one embodiment of the present invention.

A semiconductor device in FIG. 26 is the same as the semiconductor device in FIG. 24 except a structure of the transistor 3200. Therefore, the description of the semiconductor device in FIG. 24 is referred to for the semiconductor device in FIG. 26. Specifically, in the semiconductor device in FIG. 26, the transistor 3200 is provided in the semiconductor substrate 450 that is an SOI substrate. For the transistor 3200, which is provided in the semiconductor substrate 450 that is an SOI substrate, the description of the transistor 2200 in FIG. 22 is referred to. Note that although the transistor 2200 is illustrated as a p-channel transistor in FIG. 22, the transistor 3200 may be an n-channel transistor.

<Memory Device 2>

The semiconductor device in FIG. 23B is different from the semiconductor device in FIG. 23A in that the transistor 3200 is not provided. Also in this case, data can be written and retained in a manner similar to that of the semiconductor device in FIG. 23A.

Reading of data in the semiconductor device in FIG. 23B is described. When the transistor 3300 is brought into on state, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ (=$(C_B \times V_{B0} + C \times V_1)/(C_B + C)$) is higher than the potential of the third wiring 3003 in the case of retaining the potential $V_0$ (=$(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Imaging Device>

An imaging device of one embodiment of the present invention is described below.

Figure 27A:
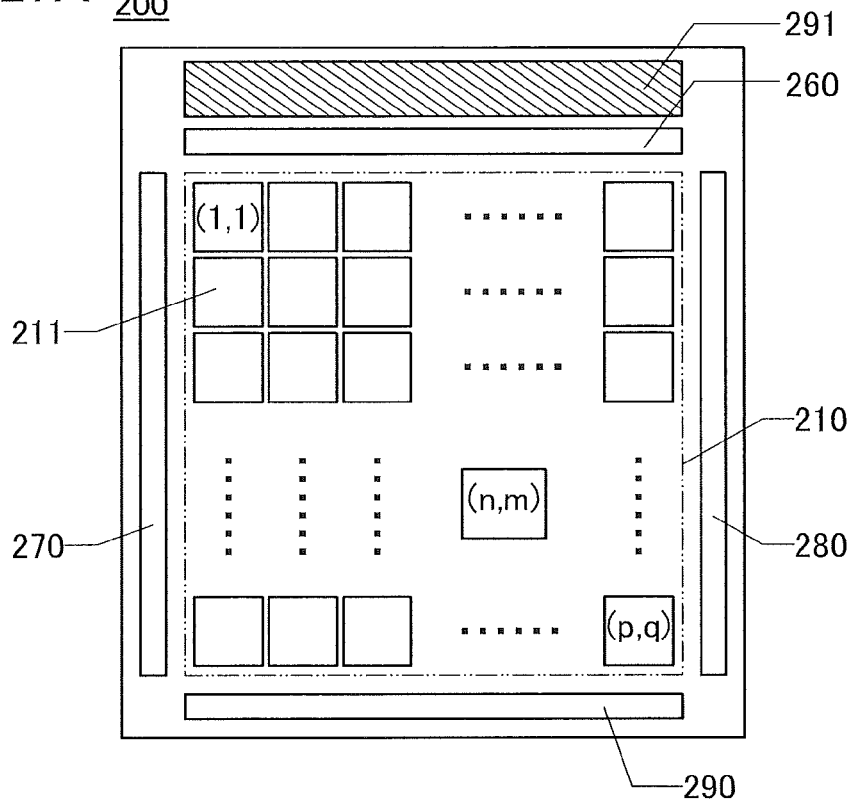
FIGS. 27A and 27B are top views illustrating a semiconductor device according to one embodiment of the present invention.

FIG. 27A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicates all of the peripheral circuit 260, the peripheral circuit 270, the peripheral circuit 280, and the peripheral circuit 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuit 260, the peripheral circuit 270, the peripheral circuit 280, and the peripheral circuit 290 may be omitted.

Figure 27B:
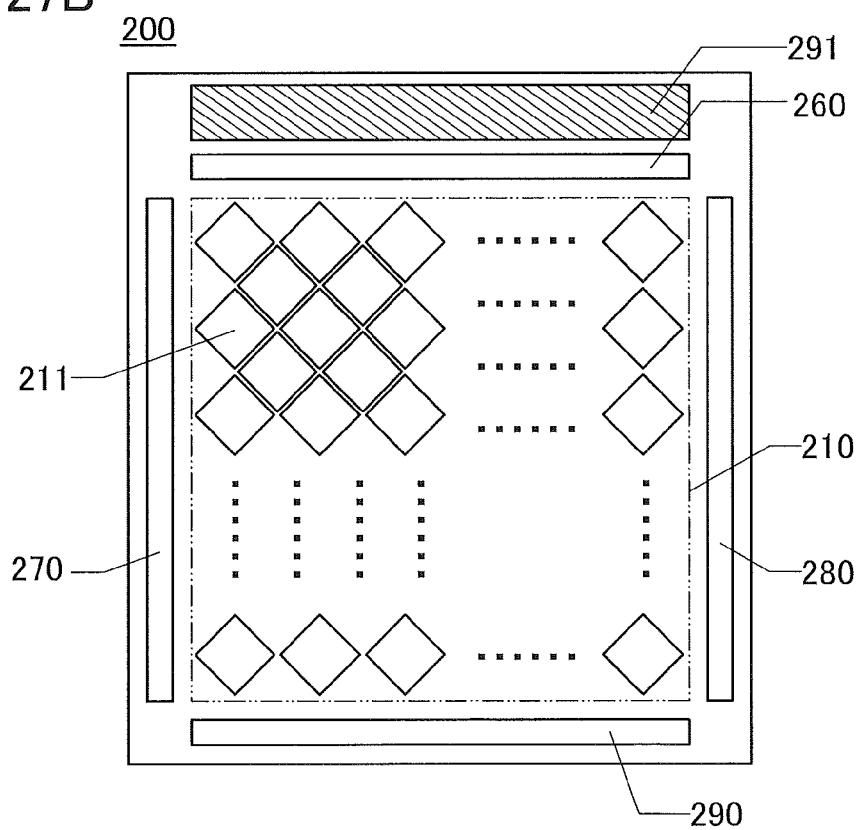

As illustrated in FIG. 27B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example of Pixel: 1>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 28A:
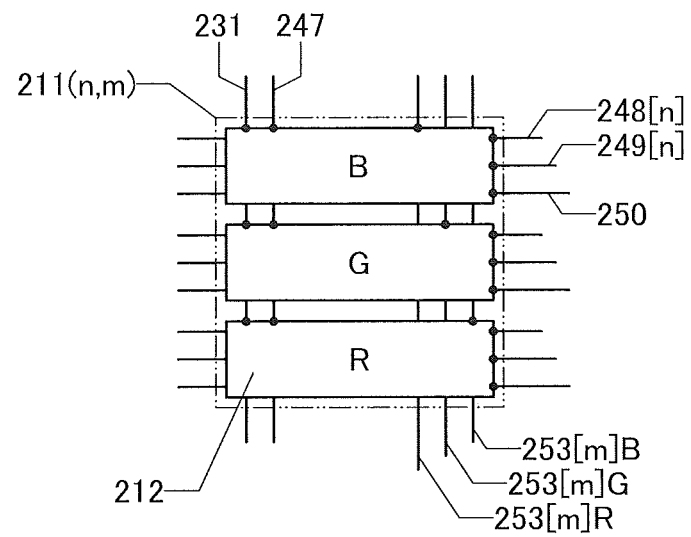
FIGS. 28A and 28B are block diagrams illustrating a semiconductor device according to one embodiment of the present invention.

FIG. 28A is a plan view showing an example of the pixel 211 with which a color image is obtained. The pixel 211 illustrated in FIG. 28A includes a subpixel 212 provided with a color filter transmitting light with a red (R) wavelength band (also referred to as a subpixel 212R), a subpixel 212 provided with a color filter transmitting light with a green (G) wavelength band (also referred to as a subpixel 212G), and a subpixel 212 provided with a color filter transmitting light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row (n is an integer greater than or equal to 1 and less than or equal to p) are referred to as a wiring 248[$n$] and a wiring 249[$n$]. For example, the wiring 253 connected to the pixel 211 in the m-th column (m is an integer greater than or equal to 1 and less than or equal to q) is referred to as a wiring 253[$m$]. Note that in FIG. 28A, the wirings 253 connected to the subpixel 212R, the subpixel 212G, and the subpixel 212B in the pixel 211 in the m-th column are referred to as a wiring 253[$m$]R, a wiring 253[$m$]G, and a wiring 253[$m$]B. The subpixels 212 are electrically connected to the peripheral circuit through the above wirings.

Figure 28B:
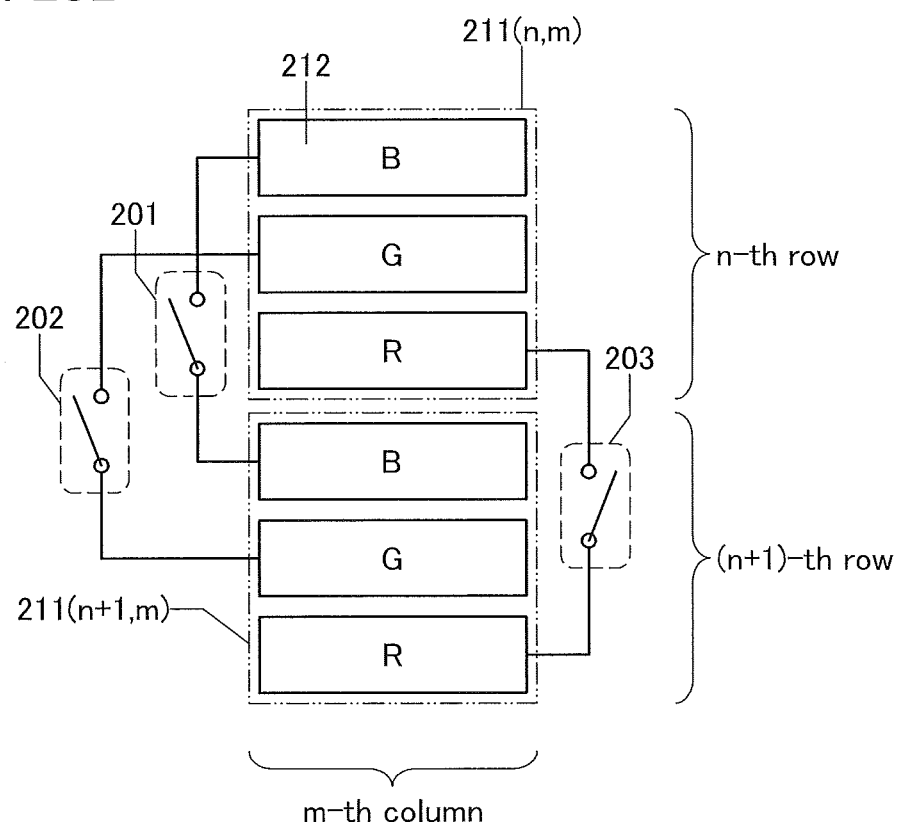

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 28B shows a connection example of the subpixels 212: the subpixel 212 in the pixel 211 arranged in an n-th row and an m-th column and the subpixel 212 in the adjacent pixel 211 arranged in an (n+1)-th row and the m-th column. In FIG. 28B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 28A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) is set at red:green:blue 1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 29A and 29B. With the lens 255, the photoelectric conversion element can receive incident light efficiently. Specifically, as illustrated in FIG. 29A, light 256 enters a photoelectric conversion element 220 through the lens 255, the filter 254 (a filter 254R, a filter 254G, and a filter 254B), a pixel circuit 230, and the like which are provided in the pixel 211.

However, as indicated by a region surrounded with dashed-dotted lines, part of the light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 29B. When the light 256 enters the photoelectric conversion element 220 from the photoelectric conversion element 220 side, the imaging device 200 with high sensitivity can be provided.

Figure 29A:
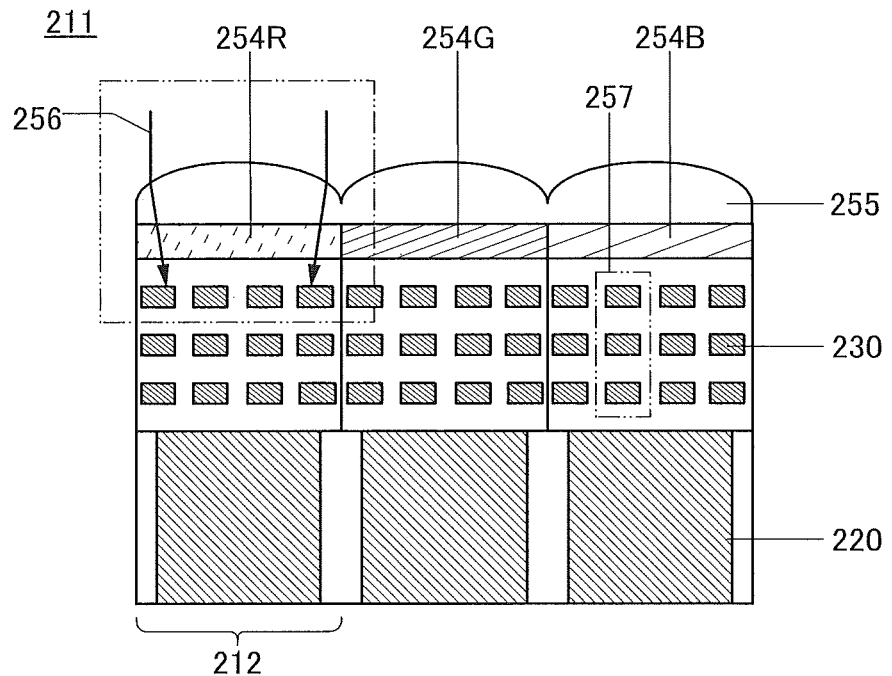
FIGS. 29A and 29B are cross-sectional views illustrating a semiconductor device according to one embodiment of the present invention.
Figure 29B:
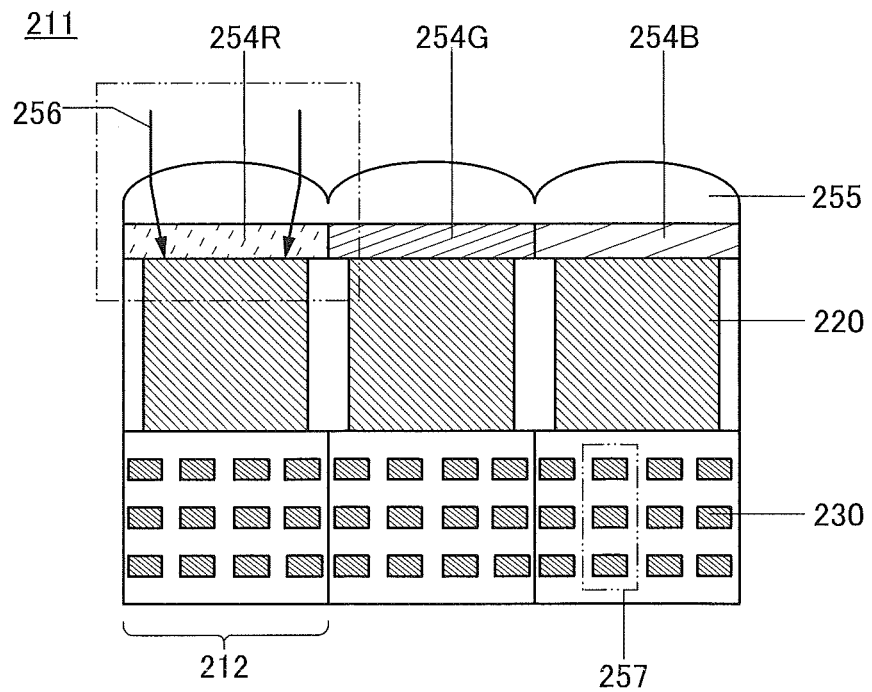

As the photoelectric conversion element 220 illustrated in FIGS. 29A and 29B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 28A and 28B.

<Configuration Example of Pixel: 2>

An example of a pixel including a transistor using silicon and a transistor using an oxide semiconductor is described below.

Figure 30A:
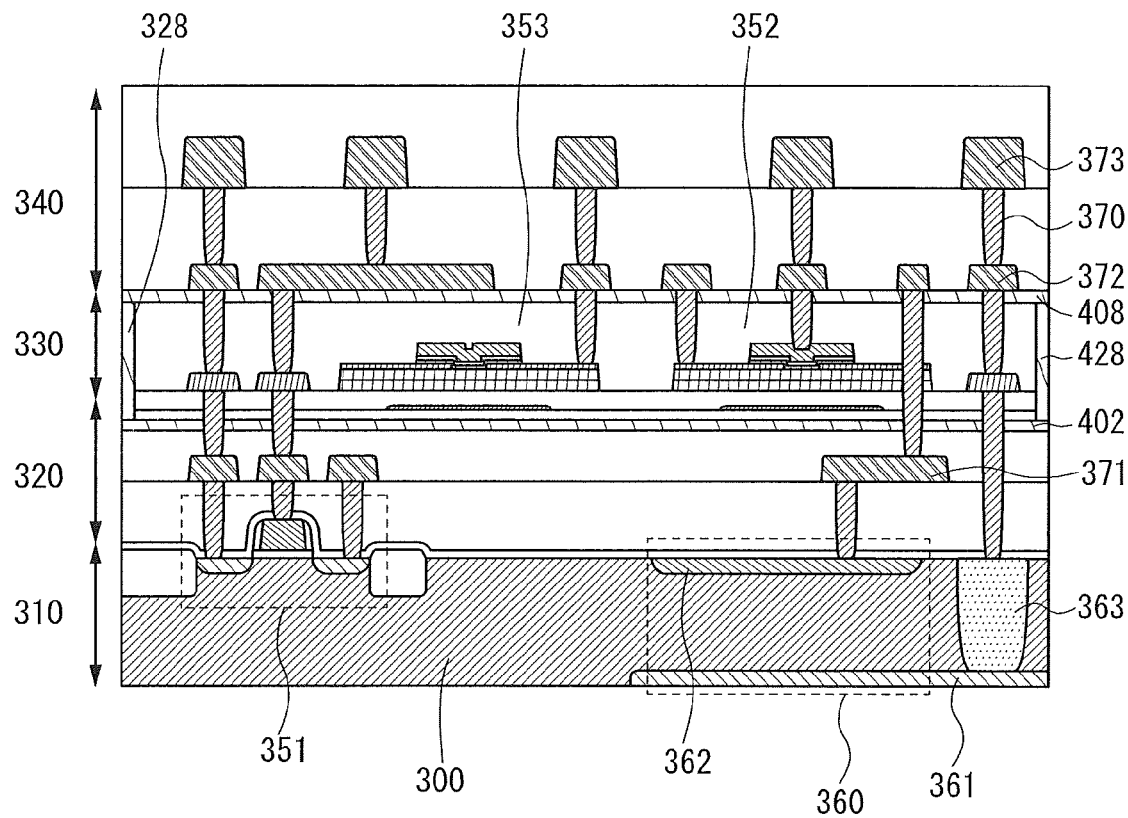
FIGS. 30A and 30B are cross-sectional views illustrating a semiconductor device according to one embodiment of the present invention.
Figure 30B:
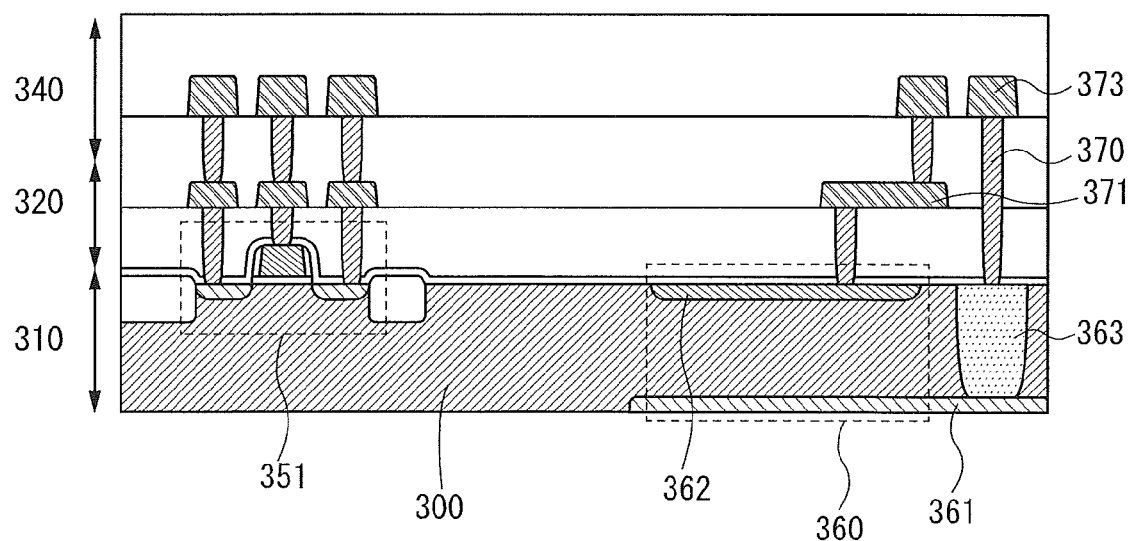

FIGS. 30A and 30B are each a cross-sectional view of an element included in an imaging device. The imaging device illustrated in FIG. 30A includes a transistor 351 including silicon over a silicon substrate 300, a transistor 352 and a transistor 353 which include an oxide semiconductor and are stacked over the transistor 351, and a photodiode 360 provided in a silicon substrate 300. The transistors and the photodiode 360 are electrically connected to various plugs 370 and wirings 371. In addition, the photodiode 360 includes an anode 361 and a cathode 362. The anode 361 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistor 352, the transistor 353, and a layer 340 which is in contact with the layer 330 and includes a wiring 372 and a wiring 373.

In the example of cross-sectional view in FIG. 30A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of transistors using silicon, the layer 330 may be omitted. An example of a cross-sectional view in which the layer 330 is not provided is shown in FIG. 30B. In the case where the layer 330 is not provided, the wiring 372 of the layer 340 can be omitted.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 402 is provided between the layer 310 including the transistor 351 and the photodiode 360 and the layer 330 including the transistor 352 and the transistor 353. However, there is no limitation on the position of the insulator 402.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352 and the transistor 353 becomes one of factors generating a carrier in the oxide semiconductor. Thus, the hydrogen may cause a reduction of the reliability of the transistor 352 and the transistor 353. Therefore, in the case where the transistor using an oxide semiconductor is provided over the transistor using silicon, it is preferable that the insulator 402 having a barrier property be provided between the transistors. Each of the transistor 352 and the transistor 353 is preferably surrounded by the insulator 428 and the insulator 328 having a barrier property in all directions. In addition, the insulator 408 having a barrier property is preferably provided over the transistor 352 and the transistor 353 to cover the transistors. When the hydrogen is confined within a region below the insulator 402, the reliability of the transistor 351 can be improved. In addition, the hydrogen can be prevented from being diffused from a part below the insulator 402 to a part above the insulator 402; thus, the reliability of the transistor 352, the transistor 353, and the like can be increased.

In other words, the semiconductor device shown in FIGS. 30A and 30B has a structure in which the transistor 352 and the transistor 353 are surrounded by insulators having barrier properties. The semiconductor device shown in FIGS. 30A and 30B thus corresponds to a combination of the device shown in FIGS. 3A and 3B and the device shown in FIG. 5A. Specifically, the transistor 352, the transistor 353, and the transistor 351 correspond to the element 150a, the element 150b, and the element 151, respectively. The photodiode 360 may correspond to the element 151. The transistor 351 and the photodiode 360 may correspond to the element 151.

In the cross-sectional view in FIG. 30A, the photodiode 360 in the layer 310 and the transistor in the layer 330 can be formed so as to overlap each other. This structure can increase the degree of integration of pixels. In other words, the resolution of the imaging device can be increased.

Figure 31A:
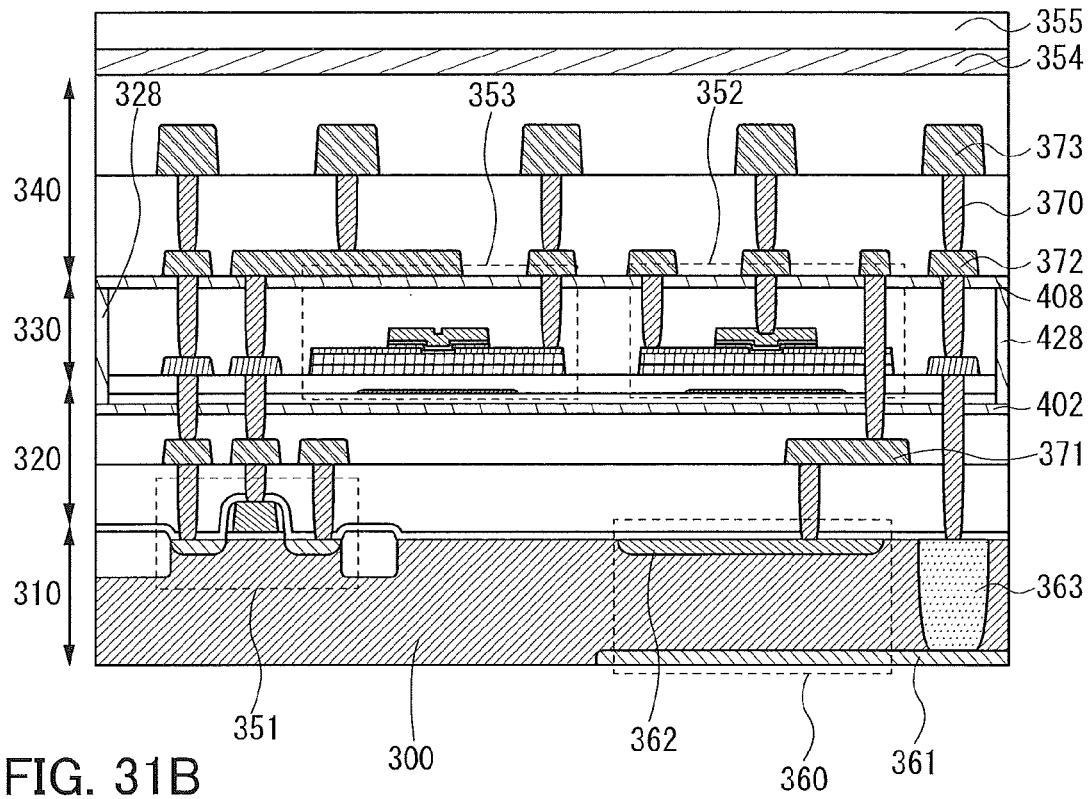
FIGS. 31A and 31B are cross-sectional views illustrating a semiconductor device according to one embodiment of the present invention.
Figure 31B:
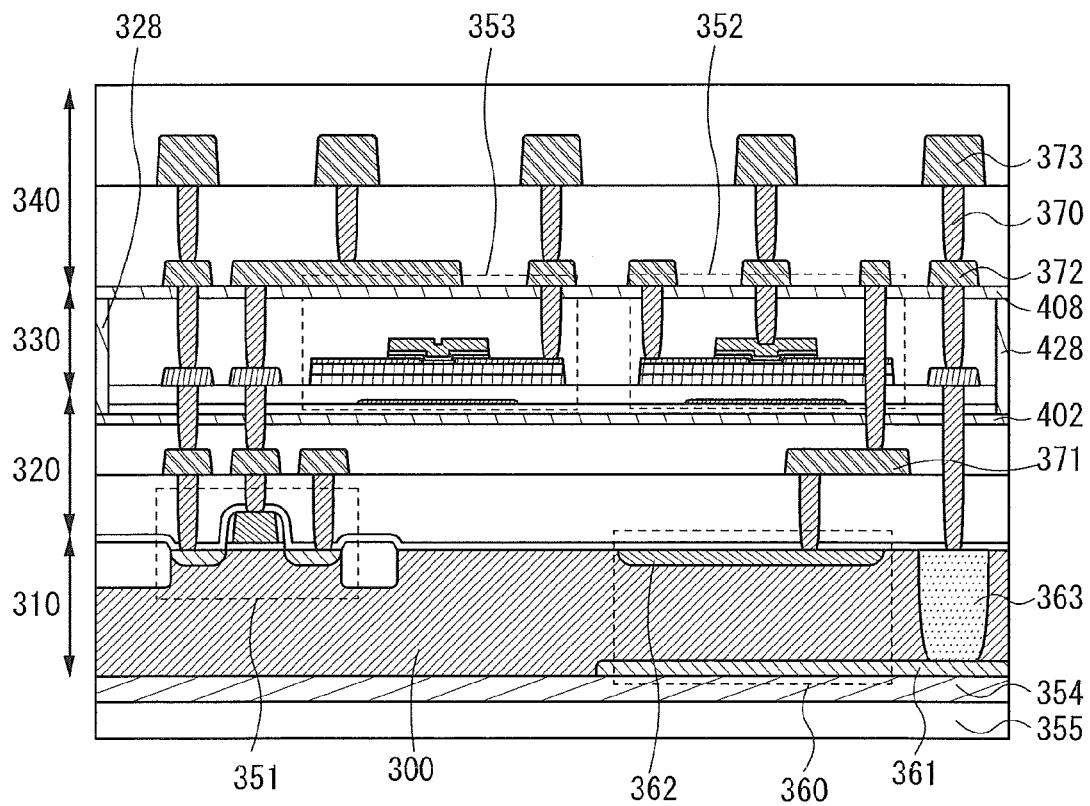

A filter 354 and/or a lens 355 may be provided over or under the pixel as shown in FIGS. 31A and 31B. The filter 254 and the lens 255 are referred to for the filter 354 and the lens 355, respectively.

As illustrated in FIG. 32A1 and FIG. 32B1, part or the whole of the imaging device can be bent. FIG. 32A1 illustrates a state in which the imaging device is bent in the direction of a dashed-dotted line X1-X2. FIG. 32A2 is a cross-sectional view illustrating a portion indicated by the dashed-dotted line X1-X2 in FIG. 32A1. FIG. 32A3 is a cross-sectional view illustrating a portion indicated by a dashed-dotted line Y1-Y2 in FIG. 32A1.

FIG. 32B1 illustrates a state where the imaging device is bent in the direction of a dashed-dotted chain X3-X4 and the direction of a dashed-dotted line Y3-Y4. FIG. 32B2 is a cross-sectional view illustrating a portion indicated by the dashed-dotted line X3-X4 in FIG. 32B 1. FIG. 32B3 is a cross-sectional view illustrating a portion indicated by the dashed-dotted line Y3-Y4 in FIG. 32B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 33:
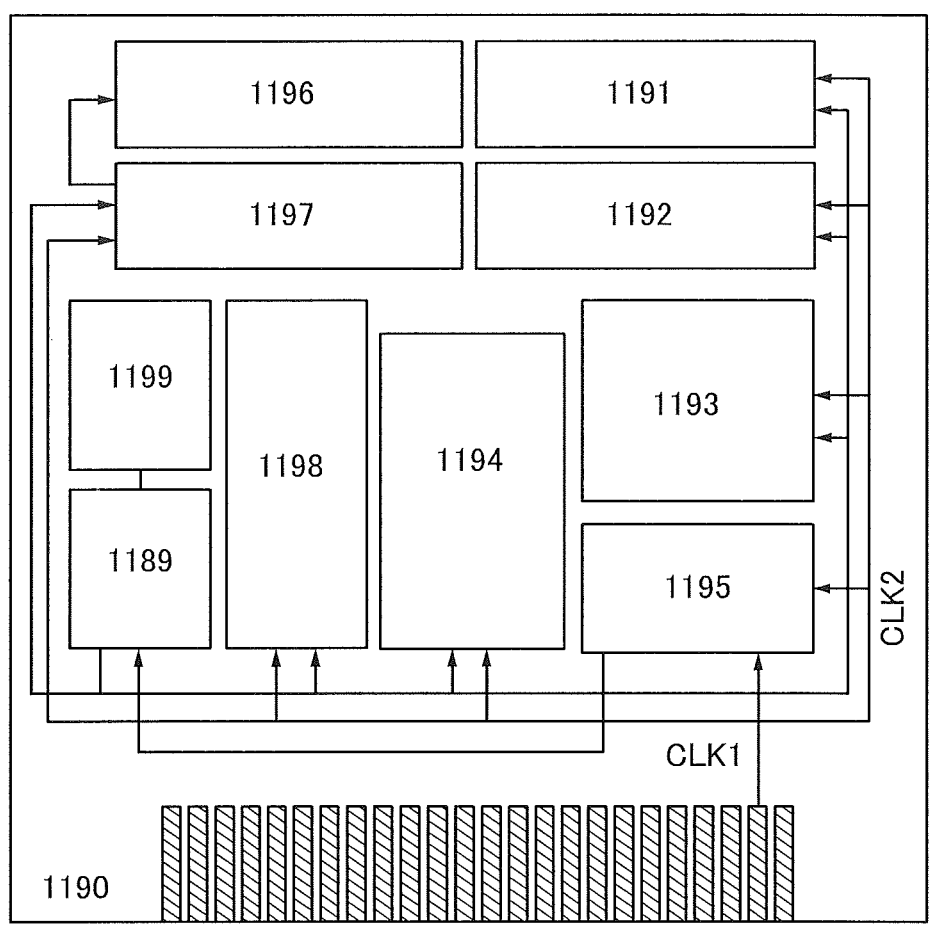
FIG. 33 is a block diagram illustrating a semiconductor device according to one embodiment of the present invention.

FIG. 33 is a block diagram illustrating a configuration example of a CPU including any of the above-described transistors as a component.

The CPU illustrated in FIG. 33 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 33 is just an example in which the configuration has been simplified, and an actual CPU may have a variety of configurations depending on the application. For example, the CPU may have the following configuration: a structure including the CPU illustrated in FIG. 33 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 33, a memory cell is provided in the register 1196. For the memory cell of the register 1196, any of the above-described transistors, the above-described memory device, or the like can be used.

In the CPU illustrated in FIG. 33, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 34:
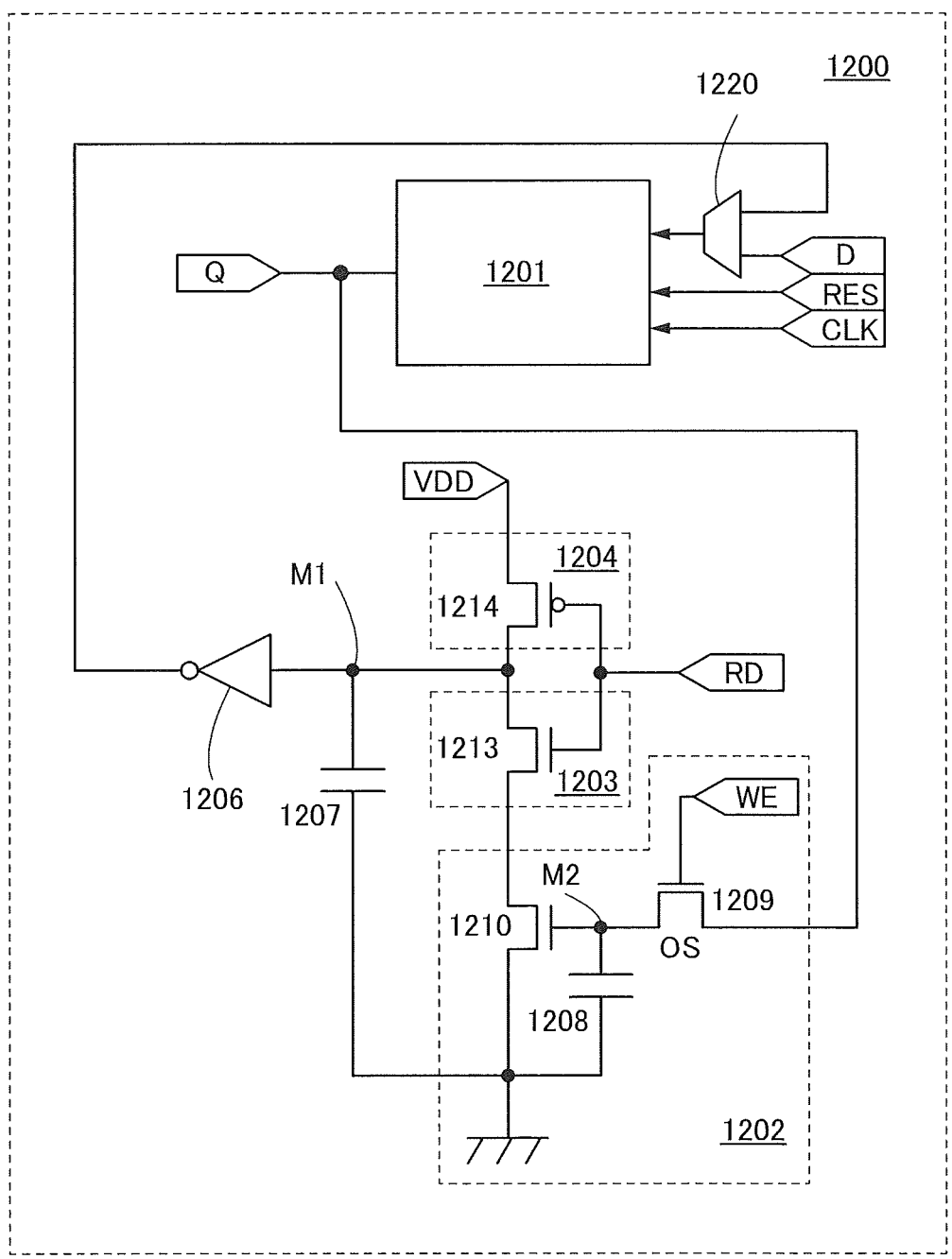
FIG. 34 is a circuit diagram illustrating a semiconductor device according to one embodiment of the present invention.

FIG. 34 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 34 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 34, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 34, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the reset of the transistors.

As the circuit 1201 in FIG. 34, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the transistor 1210 is turned on or turned off depending on the signal retained by the capacitor 1208, and a signal corresponding to the state can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

<Display Device>

A display device of one embodiment of the present invention is described below with reference to FIGS. 35A to 35C and FIGS. 37A and 37B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 35A:
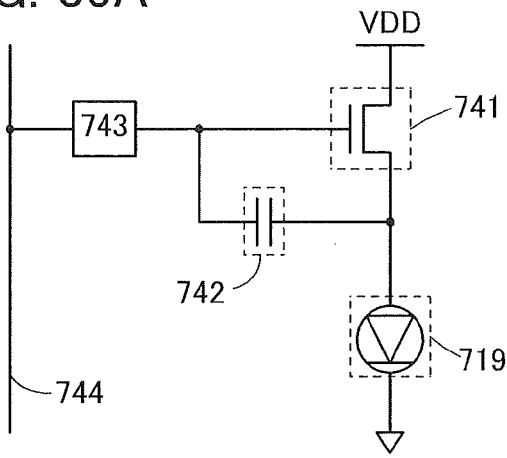
FIGS. 35A to 35C are a circuit diagram, a top view, and a cross-sectional view illustrating a semiconductor device according to one embodiment of the present invention.
Figure 35B:
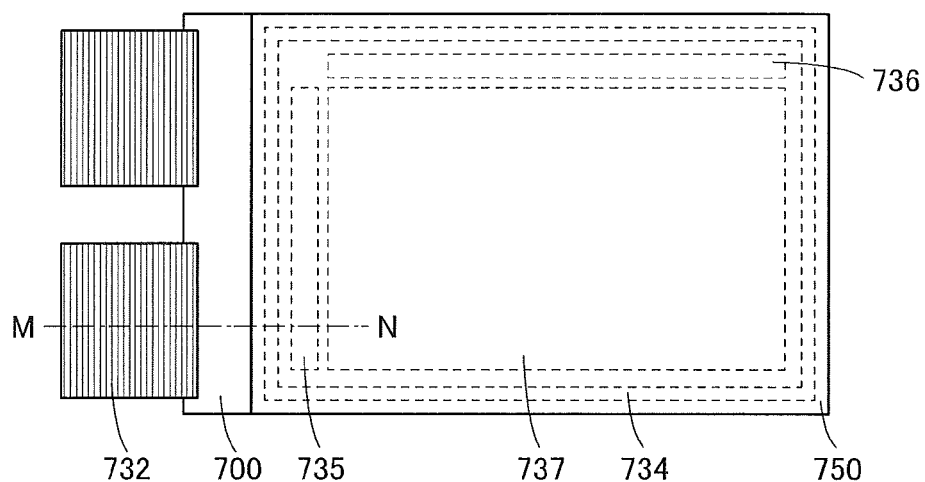
Figure 35C:
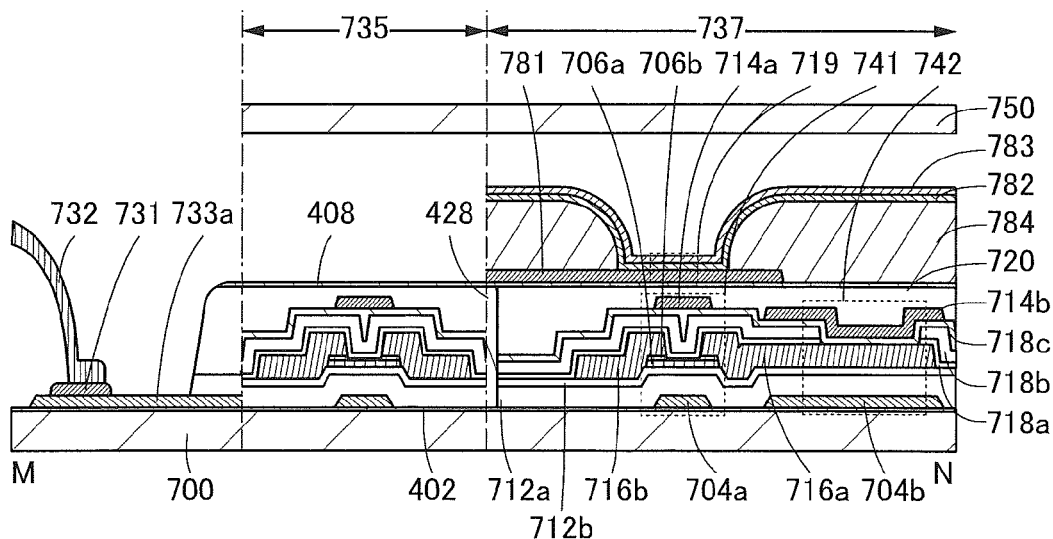

FIGS. 35A to 35C illustrate an example of an EL display device of one embodiment of the present invention. FIG. 35A is a circuit diagram of a pixel in an EL display device. FIG. 35B is a plan view showing the whole of the EL display device.

FIG. 35A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 35A includes a switching element 743, a transistor 741, a capacitor 742, and a light-emitting element 719.

Note that FIG. 35A and the like each illustrate an example of a circuit structure; therefore, a transistor can be provided additionally. In contrast, for each node in FIG. 35A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 35B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 35C is a cross-sectional view of the EL display device taken along part of dashed-dotted line M-N in FIG. 35B.

FIG. 35C illustrates a structure of the transistor 741 including a conductor 704a over the substrate 700; an insulator 712a over the conductor 704a; an insulator 712b over the insulator 712a; a semiconductor 706a and a semiconductor 706b which are over the insulator 712b and overlaps the conductor 704a; a conductor 716a and a conductor 716b in contact with the semiconductor 706a and the semiconductor 706b; an insulator 718a over the semiconductor 706b, the conductor 716a, and the conductor 716b; an insulator 718b over the insulator 718a; an insulator 718c over the insulator 718b; and a conductor 714a that is over the insulator 718c and overlaps the semiconductor 706b. Note that the structure of the transistor 741 is just an example; the transistor 741 may have a structure different from that illustrated in FIG. 35C.

Thus, in the transistor 741 illustrated in FIG. 35C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator; and the conductor 714a serves as a gate electrode. Note that in some cases, electrical characteristics of the semiconductor 706 change if light enters the semiconductor. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 35C illustrates a structure of the capacitor 742 including a conductor 704b over the substrate; the insulator 712a over the conductor 704b; the insulator 712b over the insulator 712a; the conductor 716a that is over the insulator 712b and overlaps the conductor 704b; the insulator 718a over the conductor 716a; the insulator 718b over the insulator 718a; the insulator 718c over the insulator 718b; and a conductor 714b that is over the insulator 718c and overlaps the conductor 716a. In this structure, part of the insulator 718a and part of the insulator 718b are removed in a region where the conductor 716a and the conductor 714b overlap each other.

In the capacitor 742, each of the conductor 704b and the conductor 714b serves as one electrode, and the conductor 716a serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 35C has a large capacitance per area occupied by the capacitor. Therefore, the EL display device illustrated in FIG. 35C has high display quality. Note that although the capacitor 742 illustrated in FIG. 35C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which a part of the insulator 718c is removed to reduce the thickness of the region where the conductor 716a and the conductor 714b overlap with each other may be used.

The insulator 402 is provided below the transistor 741 and the capacitor 742. The insulator 720 and the insulator 408 over the insulator 720 are provided over the transistor 741 and the capacitor 742. The insulator 428 is provided on the side of the transistor 741 and the capacitor 742. Here, the insulator 720 and the insulator 408 may have an opening reaching the conductor 716a that serves as the source electrode of the transistor 741. A conductor 781 is provided over the insulator 408. The conductor 781 may be electrically connected to the transistor 741 through the opening in the insulator 720 and the insulator 408.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

The insulator 402, the insulator 428, and the insulator 408 are insulators having barrier properties. In other words, the semiconductor device shown in FIGS. 35A, 35B and 35C has a structure in which the transistor 741 is surrounded by insulators having barrier properties, which is similar to that of the device shown in FIG. 1A. Specifically, the transistor 741 corresponds to the element 150. Note that the display device shown in FIGS. 35A, 35B and 35C may include the element 150a and the element 150b as in the device shown in FIGS. 3A and 3B, in which case the capacitor 742 and the transistor 741 shown in FIGS. 35A, 35B and 35C correspond to the element 150a and the element 150b, respectively. The device shown in FIG. 5A may be modified so that the display device in FIGS. 35A, 35B and 35C includes the element 150 and the element 151 thereover, in which case the transistor 741 and the light-emitting element 719 correspond to the element 150 and the element 151, respectively.

Note that a transistor, a capacitor, a wiring layer, and the like may be staked to make the EL display device highly integrated.

Figure 36:
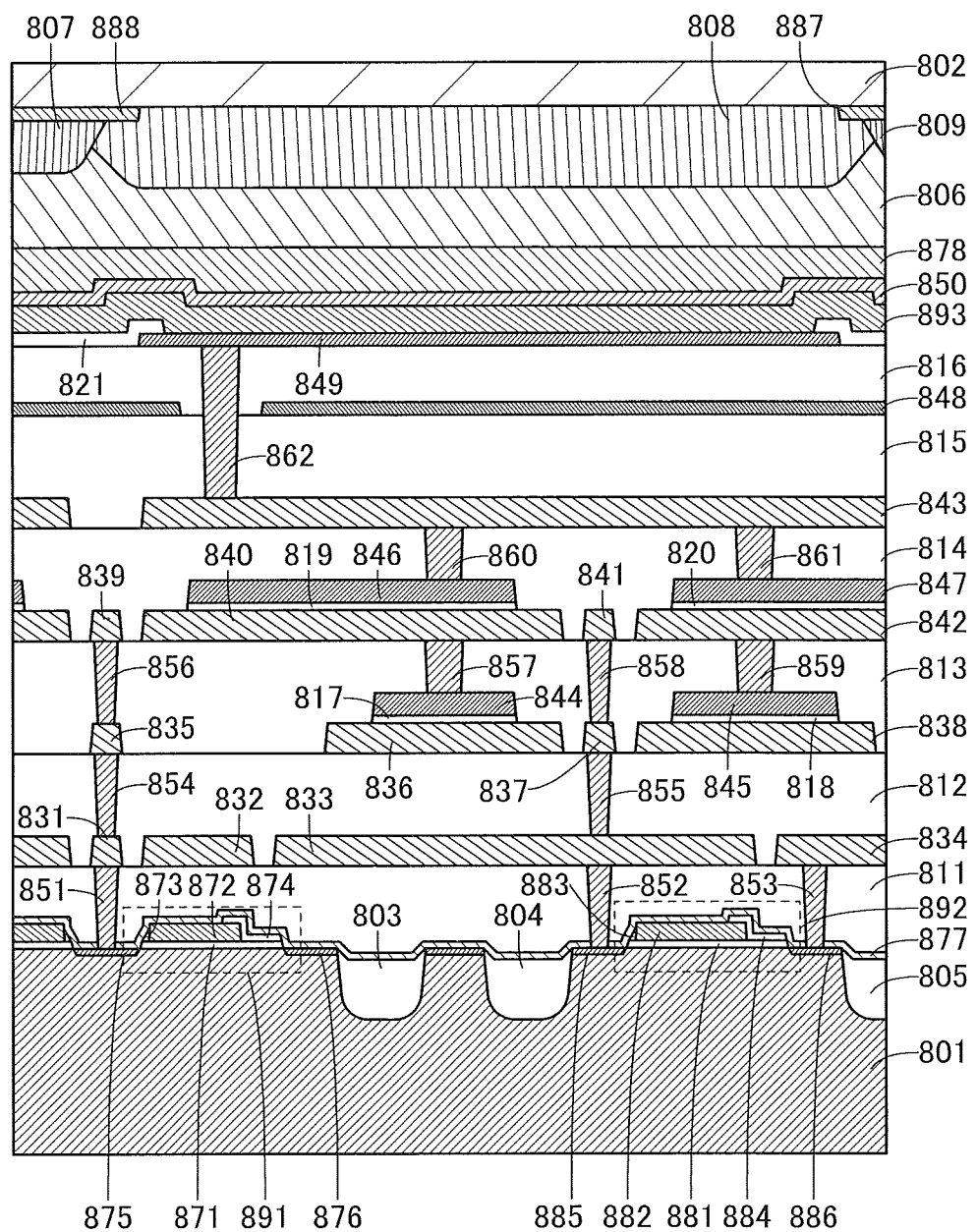
FIG. 36 is a cross-sectional view illustrating a semiconductor device according to one embodiment of the present invention.

FIG. 36 is a cross-sectional view illustrating a pixel of an EL display device fabricated over a semiconductor substrate.

The EL display device shown in FIG. 36 includes a semiconductor substrate 801, a substrate 802, an insulator 803, an insulator 804, an insulator 805, an adhesive layer 806, a filter 807, a filter 808, a filter 809, an insulator 811, an insulator 812, an insulator 813, an insulator 814, an insulator 815, an insulator 816, an insulator 817, an insulator 818, an insulator 819, an insulator 820, an insulator 821, a conductor 831, a conductor 832, a conductor 833, a conductor 834, a conductor 835, a conductor 836, a conductor 837, a conductor 838, a conductor 839, a conductor 840, a conductor 841, a conductor 842, a conductor 843, a conductor 844, a conductor 845, a conductor 846, a conductor 847, a conductor 848, a conductor 849, a conductor 850, a conductor 851, a conductor 852, a conductor 853, a conductor 854, a conductor 855, a conductor 856, a conductor 857, a conductor 858, a conductor 859, a conductor 860, a conductor 861, a conductor 862, an insulator 871, a conductor 872, an insulator 873, an insulator 874, a region 875, a region 876, an insulator 877, an insulator 878, an insulator 881, a conductor 882, an insulator 883, an insulator 884, a region 885, a region 886, a layer 887, a layer 888, and a light-emitting layer 893.

A transistor 891 includes the semiconductor substrate 801, the insulator 871, the conductor 872, the insulator 873, the insulator 874, and the region 875 and the region 876. The semiconductor substrate 801 serves as a channel formation region. The insulator 871 has a function of a gate insulator. The conductor 872 has a function of a gate electrode. The insulator 873 has a function of a sidewall insulator. The insulator 874 has a function of a sidewall insulator. The region 875 has a function of a source region and/or a drain region. The region 876 has a function of a source region and/or a drain region.

The conductor 872 includes a region overlapping with part of the semiconductor substrate 801 with the insulator 871 therebetween. The region 875 and the region 876 are regions where impurities are added to the semiconductor substrate 801. In the case where the semiconductor substrate 801 is a silicon substrate, the region 875 and the region 876 may each be a region including a silicide, such as tungsten silicide, titanium silicide, cobalt silicide, or nickel silicide. The region 875 and the region 876 can be formed in a self-aligned manner using the conductor 872, the insulator 873, the insulator 874, and the like, and the region 875 and the region 876 are accordingly located in the substrate 801 such that a channel formation region is provided between the region 875 and the region 876.

Since the transistor 891 includes the insulator 873, the region 875 can be distanced from the channel formation region. Owing to the insulator 873, the transistor 891 can be prevented from being broken or degraded by an electric field generated in the region 875. Since the transistor 891 includes the insulator 874, the region 876 can be distanced from the channel formation region. Owing to the insulator 874, the transistor 891 can be prevented from being broken or degraded by an electric field generated in the region 876. Note that in the transistor 891; the distance between the region 876 and a channel formation region is longer than the distance between the region 875 and a channel formation region. This structure can enable both high on-state current and high reliability in the case where a potential difference between the region 876 and a channel formation region is likely to be larger than a potential difference between the region 875 and a channel formation region in operation of the transistor 891.

A transistor 892 includes the insulator 881, the conductor 882, the insulator 883, the insulator 884, the region 885, and the region 886. The semiconductor substrate 801 has a function of a channel formation region. The insulator 881 has a function of a gate insulator. The conductor 882 has a function of a gate electrode. The insulator 883 has a function of a sidewall insulator. The insulator 884 has a function of a sidewall insulator. The region 885 has a function of a source region and/or a drain region. The region 886 has a function of a source and/or a drain region.

The conductor 882 includes a region overlapping with part of the semiconductor substrate 801 with the insulator 881 therebetween. The region 885 and the region 886 are regions where impurities are added to the semiconductor substrate 801. In the case where the semiconductor substrate 801 is a silicon substrate, the region 885 and the region 886 are a region including a silicide. The region 885 and the region 886 can be formed in a self-aligned manner using the conductor 882, the insulator 883, the insulator 884, and the like, and the region 885 and the region 886 are accordingly located in the substrate 801 such that a channel formation region is provided between the region 885 and the region 886.

Since the transistor 892 includes the insulator 883, the region 885 can be distanced from the channel formation region. Owing to the insulator 883, the transistor 892 can be prevented from being broken or degraded by an electric field generated in the region 885. Since the transistor 892 includes the insulator 884, the region 886 can be distanced from the channel formation region. Owing to the insulator 884, the transistor 892 can be prevented from being broken or degraded by an electric field generated in the region 886. Note that in the transistor 892, the distance between the region 886 and a channel formation region is longer than the distance between the region 885 and a channel formation region. This structure can enable both high on-state current and high reliability in the case where a potential difference between the region 886 and a channel formation region is likely to be larger than a potential difference between the region 885 and a channel formation region in operation of the transistor 892.

The insulator 877 is located so as to cover the transistor 891 and the transistor 892 and has a function of a protective film for the transistor 891 and the transistor 892. The insulator 803, the insulator 804, and the insulator 805 have a function of separating elements. For example, the transistor 891 and the transistor 892 are isolated from each other with the insulator 803 and the insulator 804 therebetween.

Each of the conductor 851, the conductor 852, the conductor 853, the conductor 854, the conductor 855, the conductor 856, the conductor 857, the conductor 858, the conductor 859, the conductor 860, the conductor 861, and the conductor 862 has a function of electrically connecting elements, an element and a wiring, and wirings, and these conductors can be referred to as a wiring or a plug.

Each of the conductor 831, the conductor 832, the conductor 833, the conductor 834, the conductor 835, the conductor 836, the conductor 837, the conductor 838, the conductor 839, the conductor 840, the conductor 841, the conductor 842, the conductor 843, the conductor 844, the conductor 845, the conductor 846, the conductor 847, the conductor 849, and the conductor 850 has a function of a wiring, an electrode, and/or a light-blocking layer.

For example, the conductor 836 and the conductor 844 each have a function of an electrode of a capacitor including the insulator 817; the conductor 838 and the conductor 845 each have a function of an electrode of a capacitor including the insulator 818; the conductor 840 and the conductor 846 each have a function of an electrode of a capacitor including the insulator 819; and the conductor 842 and the conductor 847 each have a function of an electrode of a capacitor including the insulator 820. Note that the conductor 836 and the conductor 838 may be electrically connected to each other. The conductor 844 and the conductor 845 may be electrically connected to each other. The conductor 840 and the conductor 842 may be electrically connected to each other. The conductor 846 and the conductor 847 may be electrically connected to each other.

Each of the insulator 811, the insulator 812, the insulator 813, the insulator 814, the insulator 815, and the insulator 816 has a function of an interlayer insulator. The top surfaces of the insulator 811, the insulator 812, the insulator 813, the insulator 814, the insulator 815, and the insulator 816 are preferably planarized.

The conductor 831, the conductor 832, the conductor 833, and the conductor 834 are provided over the insulator 811. The conductor 851 is provided in an opening in the insulator 811 and electrically connects the conductor 831 and the region 875. The conductor 852 is provided in an opening in the insulator 811 and electrically connects the conductor 833 and the region 885. The conductor 853 is provided in an opening in the insulator 811 and electrically connects the conductor 834 and the region 886.

The conductor 835, the conductor 836, the conductor 837, and the conductor 838 are provided over the insulator 812. The insulator 817 is provided over the conductor 836. The conductor 844 is provided over the insulator 817. The insulator 818 is provided over the conductor 838. The conductor 845 is provided over the insulator 818. The conductor 854 is provided in an opening in the insulator 812. The conductor 854 electrically connects the conductor 835 and the conductor 831. The conductor 855 is provided in an opening in the insulator 812. The conductor 855 electrically connects the conductor 837 and the conductor 833.

The conductor 839, the conductor 840, the conductor 841, and the conductor 842 are provided over the insulator 813. The insulator 819 is provided over the conductor 840. The conductor 846 is provided over the insulator 819. The insulator 820 is provided over the conductor 842. The conductor 847 is provided over the insulator 820. The conductor 856 is provided in an opening in the insulator 813. The conductor 856 electrically connects the conductor 839 and the conductor 835. The conductor 857 is provided in an opening in the insulator 813. The conductor 857 electrically connects the conductor 840 and the conductor 844. The conductor 858 is provided in an opening in the insulator 813. The conductor 858 electrically connects the conductor 841 and the conductor 837. The conductor 859 is provided in an opening in the insulator 813. The conductor 859 electrically connects the conductor 842 and the conductor 845.

The conductor 843 is provided over the insulator 814. The conductor 860 is provided in an opening in the insulator 814. The conductor 860 electrically connects the conductor 843 and the conductor 846. The conductor 860 electrically connects the conductor 843 and the conductor 847.

The conductor 848 is provided over the insulator 815 and may be electrically floating. Note that the conductor 848 is not limited to a conductor as long as it has a function of a light-blocking layer: for example, the conductor 848 may be an insulator or a semiconductor having a light-blocking property.

The conductor 849 is provided over the insulator 816. The insulator 821 is provided over the insulator 816 and the conductor 849. The insulator 821 includes an opening exposing the conductor 849. The light-emitting layer 893 is provided over the conductor 849 and the insulator 821. The conductor 850 is provided over the light-emitting layer 893.

The light-emitting layer 893 emits light by a potential difference between the conductor 849 and the conductor 850; thus, the conductor 849, the conductor 850, and the light-emitting layer 893 form a light-emitting element. Note that the insulator 821 has a function of a partition wall.

The insulator 878 is provided over the conductor 850. The insulator 878 covers the light-emitting element and has a function of a protective insulator. The insulator 878 may have a barrier property or may form a structure in which the light-emitting element is surrounded by insulators having barrier properties, for example.

A substrate having a light-transmitting property can be used as the substrate 802. For example, the substrate 750 can be referred to for the substrate 802. The layer 887 and the layer 888 are provided on the substrate 802. The layer 887 and the layer 888 each have a function of a light-blocking layer. A resin, a metal, or the like can be used for the light-blocking layer. The layer 887 and the layer 888 can improve the contrast and reduce color bleeding in the EL display device.

Each of the filter 807, the filter 808, and the filter 809 has a function of a color filter. The filter 254 can be referred to for the filter 807, the filter 808, and the filter 809, for example. The filter 808 has a region overlapping with the layer 888, the substrate 802, and the layer 887. The filter 807 has a region overlapping with the filter 808 and the layer 888. The filter 809 has a region overlapping with the filter 808 and the layer 887. The filter 807, the filter 808, and the filter 809 may have different thicknesses, in which case light might be extracted more efficiently from the light-emitting element.

An adhesive layer 806 is provided between the insulator 878 and the filter 807, the filter 808, and the filter 809.

Because the EL display device in FIG. 36 has a stacked-layer structure of the transistor, the capacitor, the wiring layer, and the like, the pixel area can be reduced. A highly integrated EL display device can be provided.

So far, examples of the EL display device are described. Next, an example of a liquid crystal display device is described.

Figure 37A:
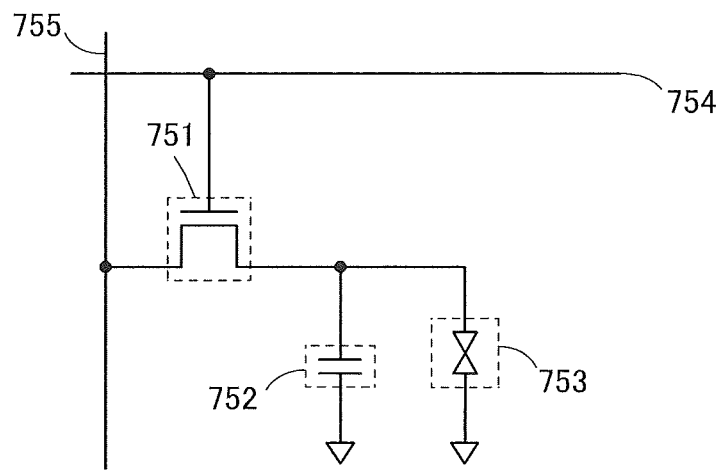
FIGS. 37A and 37B are a circuit diagram and a cross-sectional view illustrating a semiconductor device according to one embodiment of the present invention.

FIG. 37A is a circuit diagram illustrating a configuration example of a pixel of a liquid crystal display device. A pixel shown in FIGS. 37A and 37B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 37B:
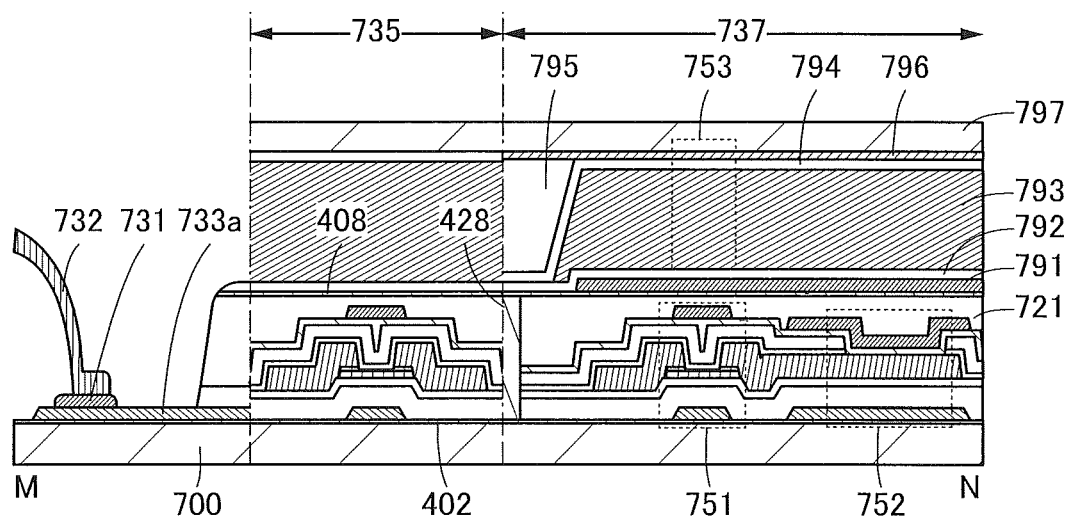

Note that the description of the liquid crystal display device is made on the assumption that the plan view of the liquid crystal display device is similar to that of the EL display device. FIG. 37B is a cross-sectional view of the liquid crystal display device taken along dashed-dotted line M-N in FIG. 35B. In FIG. 37B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 37B corresponds to, but is not limited to, the structure of the capacitor 742 in FIG. 35C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

The insulator 402, the insulator 428, and the insulator 408 are insulators having barrier properties. In other words, the semiconductor device shown in FIGS. 37A and 37B has a structure in which the transistor 741 is surrounded by insulators having barrier properties, which is similar to that of the device shown in FIG. 1A. Specifically, the transistor 751 corresponds to the element 150. Note that the display device shown in FIGS. 37A and 37B may include the element 150a and the element 150b as in the device shown in FIGS. 3A and 3B, in which case the capacitor 752 and the transistor 751 shown in FIGS. 37A and 37B correspond to the element 150a and the element 150b, respectively. The device shown in FIG. 5A may be modified so that the display device in FIGS. 37A and 37B includes the element 150 and the element 151 thereover, in which case the transistor 751 and the liquid crystal element 753 correspond to the element 150 and the element 151, respectively.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element (e.g., an EL element including organic and inorganic materials, an organic EL element, or an inorganic EL element), a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be forming by MOCVD. Note that when the graphene is provided, the GaN semiconductors included in the LED can also be formed by a sputtering method.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 38A to 38F illustrate specific examples of these electronic devices.

Figure 38A:
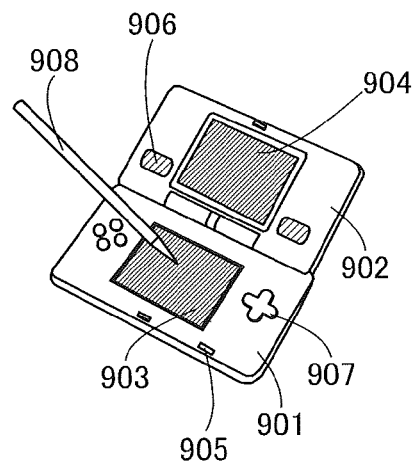
FIGS. 38A to 38F are perspective views illustrating an electronic device according to one embodiment of the present invention.

FIG. 38A illustrates a portable game console including a housing 901, a housing 902, a display portion 903, a display portion 904, a microphone 905, a speaker 906, an operation key 907, a stylus 908, and the like. Although the portable game console in FIG. 38A has the two display portions 903 and 904, the number of display portions included in a portable game console is not limited to this.

Figure 38B:
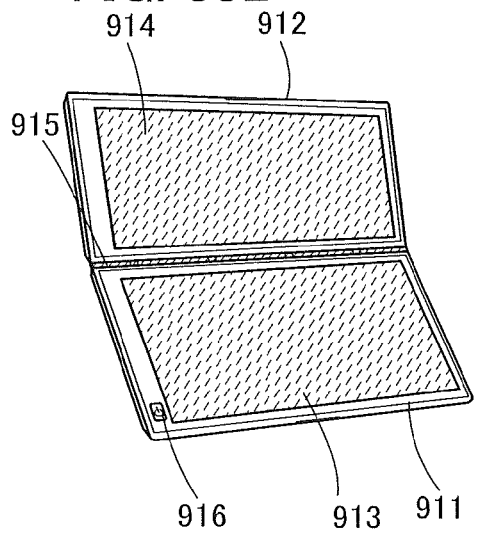

FIG. 38B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 38C:
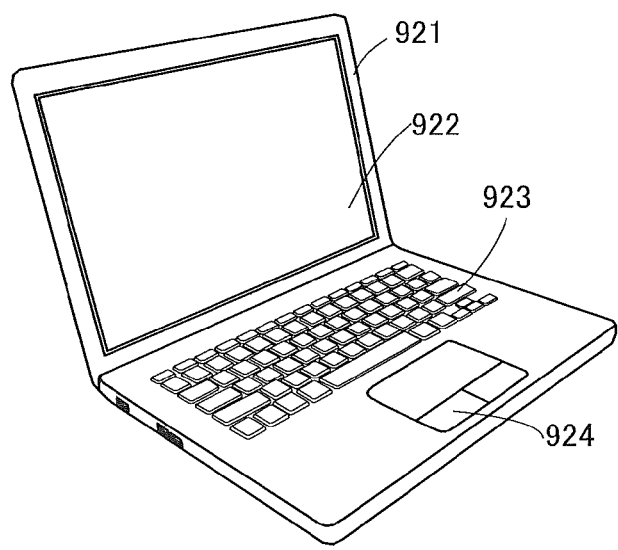

FIG. 38C illustrates a laptop personal computer, which includes a housing 921, a display portion 922, a keyboard 923, a pointing device 924, and the like.

Figure 38D:
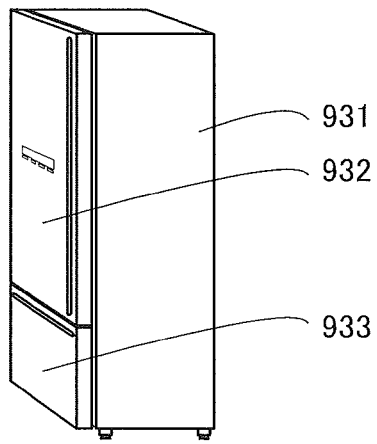

FIG. 38D illustrates an electric refrigerator-freezer, which includes a housing 931, a door for a refrigerator 932, a door for a freezer 933, and the like.

Figure 38E:
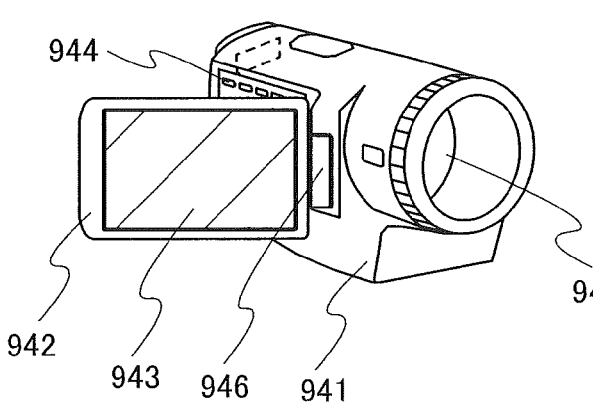

FIG. 38E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 38F:
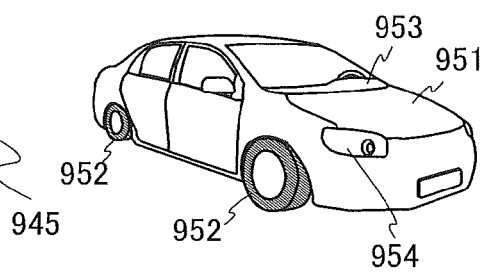

FIG. 38F illustrates a car including a car body 951, wheels 952, a dashboard 953, lights 954, and the like.

EXPLANATION OF REFERENCE

100: substrate, 102: insulator, 108: insulator, 118: insulator, 121: conductor, 121a: conductor, 121b: conductor, 121c: conductor, 121d: conductor, 122: conductor, 122a: conductor, 122b: conductor, 122c: conductor, 122d: conductor, 123: conductor, 123a: conductor, 123b: conductor, 123c: conductor, 123d: conductor, 126: sacrificial layer, 128: insulator, 128a: metal oxide layer, 128b: metal oxide layer, 128c: metal oxide layer, 150: element, 150a: element, 150b: element, 150c: element, 150d: element, 151: element, 190: precursor layer, 200: imaging device, 201: switch, 202: switch, 203: switch, 210: pixel portion, 211: pixel, 212: sub pixel, 212B: sub pixel, 212G: sub pixel, 212R: sub pixel, 218: insulator, 220: photoelectric conversion element, 221: conductor, 230: pixel circuit, 231: wiring, 247: wiring, 248: wiring, 249: wiring, 250: wiring, 253: wiring, 254: filter, 254B: filter, 254G: filter, 254R: filter, 255: lens, 256: light, 257: wiring, 260: peripheral circuit, 270: peripheral circuit, 280: peripheral circuit, 290: peripheral circuit, 291: light source, 300: silicon substrate, 310: layer, 320: layer, 330: layer, 340: layer, 351: transistor, 352: transistor, 353: transistor, 354: filter, 355: lens, 360: photodiode, 361: anode, 362: cathode, 363: low-resistance region, 370: plug, 371: wiring, 372: wiring, 373: wiring, 400: insulator, 401: insulator, 402: insulator, 404: conductor, 406a: semiconductor, 406b: semiconductor, 406c: semiconductor, 408: insulator, 412: insulator, 413: conductor, 416a: conductor, 416b: conductor, 422: insulator, 428: insulator, 450: semiconductor substrate, 452: insulator, 454: conductor, 456: region, 460: region, 462: insulator, 464: insulator, 466: insulator, 468: insulator, 472a: region, 472b: region, 474a: conductor, 474b: conductor, 474c: conductor, 476a: conductor, 476b: conductor, 478a: conductor, 478b: conductor, 478c: conductor, 480a: conductor, 480b: conductor, 480c: conductor, 490: insulator, 492: insulator, 494: insulator, 496a: conductor, 496b: conductor, 496c: conductor, 496d: conductor, 498a: conductor, 498b: conductor, 498c: conductor, 498d: conductor, 500: insulator, 502: insulator, 503: insulator, 504: conductor, 506a: semiconductor, 506b: semiconductor, 506c: semiconductor, 512: insulator, 513: conductor, 514: conductor, 516a: conductor, 516b: conductor, 700: substrate, 704a: conductor, 704b: conductor, 706: semiconductor, 706a: semiconductor, 706b: semiconductor, 712a: insulator, 712b: insulator, 714a: conductor, 714b: conductor, 716a: conductor, 716b: conductor, 718a: insulator, 718b: insulator, 718c: insulator, 719: light-emitting element, 720: insulator, 721: insulator, 731: terminal, 732: FPC, 733a: wiring, 734: sealant, 735: driver circuit, 736: driver circuit, 737: pixel, 741: transistor, 742: capacitor, 743: switching element, 744: signal line, 750: substrate, 751: transistor, 752: capacitor, 753: liquid-crystal element, 754: scan line, 755: signal line, 781: conductor, 782: light-emitting layer, 783: conductor, 784: partition wall, 791: conductor, 792: insulator, 793: liquid crystal layer, 794: insulator, 795: spacer, 796: conductor, 797: substrate, 801: semiconductor substrate, 802: substrate, 803: insulator, 804: insulator, 805: insulator, 806: adhesive layer, 807: filter, 808: filter, 809: filter, 811: insulator, 812: insulator, 813: insulator, 814: insulator, 815: insulator, 816: insulator, 817: insulator, 818: insulator, 819: insulator, 820: insulator, 821: insulator, 831: conductor, 832: conductor, 833: conductor, 834: conductor, 835: conductor, 836: conductor, 837: conductor, 838: conductor, 839: conductor, 840: conductor, 841: conductor, 842: conductor, 843: conductor, 844: conductor, 845: conductor, 846: conductor, 847: conductor, 848: conductor, 849: conductor, 850: conductor, 851: conductor, 852: conductor, 853: conductor, 854: conductor, 855: conductor, 856: conductor, 857: conductor, 858: conductor, 859: conductor, 860: conductor, 861: conductor, 862: conductor, 871: insulator, 872: conductor, 873: insulator, 874: insulator, 875: region, 876: region, 877: insulator, 878: insulator, 881: insulator, 882: conductor, 883: insulator, 884: insulator, 885: region, 886: region, 887: layer, 888: layer, 891: transistor, 892: transistor, 893: light-emitting layer, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for a refrigerator, 933: door for a freezer, 941: housing, 942: housing, 943: display portion, 944: operation key, 945: lens, 946: joint, 951: car body, 952: wheels, 953: dashboard, 954: lights, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 2330: layer, 2340: layer, 3001: wiring, 3002: wiring, 3003: wiring, 3004: wiring, 3005: wiring, 3200: transistor, 3300: transistor, 3400: capacitor, 5100: pellet, 5120: substrate, 5161: region, 5200: pellet, 5201: ion, 5203: particle, 5220: substrate, 5230: target, 5240: plasma, 5260: heating mechanism.

This application is based on Japanese Patent Application serial no. 2014-242064 filed with Japan Patent Office on Nov. 28, 2014, the entire contents of which are hereby incorporated by reference.

The invention claimed is:

1. A semiconductor device comprising:
   a first insulator;
   a transistor over the first insulator;
   a second insulator over the transistor; and
   a third insulator over the second insulator,
   wherein the second insulator comprises an opening reaching the first insulator, wherein the opening is filled with a fourth insulator,
   wherein the first insulator, the third insulator, and the fourth insulator each have a lower hydrogen-transmitting property than the second insulator, and
   wherein the opening surrounds the transistor.

2. The semiconductor device according to claim 1, wherein a channel formation region of the transistor comprises an oxide semiconductor.

3. A module comprising:
   the semiconductor device according to claim 1; and
   a printed wiring board.

4. An electronic device comprising:
   the semiconductor device according to claim 1 or the module according to claim 3; and
   at least one of a speaker, an operation key, and a battery.

5. A semiconductor device comprising:
   a first insulator;
   a transistor over the first insulator;
   a second insulator over the transistor; and a third insulator over the second insulator,
wherein the second insulator includes a first opening and a second opening reaching the first insulator and the transistor, respectively,
wherein the first opening is filled with a fourth insulator,
wherein the second opening is filled with a conductor,
wherein the first insulator, the third insulator, the fourth insulator, and the conductor each have a lower hydrogen-transmitting property than the second insulator, and
wherein the first opening surrounds the transistor.

6. The semiconductor according to claim 5,
wherein the conductor comprises a first region and a second region, and
wherein the first region has a lower hydrogen-transmitting property than the second region.

7. The semiconductor device according to claim 6, wherein the first region is interposed between the second region and each of the second insulator and the third insulator.

8. The semiconductor device according to claim 6, wherein the first region comprises a region that is in contact with the transistor.

9. The semiconductor device according to claim 6, wherein the first region comprises a region that is in contact with side surfaces of the second opening.

10. The semiconductor device according to claim 6, wherein the first region comprises a region where nitrogen concentration is higher than nitrogen concentration of the second region.

11. The semiconductor device according to claim 6, wherein the first region comprises a hydrogen absorbing metal.

12. The semiconductor device according to claim 5, wherein a channel formation region of the transistor comprises an oxide semiconductor.

13. A module comprising:
the semiconductor device according to claim 5; and
a printed wiring board.

14. An electronic device comprising:
the semiconductor device according to claim 5 or the module according to claim 13; and
at least one of a speaker, an operation key, and a battery.

15. A semiconductor device comprising:
a first transistor;
a first insulator over the first transistor;
a second insulator over the first insulator;
a second transistor over the second insulator;
a third insulator over the second transistor; and
a fourth insulator over the third insulator,
wherein the third insulator comprises an opening reaching the second insulator, wherein the opening is filled with a fifth insulator,
wherein the second insulator, the fourth insulator, and the fifth insulator each have a lower hydrogen-transmitting property than the third insulator, and
wherein the opening surrounds the second transistor.

16. The semiconductor device according to claim 15, wherein a channel formation region of the second transistor comprises an oxide semiconductor.

17. A module comprising:
the semiconductor device according to claim 15; and
a printed wiring board.

18. An electronic device comprising:
the semiconductor device according to claim 15 or the module according to claim 17; and
at least one of a speaker, an operation key, and a battery.

* * * * *